(12) United States Patent
Ueno et al.

(10) Patent No.: US 6,492,690 B2
(45) Date of Patent: *Dec. 10, 2002

(54) SEMICONDUCTOR DEVICE HAVING CONTROL ELECTRODES WITH DIFFERENT IMPURITY CONCENTRATIONS

(75) Inventors: Shuichi Ueno, Tokyo (JP); Yoshinori Okumura, Tokyo (JP); Shigenobu Maeda, Tokyo (JP); Shigeto Maegawa, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/366,732

(22) Filed: Aug. 4, 1999

(65) Prior Publication Data

US 2002/0130374 A1 Sep. 19, 2002

Related U.S. Application Data

(63) Continuation of application No. 08/909,732, filed on Aug. 12, 1997, now abandoned.

(30) Foreign Application Priority Data

Mar. 5, 1997 (JP) .............................. 9-050312

(51) Int. Cl.⁷ ..................... H01L 27/088; H01L 29/788
(52) U.S. Cl. ..................... 257/392; 257/316; 257/396; 257/408; 257/412
(58) Field of Search ................ 257/316, 392, 257/412

(56) References Cited

U.S. PATENT DOCUMENTS

| | | | |
|---|---|---|---|
| 4,249,968 A | * 2/1981 | Gardiner et al. | 257/410 |
| 4,471,373 A | * 9/1984 | Shimizu et al. | 257/392 |
| 4,745,079 A | 5/1988 | Pfiester | |
| 4,912,676 A | * 3/1990 | Paterson et al. | 257/316 |
| 4,914,046 A | 4/1990 | Tobin et al. | |
| 5,021,356 A | 6/1991 | Henderson et al. | 437/45 |
| 5,340,764 A | 8/1994 | Larsen et al. | |
| 5,478,759 A | 12/1995 | Mametani et al. | |
| 5,480,830 A | 1/1996 | Liao et al. | |
| 5,600,164 A | 2/1997 | Ajika et al. | |
| 5,637,903 A | * 6/1997 | Liao et al. | 257/412 |
| 5,658,811 A | 8/1997 | Kimura et al. | |
| 5,716,863 A | 2/1998 | Arai | |
| 5,753,958 A | * 5/1998 | Burr et al. | 257/392 |
| 5,767,558 A | * 6/1998 | Lo et al. | 257/412 |
| 5,856,221 A | 1/1999 | Clementi et al. | 438/258 |

FOREIGN PATENT DOCUMENTS

| | | |
|---|---|---|
| EP | 0 639 856 | 2/1995 |
| JP | 6-342881 | 12/1994 |

* cited by examiner

*Primary Examiner*—Gene M. Munson
(74) *Attorney, Agent, or Firm*—Oblon, Spivak, McClelland, Maier & Neustadt, P.C.

(57) ABSTRACT

According to a semiconductor device and a method of manufacturing the same, a trade-off relationship between threshold values and a diffusion layer leak is eliminated and it is not necessary to form gate oxide films at more than one stages. Since impurity dose are different from each other between gate electrodes (4A to 4C) of N-channel type MOS transistors (T41 to T43), impurity concentration in the gate electrodes (4A to 4C) are different from each other. The impurity concentration in the gate electrodes are progressively lower in the order of higher threshold values which are expected.

10 Claims, 58 Drawing Sheets

HIGH-VOLTAGE RESISTANT PORTION | PERIPHERAL CIRCUIT PORTION | MEMORY CELL ARRAY PORTION

F I G. 4 6
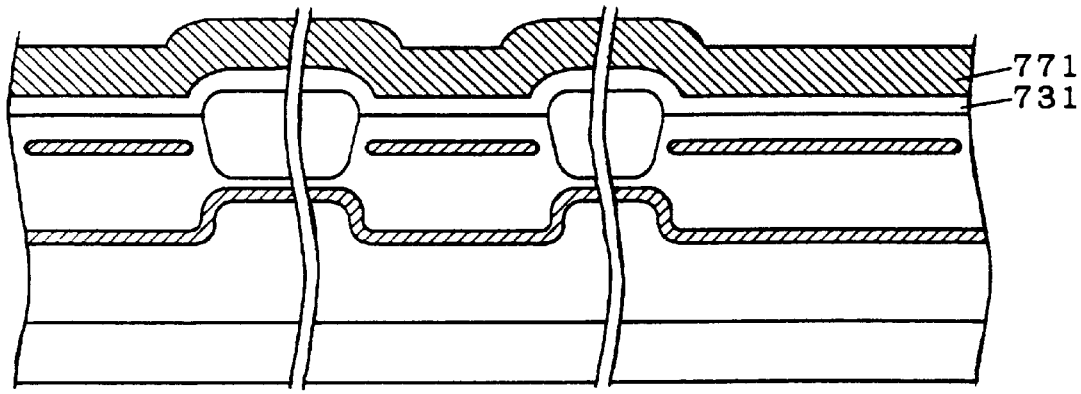
F I G. 4 7
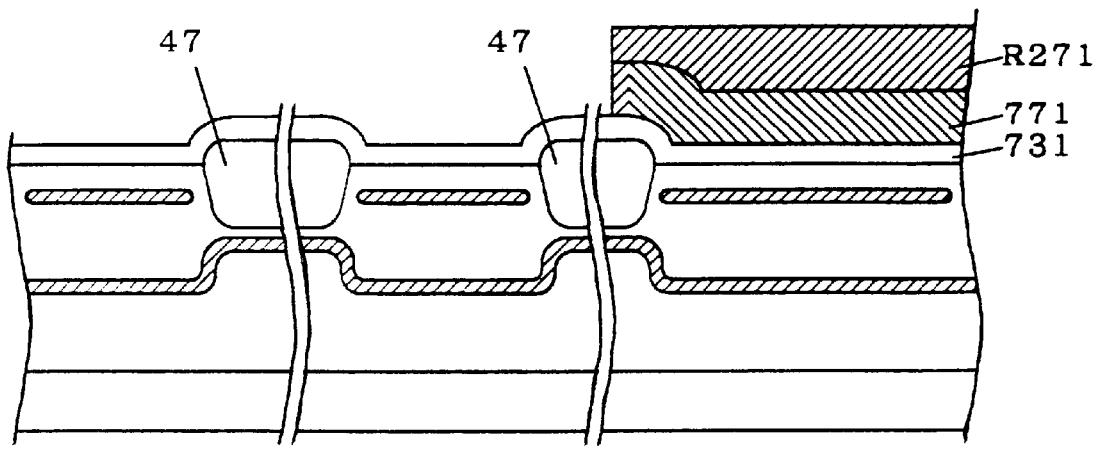

SENSE AMPLIFIER PORTION PERIPHRAL CIRCUIT PORTION MEMORY CELL ARRAY PORTION

HIGH-VOLTAGE
RESISITANT
CIRCUIT
PORTION

PERIPHERAL
CIRCUIT
PORTION

MEMORY CELL
ARRAY PORTION

HIGH-VOLTAGE
RESISITANT
PORTION

PERIPHERAL
CIRCUIT
PORTION

MEMORY CELL
ARRAY PORTION

SEMICONDUCTOR DEVICE HAVING CONTROL ELECTRODES WITH DIFFERENT IMPURITY CONCENTRATIONS

This application is a continuation of U.S. application Ser. No. 08/909,732, filed on Aug. 12, 1997, now abandoned.

BACKGROUND OF THE INVENTION

1. Field of the Invention

The present invention relates to a semiconductor device and a method of manufacturing the same, and more particularly, to a semiconductor device in which a plurality of types of transistors are formed within one chip and a method of manufacturing such a semiconductor device.

2. Description of the Background Art

As a semiconductor device in which a plurality of types of transistors (e.g., transistors having different required specifications from each other) are formed within one chip, the following four conventional examples will be described.

FIRST CONVENTIONAL EXAMPLE

Overall Structure of DRAM

First, as a first conventional example, a structure of a DRAM 600 in which a plurality of types of transistors are formed and a method of manufacturing the same will be described. The structure of the DRAM 600 (i.e., cell structure) is shown in FIG. 66.

The DRAM 600 includes not only a memory cell array portion 601 for storing data, but also a peripheral circuit portion (i.e., an address buffer 602, an X decoder 603, a Y decoder 604, a row/column clock portion 605, an I/O pass portion 606, a refresh portion 607), a sense amplifier portion 608, etc.

Although any these portions are formed by transistors, characteristics required for these portions are different from each other. For instance, the memory cell array portion 601 only allows a low leak current, in order to prevent disappearance of data because of a leak current. Meanwhile, a high amount of current is demanded in the peripheral circuit portion so as to enable operations at a high speed. Further, to distinguish a high level from a low level, the sense amplifier portion 608 must operate at a voltage which is half that of the high level, for example. To this end, a transistor which is used for the sense amplifier portion 608 must operate at a low voltage. In short, a plurality of types of transistors which have different characteristics from each other are needed within the DRAM which is formed as one chip.

Comparing threshold values, for instance, a threshold value for a transistor of the memory cell array portion is about 1V and a threshold value for transistors of the peripheral circuit portions are about 0.8V, while a threshold value for the transistor of the sense amplifier portion must be suppressed as low as 0.4V.

Structures Of The Respective Transistors

A conventional approach for forming these transistors which have different characteristics from each other within one chip is to change an impurity profile of a channel dope layer in accordance with a transistor. In the following, an example where an impurity concentration of a channel dope is changed in accordance with a transistor will be described.

FIG. 67 shows (in a partial view) an example of a structure of a DRAM which is fabricated by a conventional manufacturing method. Cross sections of N-channel MOS transistors T1 to T3 which are used for the sense amplifier portion, the peripheral circuit portion, and the memory cell array portion are shown.

In FIG. 67, the N-channel MOS transistors T1 to T3 are formed within a P-type well layer 101 which is formed on the same semiconductor substrate 1 (of the P-type). The well layer 101 is element-separated by a channel cut layer 102 and a LOCOS layer 2 in such a manner that the N-channel MOS transistors Ti to T3 are formed in regions which are created by element separation.

The N-channel MOS transistor T1 of the sense amplifier portion comprises a pair of source/drain layers 106 formed within the well layer 101 independently of each other but parallel to each other and a pair of low dope drain layers (hereinafter "LDD layers") 107 formed adjacent ts edge portions facing each other of the source/drain layers 106.

The gate oxide film 3 is formed on the LDD layers 107, and a gate electrode 4 is formed on the gate oxide film 3. A side wall oxide film 5 is formed on a side surface of the gate oxide film 3 and the gate electrode 4. Within the well layer 101 under the gate electrode 4, a channel dope layer 103 is formed.

The N-channel MOS transistor T2 of the peripheral circuit portion comprises a pair of source/drain layers 106 formed within the well layer 101 independently of each other but parallel to each other and a pair of LDD layers 107.

The gate oxide film 3 is formed on the LDD layers 107, and a gate electrode 4 is formed on the gate oxide film 3. The side wall oxide film 5 is formed on a side surface of the gate oxide film 3 and the gate electrode 4. Within the well layer 101 under the gate electrode 4, a channel dope layer 104 is formed.

The N-channel MOS transistor T3 of the memory cell array portion comprises a pair of source/drain layers 106 formed within the well layer 101 independently of each other but parallel to each other and a pair of LDD layers 107.

A gate oxide film 3 is formed on the source/drain layers 106 and the LDD layers 107, and a gate electrode 4 is formed on the gate oxide film 3. The side wall oxide film 5 is formed on a side surface of the gate oxide film 3 and the gate electrode 4. Within the well layer 101 under the gate electrode 4, a channel dope layer 105 is formed. The memory cell array portion has a gate array structure in which adjacent gates share one source/drain layer 106. Such structures are arranged successively.

Table 1 shows figures regarding the structures of the N-channel MOS transistors T1 to T3.

TABLE 1

|   | SENSE AMPLIFIER PORTION (T1) | PERIPHERAL CIRCUIT PORTION (T2) | MEMORY CELL ARRAY PORTION (T3) |
| --- | --- | --- | --- |
| FIELD OXIDE FILM THICKNESS | 4000 Å | 4000 Å | 4000 Å |
| GATE OXIDE FILM THICKNESS | 100 Å | 100 Å | 100 Å |
| GATE ELECTRODE FILM THICKNESS | 2000 Å | 2000 Å | 2000 Å |

TABLE 1-continued

|  | SENSE AMPLIFIER PORTION (T1) | PERIPHERAL CIRCUIT PORTION (T2) | MEMORY CELL ARRAY PORTION (T3) |
|---|---|---|---|
| GATE IMPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |
| WELL | B 700 keV $1 \times 10^{13}/cm^2$ | B 700 keV $1 \times 10^{13}/cm^2$ | B 700 keV $1 \times 10^{13}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $1 \times 10^{12}/cm^2$ | B 50 keV $3 \times 10^{12}/cm^2$ | B 50 keV $5 \times 10^{12}/cm^2$ |
| LDD | As 30 keV $1 \times 10^{13}/cm^2$ | As 30 keV $1 \times 10^{13}/cm^2$ | As 30 keV $1 \times 10^{13}/cm^2$ |
| SOURCE/DRAIN | As 50 keV $5 \times 10^{15}/cm^2$ | As 50 keV $5 \times 10^{15}/cm^2$ | As 50 keV $5 \times 10^{15}/cm^2$ |
| THERMAL PROCESSING |  | 850° C. 60 min |  |

In Table 1, impurity dose for forming the channel dope layers of the N-channel MOS transistors T1, T2 and T3 are $1 \times 10^{12}/cm^2$, $3 \times 10^{12}/cm^2$ and $5 \times 10^2/cm^2$, respectively. Boron (B) is implanted as an impurity for either layers with the implantation energy of 50 keV.

FIG. 68 shows impurity profiles of the N-channel MOS transistors T1, T7 and T3 forming the sense amplifier portion, the peripheral circuit portion and the memory cell array portion, all of which are shown in FIG. 67, taken at cross sectional portions along A–A' line, B–B' line and C–C' line, respectively.

In FIG. 68, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 1, the impurity concentration in the gate electrode stays uniformly at the same quantity among any transistors, and therefore, the A–A' line, the B–B' line and the C–C' line are one atop the other and shown as overlapping straight lsnes. On the other hand, in the well layer, as described earlier, the channel dose is smaller for a transistor which requires a lower threshold value (i.e., T1<T2<T3), and therefore, the impurity concentration is low at an interface between the oxide film and the bulk. A peak position of each profile is approximately the same as a position at which each channel dope layer is formed.

Method Of Manufacturing The Respective Transistors

Now, a description will be given on a method of manufacturing the N-channel MOS transistors T1, T2 and T3 of the sense amplifier portion, the peripheral circuit portion and the memory cell array portion, with reference to FIGS. 69 to 74.

At a step shown in FIG. 69, the LOCOS layer (i.e., field oxide film) 2 is formed into a thickness of 4,000 Å, for instance, by a LOCOS method on a surface of the semiconductor substrate 1 of-the P-type. Following this, boron ions, for instance, are implanted with the energy of 700 keV and at a dose of $1 \times 10^{13}/cm^2$, thereby forming a P-type well region 101 within the semiconductor substrate 1. Although an N-type well region as well is formed in the semiconductor substrate 1 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 102 within the semiconductor substrate 1. The channel cut layer 102 is formed in such a shape which together with the LOCOS layer 2 creates the element-separated regions.

Next, at step shown in FIG. 70, at a predetermined position within the well region 101, the channel dope layer 103 is formed which has the lowest impurity concentration in accordance with the transistor T1 of the sense amplifier portion. At this stage, the channel dope layer 103 is formed also in regions within the transistors T2 and T3 of the peripheral circuis portion and the memory cell array portion. The channel dope layer 103 is formed by implanting boron ions, for instance, with the energy of 50 keV and at a dose of $1 \times 10^{12}/cm^2$.

Next, at step shown in FIG. 71, a resist mask R201 is formed on the sense amplifier portion. An impurity is additionally implanted in a selective fashion into the channel dope layer 103 of the peripheral circuit portion and the memory cell array portion, thereby forming the channel dope layer 104 which has an impurity concentration in accordance with the transistor T2 of the peripheral circuit portion. At this stage, the channel dope layer 104 is formed also in a region within the transistor T3 of the memory cell array portion. The channel dope layer 104 is formed by implanting boron ions, for instance, with the energy of 50 keV and at a dose of $2 \times 10^{12}/cm^2$.

Next, at step shown in FIG. 72, a resist mask R202 is formed on the sense amplifier portion and the peripheral circuit portion, an impurity is additionally implanted in a selective fashion into the channel dope layer 104 of the memory cell array portion, thereby forming the channel dope layer 105 which has an impurity concentration in accordance with the transistor T3 of the memory cell array portion. The channel dope layer 105 is formed by implanting boron ions, for instance, with the energy of 50 keV and at a dose of $2 \times 10^{12}/cm^2$.

Next, at step shown in FIG. 73, after forming an oxide film 31 which will become the gate oxide film 3 on a main surface of the semiconductor substrate 1 by a thermal oxide method, a doped polysilicon layer 41, for instance, is formed as a gate electrode material on the oxide film 31 by a CVD method. The oxide film 31 has a thickness of about 100 Å, whereas the doped polysilicon layer 41 has a thickness of about 2,000 Å. Phosphorus (P) is used as an impurity. The concentration of the impurity is about $5 \times 10^{20}/cm^3$.

Next, at step shown in FIG. 74, a resist mask R203 is formed on the doped polysilicon layer 41. By patterning, the gate electrode 4 and the gate oxide film 3 are formed.

Following this, after forming the LDD layers 107 in the sense amplifier portion, the peripheral circuit portion and the memory cell array portion by ion implantation, the side wall oxide film 5 is formed on a side surface of the gate oxide film 3 and the gate electrode 4 into a thickness of about 1,000 Å. Using the side wall oxide film 5 as a mask, by ion implantation, the source/drain layers 106 are formed. In this manner, the structure of the DRAM shown in FIG. 67 is obtained.

Now, the LDD layers 107 are obtained by injecting arsenic (As) ions, for instance, with the energy of 30 keV and at a dose of $1\times10^{13}/cm^2$. Meanwhile, the source/drain layers 106 are obtained by injecting arsenic ions, for instance, with the energy of 50 keV and at a dose of $1\times10^{15}/cm^2$ and thereafter annealing at 850° C. for 60 minutes.

Although this is followed by formation of a capacitor, an inter-layer insulation film, a wiring layer and the like to form the DRAM, this will not be described nor is shown in the drawings.

Problems With Conventional DRAM

As described above, in the conventional DRAM, to form transistors which have different characteristics from each other and which are used in the sense amplifier portion, the peripheral circuit portion, the memory cell array portion and the like within one chip, the impurity concentration of the channel dope layer is changed in accordance with each transistor and the threshold value is adjusted.

However, the higher the impurity concentration of the channel dope layer is, the higher the threshold value becomes. At the same time, since the impurity concentration is high at a junction portion between a diffusion layer and the substrate, a leak current from the diffusion layer (i.e., diffusion layer leak) increases. In other words, the threshold value and the diffusion layer leak are in a trade-off relationship with each other, and therefore, a leak current is determined automatically once the threshold value is determined. Thus, the trade-off relationship between the two imposes a restriction on designing of the circuit.

Second Conventional Example

Overall Structure Of Flash Memory

As a second conventional example, a structure of a flash memory 700 in which a plurality of types of transistors are formed and a method of manufacturing the same will be described.

FIG. 75 shows a structure of the flash memory 700 (cell structure). In general, a flash memory is different from a DRAM in using a high voltage, such as 10V, for writing and erasing. To this end, in the flash memory 700 shown in FIG. 75, a charge pump circuit 710 is disposed as a step-up circuit.

The flash memory 700 comprises not only a memory cell array portion 701 for storing data, but also a high-voltage resistant portion, such as an X decoder 703 and a Y dencoder 704, which is used after stepping up, a peripheral circuit portion (i.e., an address buffer 702, a row/column clock portion 705, an I/O pass portion 706, a data register portion 707, a sense amplifier portion 708, an operation control portion 709), and the like. Although any these portions are formed by transistors, due to differences between voltages used, a plurality of types of transistors which have different characteristics from each other are needed.

For instance, a transistor in the memory cell array portion 701 demands an oxide film thickness of about 100 Å, for example, in order to guarantee the reliability of a tunnel oxide film. However, a high amount of current is demanded in the peripheral circuit portion for the purpose of a high-speed operation, and therefore, an oxide film thickness is often set smaller than that of the memory cell array portion 701. Still, in the high-voltage resistant portion, a transistor which withstands a voltage of 10V necessary. Hence, it is necessary to use a thick oxide film which is as thick as 250 Å, for instance. In short, a plurality of types of transistors which have different oxide film thicknesses from each other are needed within the flash memory which is in the form of one chip.

Structures Of The Respective Transistors

In the following, an example where an oxide film thickness is changed in accordance with a transistor will be described. FIG. 76 shows (in a partial view) an example of a structure of a flash memory which is fabricated by a conventional manufacturing method. Cross sections of N-channel MOS transistors T11 to T13 which are used for the high-voltage resistant portion, the peripheral circuit portion, and the memory cell array portion are shown.

In FIG. 76, the N-channel MOS transistors T11 to T13 are formed within a P-type well layer 121 which is formed on the same semiconductor substrate 21 (of the P-type). The well layer 121 is element-separated by a channel cut layer 122, which is formed within the well layer 121, and a LOCOS layer 22 in such a manner that the N-channel MOS transistors T11 to T13 are formed in regions which are created by element separation.

The N-channel MOS transistor T11 of the high-voltage resistant portion comprises a pair of source/drain layers 126 formed within the well layer 121 independently of each other but parallel to each other and a pair of LDD layers 127 formed adjacent to edge portions facing each other of the source/drain layers 126.

A gate oxide film 26 is formed on the LDD layers 127, and a gate electrode 29 is formed on the gate oxide film 26. A side wall oxide film 30 is formed on a side surface of the gate oxide film 26 and the gate electrode 29. Within the well layer 121 under the gate electrode 29, a channel dope layer 123 is formed.

The N-channel MOS transistor T12 of the peripheral circuit portion comprises a pair of source/drain layers 126 formed within the well layer 121 independently of each other but parallel to each other and a pair of LDD layers 127.

A gate oxide film 25 is formed on the LDD layers 127, and a gate electrode 29 is formed on the gate oxide film 25. A side wall oxide film 30 is formed on a side surface of the gate oxide film 25 and the gate electrode 29. Within the well layer 121 under the gate electrode 29, a channel dope layer 124 is formed.

The N-channel MOS transistor T13 of the memory cell array portion comprises a pair of source/drain layers 126 formed within the well layer 121 independently of each other but parallel to each other. A tunnel oxide film 23 is formed on edge portions of the source/drain layers 126. A floating gate electrode 27, an inter-layer insulation film 24 and a control gate electrode 28 are formed in this order on the tunnel oxide film 23.

The side wall oxide film 30 is formed on a side surface of the tunnel oxide film 23, the floating gate electrode 27, the inter-layer insulation film 24 and the control gate electrode 28.

Within the well layer 121 under the floating electrode 27, a channel dope layer 125 is formed. The memory cell array portion has a gate array structure in which adjacent gates share one source/drain layer 126. Such structures are arranged successively.

A characteristic of the flash memory which is shown in FIG. 76 is that the thickness of the gate oxide film 26 of the N-channel MOS transistor T11 of the high-voltage resistant portion is largest, followed by the thickness of the tunnel oxide film 23 of the N-channel MOS transistor T13 of the memory cell array portion and the thickness of the gate oxide film 25 of the N-channel MOS transistor T12 of the peripheral circuit portion in this order.

FIG. 77 shows the thicknesses of the respective gate oxide films. In FIG. 77, there are shown the N-channel MOS transistors of the high-voltage resistant portion, the peripheral circuit portion, and the memory cell array portion in this order along the horizontal axis from the left-hand side.

Table 2 shows figures regarding the structures of the N-channel MOS transistors T11 to T13.

main surface of the semiconductor substrate 21 by a thermal oxide method, a doped polysilicon layer 271, for instance, is formed as a gate electrode material on the oxide film 231 by a CVD method. The oxide film 231 has a thickness of about 100 Å, whereas the doped polysilicon layer 271 has a thickness of about 1,000 Å. Phosphorus (P) is used as an impurity. The concentration of the impurity is about $1\times10^{20}$/cm3.

Next, at a step shown in FIG. 80, a resist mask R221 is formed selectively on the doped polysilicon layer 271 within the memory cell array portion. In this case, the resist mask R221 is formed along the gate-width direction of the

TABLE 2

| | HIGH-VOLTAGE RESISTANT PORTION (T11) | PERIPHERAL CIRCUIT PORTION (T12) | MEMORY CELL ARRAY PORTION (T13) |
|---|---|---|---|
| FIELD OXIDE FILM THICKNESS | 4000 Å | 4000 Å | 4000 Å |
| GATE OXIDE FILM THICKNESS | 250 Å | 80 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TESO/Si_3N_4/TEOS = 100/100/100$ Å |
| CONTROL GATE ELECTRODE FILM THICKNESS | 2000 Å | 2000 Å | 2000 Å |
| CONTROL GATE IMPURITY CONCENTRATION | $5 \times 10^{20}/cm^3$ | $5 \times 10^{20}/cm^3$ | $5 \times 10^{20}/cm^3$ |
| SIDE WALL | 2000 Å | 2000 Å | 2000 Å |
| WELL | B 700 keV $1 \times 10^{13}/cm^2$ | B 700 keV $1 \times 10^{13}/cm^2$ | B 700 keV $1 \times 10^{13}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $5 \times 10^{12}/cm^2$ | B 50 keV $5 \times 10^{12}/cm^2$ | B 50 keV $5 \times 10^{12}/cm^2$ |
| LDD | As 30 keV $1 \times 10^{13}/cm^2$ | As 30 keV $1 \times 10^{13}/cm^2$ | — |
| SOURCE/DRAIN | As 50 keV $5 \times 10^{15}/cm^2$ | As 50 keV $5 \times 10^{15}/cm^2$ | As 50 keV $5 \times 10^{15}/cm^2$ |
| THERMAL POROCESSING | | 850° C. 60 min | |

In Table 2, the thicknesses of the gate oxide films of the N-channel MOS transistors T11, T12 and T13 are 250 Å, 80 Å and 100 Å, respectively.

Method Of Manufacturing The Respective Transistors

Now, a description will be given on a method of manufacturing the N-channel MOS transistors T11, T12 and T13 of the high-voltage resistant portion, the peripheral circuit portion and the memory cell array portion, with reference to FIGS. 78 to 91.

First, at a step shown in FIG. 78, the LOCOS layer (i.e., field oxide film) 22 is formed into a thickness of 4,000 Å, for instance, by a LOCOS method on a surface of the semiconductor substrate 21 of the P-type. Following this, boron ions, for instance, are implanted with the energy of 700 keV and at a dose of $1\times10^{13/cm2}$, thereby forming a P-type well region 121 within the semiconductor substrate 21. Although an N-type well region as well is formed in the semiconductor substrate 21 in order to form P-channel MOS transistors, this is not shown and a description will be omitted. Next, boron ions, for example, are implanted with the energy of 130 keV and at a dose of $5\times10^{12}/cm^2$, thereby forming the channel cut layer 122 within the semiconductor substrate 21. The channel cut layer 122 is formed in such a shape which together with the LOCOS layer 22 creates the element-separated regions.

Next, a channel dope layer 120 is formed at predetermined positions of the high-voltage resistant portion, the peripheral circuit portion and the memory cell array portion within the well region 121. The channel dope layer 120 is formed by implanting boron ions, for instance, with the energy of 50 keV and at a dose of $5\times10^{12}/cm^2$.

Next, at a step shown in FIG. 79, after forming an oxide film 231 which will become the tunnel oxide film 23 on a memory cell array portion. A portion of the doped polysilicon layer 271 which is not covered with the resist mask R221 is removed by anisotropic etching. FIG. 81 shows this condition.

FIG. 81 is a plan view viewing FIG. 80 from the upper surface side (i.e., the side on which the resist mask R221 is formed). Within the memory cell array portion, the resist mask R221 is formed as rectangle islands which are arranged regularly. The resist mask R221 is formed to cover an active layer AL which has a configuration like a rectangle island and an LOCOS layer LL around the same. Within the high-voltage resistant portion and the peripheral circuit portion, since the resist mask R is not formed, the active layer AL is exposed.

Next, after removing the resist mask R221, at a step shown in FIG. 82, an insulation film 241, which will become the inter-layer insulation film 24 which insulates the floating gate from the control gate, is formed by a CVD method. This film has a structure in which a TEOS (tetraethyl orthosilicate) film, a nitride film ($Si_3N_4$) film, a TEOS film each having a thickness of 100 Å are stacked in this order. The inter-layer insulation film 24 is referred to as "ONO film" in some cases. The insulation film 241 is formed on the high-voltage resistant portion and the peripheral circuit portion as well.

Next, at a step shown in FIG. 83, a resist mask R222 is formed on the insulation film 241 of the memory cell array portion, and the insulation film 241 in all other regions is removed. In this case, in the other regions, the oxide film 231 is removed as well. FIG. 84 shows this condition.

FIG. 84 is a plan view viewing FIG. 83 from the upper surface side (i.e., the side on which the resist mask R222 is formed). The resist mask R222 is formed to entirely cover the memory cell array portion. However, within the high-voltage resistant portion and the peripheral circuit portion, since the resist mask R222 is not formed, the active layer AL is exposed.

Next, after removing the resist mask R222, at a step shown in FIG. 85, an oxide film 261 which will become the gate oxide film 26 is formed entirely on the main surface of the semiconductor substrate 21 by a thermal oxide method. At this stage, since the insulation film 241 on the memory cell array portion includes the nitride film, the insulation film 241 is not oxidized and the thickness of the insulation film 241 is maintained. The thickness of the oxide film 261 is about 170 Å.

Next, at a step shown in FIG. 86, regions other than the peripheral circuit portion are covered with a resist mask R223 and the oxide film 261 on the oxide film 261 is removed by wet etching. FIG. 87 shows this condition.

FIG. 87 is a plan view viewing FIG. 86 from the upper surface side (i.e., the side on which the resist mask R223 is formed). The resist mask R223 is formed to entirely cover the memory cell array portion and the high-voltage resistant portion. However, within the peripheral circuit portion, since the resist mask R223 is not formed, the active layer AL is exposed.

Next, after removing the resist mask R223, at a step shown in FIG. 88, an oxide film 251 which will become the gate oxide film 25 is formed by a thermal oxide method. At this stage, since the insulation film 241 on the memory cell array portion includes the nitride film, the insulation film 241 is not oxidized and the thickness of the insulation film 241 is maintained. However, within the high-voltage resistant portion, the oxide film 261 grows and gains film thickness. The thickness of the oxide film 251 is about 80 Å. The oxide film 261 grows into about 250 Å.

Next, at a step shown in FIG. 89, a doped polysilicon layer 291 is formed, as a gate electrode material, entirely on the main surface of the semiconductor substrate 21 by a CVD method. The thickness of the doped polysilicon layer 291 is about 2,000 Å. Phosphorus (P) is used as an impurity. The concentration of the impurity is about $5 \times 10^{20}$/cm3.

Next, at a step shown in FIG. 90, a resist mask ,7224 is formed on the doped polysilicon layer 291 and patterned. FIG. 91 shows this condition.

FIG. 91 is a plan view viewing FIG. 90 from the upper surface side (i.e., the side on which the resist mask R224 is formed). The resist mask R224 is formed to be perpendicular to the active layer AL which has a rectangular configuration.

As a result of patterning, the gate oxide film 26 and gate electrode 29 are formed within the high-voltage resistant portion, the gate oxide film 25 and gate electrode 29 are formed within the peripheral circuit portion, and the tunnel oxide film 23, the floating gate electrode 27 and the control gate electrode 28 are formed within the memory cell array portion.

Following this, after forming the LDD layers 127 by implanting ions into the high-voltage resistant portion and the peripheral circuit portion, the side wall oxide film 30 of about 1,000 Å in thickness is formed on a side surface of the gate oxide film 26 and gate electrode 29, on a side surface of the gate oxide film 25 and gate electrode 29, and on a side surface of the tunnel oxide film 23, the floating gate electrode 27, the inter-layer insulation film 24 and the control gate electrode 28. Using the side wall oxide film 30 as a mask, by ion implantation, the source/drain layers 126 are formed. In this manner, the structure of the flash memory which is shown in FIG. 76 is obtained.

Now, the LDD layers 127 are obtained by implanting arsenic ions, for instance, with the energy of 30 keV and at a dose of $1 \times 10^{13}$/cm². Meanwhile, the source/drain layers 126 are obtained by injecting arsenic ions, for instance, with the energy of 50 keV and at a dose of $5 \times 10^{15}$/cm² and thereafter annealing at 850° C. for 60 minutes.

Although this is followed by formation of a capacitor, an inter-layer insulation film, a wiring layer and the like to form the flash memory, this will not be described nor is shown in the drawings.

Problems With Conventional Flash Memory

As described above, as in the conventional DRAM, in the conventional flash memory, there is a trade-off relationship between a threshold value and a diffusion layer leak. The trade-off relationship imposes a restriction on designing of the circuit.

Further, since it is necessary to form a plurality of types of transistors which have different oxide film thicknesses from each other within the flash memory which is in the form of one chip, it is necessary to form the oxide films at more than one steps in some cases. For example, within the high-voltage resistant portion, at the step of removing the resist mask R223 (See FIG. 86), the oxide film 261 is grown further during formation of the oxide film 251 (See FIG. 88). That is, the oxide film 261 is formed at two steps. This leads to a higher possibility of allowing entry of an impurity or the like, which in turn degrades the reliability of the gate oxide film 26 or worsens the controllability of the film thickness. This further leads to a problem that the reliability of the N-channel MOS transistor T11 of the high-voltage resistant portion is lost, etc.

Third Conventional Example

Overall Structure Of DRAM Comprising Logic Circuit

As a third conventional example, a structure of a DRAM 800 which comprises a logic circuit (hereinafter "LOGIC in DRAM") and a method of manufacturing the same will be described.

The LOGIC in DRAM 800 is a device which executes a high performance and requires only a low cost, since a logic circuit is formed within the same chip so that the DRAM and the logic circuit, which have been heretofore formed as separate chips, are combined with each other.

As shown in FIG. 92, the LOGIC in DRAM 800 is roughly divided into a logic portion and a DRAM portion. A requirement to the logic portion is an operation at a high speed, that is, a high driving capability and a low capacity. Meanwhile, as described earlier, the DRAM portion includes a memory cell array portion in which a low leak current is demanded, a sense amplifier portion in which an operation at a low voltage is demanded, etc. That is, a plurality of types of transistors which have different characteristics from each other are needed within the LOGIC in DRAM 800 which is formed as one chip.

Structures Of The Respective Transistors

A conventional approach for forming transistors which have different characteristics from each other within one chip is to change an impurity profile of a channel dope layer or an oxide film thickness in accordance with a transistor. In the following, with respect to the DRAM portion, an example where an impurity concentration of a channel dope layer is changed in accordance with a transistor will be described, whereas with respect to the logic portion, an example where an oxide film thickness is changed in accordances with a transistor will be described.

FIG. 93 shows (in a partial view) an example of a structure of a LOGIC in DRAM which is fabricated by a conventional manufacturing method. Cross sections of N-channel MOS transistors T21 to T23 which are used for the logic portion and for the sense amplifier portion and the memory cell array portion of the DRAM portion are shown.

In FIG. 93, the N-channel MOS transistors T21 to T23 are formed within a P-type well layer 151 which is formed on the same semiconductor substrate 51 (of the P-type). The well layer 151 is element-separated by a channel cut layer 152 which is formed within the well layer 151 and a LOCOS layer 52 in such a manner that the N-channel MOS transistors T21 to T23 are formed in regions which are created by element separation.

The N-channel MOS transistor T21 of the logic portion comprises a pair of source/drain layers 156 formed within the well layer 151 independently of each other but parallel to each other and a pair of LDD layers 157 formed adjacent to edge portions facing each other of the source/drain layers 156.

A gate oxide film 54 is formed on the LDD layers 157, and a gate electrode 55 is formed on the gate oxide film 54. A side wall oxide film 56 is formed on a side surface of the gate oxide film 54 and the gate electrode 55. Within the well layer 151 under the gate electrode 55, a channel dope layer 155 is formed.

The N-channel MOS transistor T22 of the sense amplifier portion comprises a pair of source/drain layers 156 formed within the well layer 151 independently of each other but parallel to each other and a pair of LDD layers 157.

A gate oxide film 53 is formed on the LDD layers 157, and a gate electrode 55 is formed on the gate oxide film 53. The side wall oxide film 56 is formed on a side surface of the gate oxide film 53 and the gate electrode 55. Within the well layer 151 under the gate electrode 55, a channel dope layer 154 is formed.

The N-channels MOS transistor T13 of the memory cell array portion comprises a pair of source/drain layers 156 formed within the well layer 151 independently of each other but parallel to each other and a pair of LDD layers 157.

The gate oxide film 53 is formed on the source/drain layers 156 and the LDD layers 157, and the gate electrode 55 is formed on the gate oxide film 53. The side wall oxide film 56 is formed on a side surface of the gate oxide film 53 and the gate electrode 55. Within the well layer 151 under the gate electrode 55, a channel dope layer 153 is formed. The memory cell array portion has a gate array structure in which adjacent gates share one source/drain layer 156. Such structures are arranged successively. Table 3 shows figures regarding the structures of the N-channel MOS transistors T21 to T23.

TABLE 3

| | LOGIC PORTION (T21) | SENSE AMPLIFIER PORTION (T22) | MEMORY CELL ARRAY PORTION (T23) |
|---|---|---|---|
| FIELD OXIDE FILM THICKNESS | 4000 Å | 4000 Å | 4000 Å |
| GATE OXIDE FILM THICKNESS | 60 Å | 100 Å | 100 Å |
| GATE ELECTRODE FILM THICKNESS | 2000 Å | 2000 Å | 2000 Å |
| GATE IMPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |
| WELL | B 700 keV $1 \times 10^{15}/cm^2$ | B 700 keV $1 \times 10^{15}/cm^2$ | B 700 keV $1 \times 10^{15}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $1 \times 10^{13}/cm^2$ | B 50 keV $1 \times 10^{12}/cm^2$ | B 50 keV $5 \times 10^{12}/cm^2$ |
| LDD | As 30 keV $1 \times 10^{13}/cm^2$ | As 30 keV $1 \times 10^{13}/cm^2$ | As 30 keV $1 \times 10^{13}/cm^2$ |
| SOURCE/DRAIN | As 50 keV $5 \times 10^{15}/cm^2$ | As 50 keV $5 \times 10^{15}/cm^2$ | As 50 keV $5 \times 10^{15}/cm^2$ |
| THERMAL POROCESSING | | 850° C. 60 min | |

In Table 3, impurity dose for forming the channel dope layers of the N-channel MOS transistors T21, T22 and T23 are $1 \times 10^{13}/cm^2$, $1 \times 10^{12}/cm^2$ and $5 \times 10^{12}/cm^2$, respectively. Boron (B) is implanted as an impurity for either layers with the implantation energy of 50 keV.

Further, the thicknesses of the gate oxide films of the N-channel MOS transistors T21, T22 and T23 are 60 Å, 100 Å and 100 Å, respectively.

FIG. 94 shows impurity profiles of the N-channel MOS transistors T21, T22 and T23 of the logic portion, the sense amplifier portion and the memory cell array portion, all of which shown in FIG. 93, taken at cross sectional portions along A–A' line, B–B' line and C–C' line, respectively.

In FIG. 94, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 3, the impurity concentration in the gate electrode stays uniformly at the same quantity among any transistors, and therefore, the A–A' line, the B–B' line and the C–C' line are one atop the other and shown as overlapping straight lines (shown as two lines in the drawing to distinguish the A–A' line). On the other hand, in the well layer, the channel dose is smaller for a transistor of the sense amplifier portion which requires a low threshold value, and therefore, the impurity concentration is low at an interface between the oxide film and the bulk. A peak position of each profile is approximately the same as a position at which each channel dope layer is formed.

FIG. 95 shows thicknesses of the respective gate oxide films. In FIG. 95, the N-channel MOS transistors of the logic portion, the sense amplifier portion and the memory cell array portion are shown in this order along the horizontal axis from the left-hand side. As shown in FIG. 95, in order to improve the current driving capability, the logic portion has a thinner oxide film thickness than those of the sense amplifier portion and the memory cell array portion of the DRAM portion.

Method Of Manufacturing The Respective Transistors

In the following, a description will be given on a method of manufacturing the N-channel MOS transistors T21, T22 and T23 of the logic portion, the sense amplifier portion and the memory cell array portion of the DRAM portion, with reference to FIGS. 96 to 104.

First, at a step shown in FIG. 96, the LOCOS layer (i.e., field oxide film) 52 is formed into a thickness of 4,000 Å, for instance, by a LOCOS method, on a surface of the semiconductor substrate 51 of the P-type. Following this, boron ions, for instance, are implanted with the energy of 700 keV and at a dose of $1\times10^{13}/cm^2$, thereby forming a P-type well region 151 within the semiconductor substrate 51. Although an N-type well region as well is formed in the semiconductor substrate 51 in order to form P-channel MOS transistors, this is not shown and a description will be omitted. Next, boron ions, for example, are implanted with the energy of 130 keV and at a dose of $5\times10^{12}/cm^2$, thereby forming the channel cut layer 152 within the semiconductor substrate 51. The channel cut layer 152 is formed in such a shape which together with the LOCOS layer 52 creates the element-separated regions.

Next, at step shown in FIG. 97, at a predetermined position within the well region 151, the channel dope layer 154 is formed which has the lowest impurity concentration in accordance with the transistor T22 of the sense amplifier portion. At this stage, the channel dope layer 154 is formed also in regions within the transistors T21 and T23 of the logic portion and the memory cell array portion. The channel dope layer 154 is formed by implanting boron ions, for instance, with the energy of 50 keV and at a dose of $1\times10^{12}/cm^2$.

Next, at step shown in FIG. 98, a resist mask R251 is formed on the sense amplifier portion. An impurity is additionally implanted in a selective fashion into the channel dope layer 154 of the logic portion and the memory cell array portion, thereby forming the channel dope layer 153 which has an impurity concentration in accordance with the transistor T23 of the memory cell array portion. At this stage, the channel dope layer 153 is formed also in a region within the transistor T21 of the logic portion. The channel dope layer 153 is formed by implanting boron ions, for instance, with the energy of 50 keV and at a dose of $4\times10^{12}/cm^2$.

Next, at step shown in FIG. 99, a resist mask R252 is formed on the sense amplifier portion and the memory cell array portion. An impurity is additionally implanted in a selective fashion into the channel dope layer 153 of the logic portion, thereby forming the channel dope layer 155 which has an impurity concentration in accordance with the transistor T21 of the logic portion. The channel dope layer 155 is formed by implanting boron ions, for instance, with the energy of 50 keV and at a dose of $5\times10^{12}/cm^2$.

Next, at step shown in FIG. 100, an oxide film 531 which will become the gate oxide film 53 is formed on the main surface of the semiconductor substrate 51 by a thermal oxide method. The thickness of the oxide film 531 is about 40 Å.

Next, at step shown in FIG. 101, the thickness of the oxide film 531 of the sense amplifier portion and the memory cell array portion is covered with a resist mask R253, and the thickness of the oxide film 531 which is located on the logic portion alone is selectively removed.

Next, after removing the resist mask R253, at a step shown in FIG. 102, an oxide film 541 which will become the gate oxide film 54 is formed on the main surface of the semiconductor substrate 51 by a thermal oxide method. At this stage, since the insulation film 531 on the sense amplifier portion and the memory cell array portion grows and gains film thickness. The thickness of the oxide film 541 is about 60 Å. The oxide film 531 grows into about 100 Å.

Next, at a step shown in FIG. 103, a doped polysilicon layer 551 is formed, as a gate electrode material, on the oxide film 531 and the oxide film 541 by a CVD method. The thickness of the doped polysilicon layer 551 is about 2,000 Å. Phosphorus (P) is used as an impurity. The concentration of the impurity is about $1\times10^{20}/cm3$.

Next, at a step shown in FIG. 104, a resist mask R254 is formed on the doped polysilicon layer 551 and patterned. By patterning, the gate electrode 54 and the gate electrode 55 are formed in the logic portion while the gate oxide film 53 and the gate electrode 55 are formed in the sense amplifier portion and the memory cell array portion.

Following this, after forming she LDD layers 157 by implanting ions into the logic portion, the sense amplifier portion and the memory cell array portion, the side wall oxide film 56 of about 1,000 Å in thickness is formed on a side surface of the gate oxide film 54 and gate electrode 55 within the logic portion, and on a side surface of the gate oxide film 53 and gate electrode 55 within the sense amplifier portion and the memory cell array portion. Using the side wall oxide film 56 as a mask, by ion implantation, the source/drain layers 156 are formed. In this manner, the structure of the LOGIC in DRAM which is shown in FIG. 93 is obtained.

Now, the LDD layers 157 are obtained by implanting arsenic (As) ions, for instance, with the energy of 30 keV and at a dose of $1\times10^{13}/cm^2$. Meanwhile, the source/drain layers 156 are obtained by injecting arsenic ions, for instance, with the energy of 50 keV and at a dose of $5\times10^5/cm^2$ and thereafter annealing at 850° C. for 30 minutes.

Although this is followed by formation of a capacitor, an inter-layer insulation film, a wiring layer and the like to form the LOGIC in DRAM, this will not be described nor is shown in the drawings.

Problems With Conventional LOGIC in DRAM

As described above, in the conventional LOGIC in DRAM, to form transistors which are used in the logic portion, the sense amplifies portion and the memory cell array portion and which have different characteristics from each other within one chip, the impurity concentration of the channel dope layer is changed in accordance with each transistor and a threshold value is adjusted.

However, as the impurity concentration of the channel dope layer becomes higher, the threshold value increases. At the same time, a diffusion layer leak increases since the impurity concentration becomes high at a junction portion between a diffusion layer and the substrate, for instance. In other words, the threshold value and the diffusion layer leak are in a trade-off relationship with each other, and therefore, a leak current is determined automatically once the threshold value is determined. Thus, the trade-off relationship between the two imposes a restriction on designing of the circuit.

Further, in order to improve the current driving capability, the logic portion has a thinner oxide film thickness than those of the other portions. To this end, it is necessary to form a plurality of types of transistors which have different oxide film thicknesses from each other within the flash memory which is in the form of one chip, it is necessary to form the oxide films at more than one steps in some cases. For example, within the sense amplifier portion and the memory cell array portion, at the step of removing the resist mask R253 (See FIG. 101), the insulation film 531 is grown further during formation of the oxide film 541 (See FIG. 102). That is, the oxide film 531 is formed st two steps. This leads to a higher possibility of allowing entry of an impurity or the like, which in turn degrades the reliability of the gate oxide film 53 or worsens the controllability of the film thickness. This further leads to a problem that the reliability of the N-channel MOS transistors T22 and T23 of the sense amplifier portion and the memory cell array portion is lost, etc.

Fourth Conventional Example

Overall Structure Of Flash Memory Comprising Logic Circuit

As a fourth conventional example, a structure of a flash memory 900 which comprises a logic circuit (hereinafter "LOGIC in FLASH") and a method of manufacturing the same will be described.

One of R&D targets which are attracting an attention as a transistor becomes denser is development of a one-chip microcomputer in which a microcomputer is fabricated within one chip, while another R&D target under a close attention is a larger capacity. An element in which a flash memory and a MPU (micropsocessing unit) are formed within one chip, in particular, is called flash-consolidated logic as the one which is made public in 1995 IDEM SHORT COURSE PROGRAM, "EMBEDDED FLASH MEMORY APPLICATIONS, TECHNOLOGY AND DESIGN," CLINTON KUO, MOTOROLA, and others.

FIG. 105 shows one example. As shown in FIG. 105, the LOGIC in FLASH 900 is roughly divided into a logic portion and a flash memory portion. A requirement to the logic portion is -an operation at a high speed, that is, a high driving capability and a low capacity.

The flash memory portion comprises a high-voltage resistant portion in which a high voltage is applied, a memory cell array portion in which a tunnel oxide film needs to be highly reliable, and the like. That is, a plurality of types of transistors which have different characteristics from each other are needed within the LOGIC in FLASH which is formed as one chip.

Structures Of The Respective Transistors

A conventional approach for forming transistors which have different characteristics from each other within one chip is to change an oxide film thickness in accordance with a transistor, or if necessary, to change an impurity profile of a at channel dope layer. In the following, an example where an oxide film thickness in accordance with a transistor while changing an impurity concentration of a channel dope layer will be described.

FIG. 106 shows (in a partial view) an example of a structure of a LOGIC in FLASH which is fabricated by a conventional manufacturing method. Cross sections of N-channel MOS transistors T31 to T33 which are used for the logic portion and for the high-voltage resistant portion and the memory cell array portion of the flash memory portion are shown.

In FIG. 106, the N-channel MOS transistors T31 to T33 are formed within a P-type well layer 171 which is formed on the same semiconductor substrate 71 (of the P-type). The well layer 171 is element-separated by a channel cut layer 171 which is formed within the well layer 171 and a LOCOS layer 72 in such a manner that the N-channel MOS transistors T31 to T33 are formed in regions which are created by element separation.

The N-channel MOS transistor T31 of the logic portion comprises a pair of source/drain layers 176 formed within the well layer 171 independently of each other but parallel to each other and a pair of LDD layers 177 formed adjacent to edge portions facing each other of the source/drain layers 176.

A gate oxide film 76 is formed on the LDD layers 177, and a gate electrode 79 is formed on the gate oxide film 76. A side wall oxide film 80 is formed on a side surface of the gate oxide film 76 and the gate electrode 79. Within the well layer 171 under the gate electrode 79, a channel dope layer 175 is formed.

The N-channel MOS transistor T32 of the high-voltage resistant portion of the flash memory portion comprises a pair of source/drain layers 176 formed within the well layer 171 independently of each other but parallel to each other and a pair of LDD layers 177.

A gate oxide film 75 is formed on the LDD layers 177, and a gate electrode 79 is formed on the gate oxide film 75. The side wall oxide film 80 is formed on a side surface of the gate oxide film 75 and the gate electrode 79. Within the well layer 171 under the gate electrode 79, a channel dope layer 173 is formed.

The N-channel MOS transistor T33 of the memory cell array portion of the flash memory portion comprises a pair of source/drain layers 176 formed within the well layer 171 independently of each other but parallel to each other. A tunnel oxide film 73 is formed on edge portions of the source/drain layers 176. A floating gate electrode 77, an inter-layer insulation film 74 and a control gate electrode 78 are formed in this order on the tunnel oxide film 73.

The side wall oxide film 80 is formed on a side surface of the tunnel oxide film 73, the floating gate electrode 77, the inter-layer insulation film 74 and the control gate electrode 78.

Within the well layer 171 under-the floating electrode 77, a channel dope layer 175 is formed. The memory cell array portion has a gate array structure in which adjacent gates share one source/drain layer 176. Such structures are arranged successively.

A characteristic of the flash memory which is shown in FIG. 106 is that the thickness of the gate oxide film 75 of the N-channel MOS transistor T32 of the high-voltage resistant portion is largest, followed by the thickness of the tunnel oxide film 73 of the N-channel MOS transistor T33 of the memory cell array portion and the thickness of the gate oxide film 76 of the N-channel MOS transistor T31 of the logic portion in this order, and that the impurity concentration of the channel dope layer 173 of the N-channel MOS transistor T32 of the high-voltage resistant portion is lower than those of the other chancels dope layers.

Table 4 shows figures regarding the structures of the N-channel MOS transistors T31 to T33.

TABLE 4

| | LOGIC PORTION (T31) | HIGH-VOLTAGE RESISTANT PORTION (T32) | MEMORY CELL ARRAY PORTION (T33) |
|---|---|---|---|
| FIELD OXIDE FILM THICKNESS | 4000 Å | 4000 Å | 4000 Å |
| GATE OXIDE FILM THICKNESS | 60 Å | 250 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TEOS/Si_3N_4/TEOS = 100/100/100$ Å |
| CONTROL GATE ELECTRODE FILM THICKNESS | 2000 Å | 2000 Å | 2000 Å |
| CONTROL GATE IMPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |
| WELL | B 700 keV $1 \times 10^{15}/cm^2$ | B 700 keV $1 \times 10^{15}/cm^2$ | B 700 keV $1 \times 10^{15}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $1 \times 10^{13}/cm^2$ | B 50 keV $1 \times 10^{12}/cm^2$ | B 50 keV $1 \times 10^{13}/cm^2$ |
| LDD | P 30 keV $1 \times 10^{13}/cm^2$ | P 30 keV $1 \times 10^{13}/cm^2$ | — |
| SOURCE/DRAIN | P 50 keV $5 \times 10^{15}/cm^2$ | P 50 keV $5 \times 10^{15}/cm^2$ | P 50 keV $5 \times 10^{15}/cm^2$ |
| THERMAL POROCESSING | | 850° C. 60 min | |

In Table 4, the thicknesses of the gate oxide films of the N-channel MOS transistors T31, T32 and T33 are 60 Å, 250 Å and 100 Å, respectively.

Further, an impurity dose for forming the channel dope layer 173 of the N-channel MOS transistor T32 is $1 \times 10^{12}/cm^2$, while an impurity dose for forming the channel dope layer 173 of the N-channel MOS transistors T31 and T33 is $1 \times 10^{13}/cm^2$. Boron (B) is implanted as an impurity for either layers with the implantation energy of 50 keV.

FIG. 107 shows impurity profiles of the N-channel MOS transistors T31, T32 and T33 forming the sense amplifier portion, the peripheral circuit portion and the memory cell array portion, all of which shown in FIG. 106, taken at cross sectional portions along A–A' line, B–B' line and C–C' line, respectively.

In FIG. 107, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 4, the impurity concentration in the gate electrode stays uniformly at the same quantity among any transistors, and therefore, the A–A' line, the B–B' line and the C–C' line are one atop the other and shown as overlapping straight lines (shown as three lines in the drawing to distinguish the respective lines). On the other hand, in the well layer, the channel dose is smaller for a transistor of the high-voltage resistant portion which requires a low threshold value, and therefore, the impurity concentration is low at an interface between the oxide film and the bulk. A peak position of each profile is approximately the same as a position at which each channel dope layer is formed.

FIG. 108 shows thicknesses of the respective gate oxide films. In FIG. 108, the N-channel MOS transistors of the logic portion, the high-voltage resistant portion and the memory cell array portion are shown in this order along the horizontal axis from the left-hand side. As shown in FIG. 108, the oxide film of the high-voltage resistant portion of the flash memory portion is thickest, while the oxide film of the logic portion is the thinnest in order to improve the current driving capability, Method Of Manufacturing The Respective Transistors In the following, a description will be given on a method of manufacturing the N-channel MOS transistors T31 to T33 of the logic portion, and of the high-voltage resistant portion and the memory cell array portion of the flash memory portion, which are shown in FIG. 106, with reference to FIGS. 109 to 122.

First, at a step shown in FIG. 109, the LOCOS layer (i.e., field oxide film) 72 is formed into a thickness of 4,000 Å, for instance, by a LOCOS method, on a surface of the semiconductor substrate 71 of the P-type. Following this, boron ions, for instance, are implanted with the energy of 700 keV and at a dose of $1 \times 10^{13}/cm^2$, thereby forming a P-type well region 171 within the semiconductor substrate 71. Although an N-type well region as well is formed in the semiconductor substrate 71 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 172 within the semiconductor substrate 71. The channel cut layer 172 is formed in such a shape which together with the LOCOS layer 72 creates the element-separated regions.

Next, the channel dope layer 173 which has the lowest impurity concentration is formed within the well region 171 of the transistors T32 of the high-voltage resistant portion. The channel dope layer 173 is formed by implanting boron ions, for instance, with the energy of 50 keV and at a dose of $1 \times 10^{12}/cm^2$.

Next, an impurity is implanted-into the well region 171 of the transistors T31 and T33 of the logic portion and the memory cell array portion, thereby forming the channel dope layer 175 which has an impurity concentration in accordance with the transistors T31 and T33 of the logic portion and the memory cell array portion. The channel dope layer 175 is formed by implanting boron ions, for instance, with the energy of 50 keV and at a dose of $1 \times 10^{13}/cm^2$.

Next, at a step shown in FIG. 110, after forming an oxide film 731 which will become the tunnel oxide film 73 on a main surface of the semiconductor substrate 71 by a thermal oxide method, a doped polysilicon layer 771, for instance, is formed as a gate electrode material on the oxide film 731 by a CVD method. The oxide film 731 has a thickness of about 100 Å, whereas the doped polysilicon layer 771 has a thickness of about 1,000 Å. Phosphorus (P) is used as an impurity. The concentration of the impurity is about $1 \times 10^{20/cm3}$.

Next, at a step shown in FIG. 111, a resist mask R261 is formed selectively on the doped polysilicon layer 771 within the memory cell array portion. In this case, the resist mask R261 is formed along the gate-width direction of the memory cell array portion. A portion of the doped polysilicon layer 771 which is not covered with the resist mask R261 is removed by anisotropic etching. FIG. 112 shows this condition.

FIG. 112 is a plan view viewing FIG. 111 from the upper surface side (i.e., the side on which the resist mask R261 is formed). Within the memory cell array portion, the resist mask R261 is formed as rectangle islands which are arranged regularly. The resist mask R261 is formed to cover an active layer AL which has a configuration like a rectangle island and an LOCOS layer LL around the same. Within the high-voltage resistant portion and the logic portion, since the resist mask R is not formed, the active layer AL is exposed.

Next, after removing the resist mask R261, at a step shown in FIG. 113, an insulation film 741, which will become the inter-layer insulation film 74 which insulates the floating gate from the control gate, is formed by a CVD method. This film has a structure in which a TEOS (tetraethyl orthosilicate) film, a nitride film ($Si_3N_4$) film, a TEOS film each having a thickness of 100 Å are stacked in this order. The inter-layer insulation film 74 is referred to as "ONO film" in some cases. The insulation film 741 is formed on the high-voltage resistant portion and the logic portion as well.

Next, at a step shown in FIG. 114, a resist mask R262 is formed on the insulation film 741 of the memory cell array portion, and the insulation film 741 in all other regions is removed. In this case, in the other regions, the oxide film 731 is removed as well. FIG. 115 shows this condition.

FIG. 115 is a plan view viewing FIG. 114 from the upper surface side (i.e., the side on which the resist mask R262 is formed). The resist mask R262 is formed to entirely cover the memory cell array portion. However, within the high-voltage resistant portion and the logic portion, since the resist mask R262 is not formed, the active layer AL is exposed.

Next, after removing the resist mask R262, at a step shown in FIG. 116, an oxide film 751 which will become the gate oxide film 75 is formed entirely on the main surface of the semiconductor substrate 71 by a thermal oxide method. At this stage, since the insulation film 741 on the memory cell array portion includes the nitride film, the insulation film 741 is not oxidized and the thickness of the insulation film 741 is maintained. The thickness of the oxide film 261 is about 190 Å.

Next, at a step shown in FIG. 117, regions other than the logic portion are covered with a resist mask R263 and t he oxide film 751 on the logic portion is removed by we t etching. FIG. 118 shows this condition.

FIG. 118 is a plan view viewing FIG. 117 from t he upper surface side (i.e., the side on which the resist mask R263 is formed). The resist mask R263 is formed to entirely cover the memory cell array portion and the high-voltage resistant portion. However, within the logic portion, since the resist mask R263 is not formed, the active layer AL is exposed.

Next, after removing the resist mask R263, at a step shown in FIG. 119, an oxide film 761 which will become the gate oxide film 76 is formed by a thermal oxide method. At this stage, since the insulation film 741 on the memory cell array portion includes the nitride film, the insulation film 741 i s not oxidized and the thickness of the insulation film 741 is maintained. However, within the high-voltage resistant portion, the oxide film 751 grows and gains film thickness. The thickness of the oxide film 761 is about 60 Å. The oxide film 751 grows into about 250 Å.

Next, at a step shown in FIG. 120, a doped polysilicon layer 791 is formed, as a gate electrode material, entirely on the main surface of the semiconductor substrate 71 by a CVD method. The thickness of the doped polysilicon layer 791 is about 2,000 Å. Phosphorus (P) is used as an impurity. The concentration of the impurity is about $5 \times 10^{20}/cm^3$.

Next, at a step shown in FIG. 121, a resist mask R264 is formed on the doped polysilicon layer 791 and patterned. FIG. 122 shows this condition.

FIG. 122 is a plan view viewing FIG. 121 from the upper surface side (i.e., the side on which the resist mask R264 is formed). The resist mask R264 is formed to be perpendicular to the active layer AL which has a rectangular configuration.

As a result of patterning, the gate oxide film 76 and gate electrode 79 are formed within the logic portion, the gate oxide film 76 and gate electrode 79 are formed within the high-voltage resistant portion, and the tunnel oxide film 73, the floating gate electrode 77 and the control gate electrode 78 are formed within the memory cell array portion.

Following this, after forming the LDD layers 177 by implanting ions into the logic portion and the high-voltage resistant portion, the side wall oxide film 80 of about 1,000 Å in thickness is formed on a side surface of the gate oxide film 76 and gate electrode 79, on a side surface of the gate oxide film 76 and gate electrode 79, and on a side surface of the tunnel oxide film 73, the floating gate electrode 77, the inter-layer insulation film 74 and the control gate electrode 78. Using the side wall oxide film 80 as a mask, by ion implantation, the source/drain layers 176 are formed. In this manner, the structure of the flash memory which is shown in FIG. 106 is obtained.

Now, the LDD layers 177 are obtained by implanting arsenic ions, for instance, with the energy of 30 keV and at a dose of $1 \times 10^{13}/cm^2$. Meanwhile, the source/drain layers 176 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in FLASH, this will not be described nor is shown in the drawings.

Problems With Conventional LOGIC in FLASH

As described above, in the conventional LOGIC in FLASH, to form transistors which are used in the logic portion, the high-voltage resistant portion and the memory cell array portion and which have different characteristics from each other within one chip, the impurity concentration of the channel dope layer is changed in accordance with each transistor and a threshold value is adjusted.

However, as the impurity concentration of the channel dope layer becomes higher, the threshold value increases. At the same time, a diffusion layer leak increases since the impurity concentration becomes high at a junction portion between a diffusion layer and the substrate, for instance. In other words, the threshold value and the diffusion layer leak are in a trade-off relationship with each other, and therefore, a leak current is determined automatically once the threshold value is determined. Thus, the trade-off relationship between the two imposes a restriction on designing of the circuit.

Further, in the logic portion, in order to attain a high driving capability, it is necessary to form a thinner gate oxide film than those of the other portions. To this end, it is necessary to form a plurality of types of transistors which have different oxide film thicknesses from each other within the flash memory which is in the form of one chip, it is necessary to form the oxide films at more than one steps in some cases. For example, within the high-voltage resistant portion, at the step of removing the resist mask R263 (See FIG. 117), the insulation film 751 is grown further during formation of the oxide film 761 (See FIG. 118). That is, the oxide film 751 is formed at two steps. This leads to a higher possibility of allowing entry of an impurity or the like, which in turn degrades the reliability of the gate oxide film 75 or worsens the controllability of the film thickness. This further leads to a problem that the reliability of the N-channel MOS transistor T32 of the high-voltage resistant portion is lost, etc.

As described above, in a semiconductor device in which a plurality of types of transistors are formed within one chip, threshold values are heretofore adjusted by changing the impurity concentrations of the channel dope layers in accordance with the transistors. However, since there is a trade-off relationship between a threshold value and a diffusion layer leak, a leak current is determined automatically once the threshold value is determined. Thus, the trade-off relationship between the two imposes a restriction on designing of the circuit. In addition, it is necessary to form the gate oxide films at more than one steps. This leads to a higher possibility of allowing entry of an impurity or the like, which in turn degrades the reliability of the gate oxide films or worsens the controllability of the film thickness. This further leads to a problem that the reliability of the transistors is deteriorated.

SUMMARY OF THE INVENTION

A first aspect of the present invention is directed to a semiconductor device including at least one of a first to a third types of transistors on a semiconductor substrate, a transistor of the first type comprises: a first semiconductor layer of a first conductivity type which is formed in a surface of the semiconductor substrate; a first channel dope laser of the first conductivity type which is formed selectively in the first semiconductor layer; and a first control electrode which is formed at a position which faces the first channel dope layer, on the first semiconductor layer, a transistor of the second type comprises: a second semiconductor layer of the first conductivity type which is formed in the surface of the semiconductor substrate; a second channel dope layer of the first conductivity type which is formed selectively in the second semiconductor layer; and a second control electrode which is formed at a position which faces the second channel dope layer, on the second semiconductor layer, a transistor of the third type comprises: a third semiconductor layer of the first conductivity type which is formed in the surface of the semiconductor substrate; a third channel dope layer of the first conductivity type which is formed selectively in the third semiconductor layer; and a third control electrode which is formed at a position which faces the third channel dope layer, on the third semiconductor layer, and at least one of the first to the third control electrodes internally includes an impurity layer of the second conductivity type having a concentration distribution in the direction of depth.

According to the first aspect of the present invention, since at least one of the first to the third control electrodes internally includes an impurity layer of the second conductivity type having a concentration distribution in the direction of depth, it is possible to change the impurity concentrations of the control electrodes independently of each other among the first to the third types of transistors which have different characteristics from each other (e.g., having different required specifications from each other), and hence, it is possible to change the effective thicknesses of the gate oxide films, so that threshold values are set. Further, since it is possible to change the effective thicknesses of the gate oxide films by changing the impurity concentrations of the control electrodes, it is not necessary to form the gate oxide films of the transistors which have different breakdown voltages from each other to have different thicknesses from each other.

According to a second aspect of the invention, in the semiconductor device of the first aspect, the transistor of the first type comprises: a pair of first semiconductor regions of the second conductivity type formed selectively and independently of each other within the first semiconductor layer; and a first gate oxide film which is formed on the first semiconductor layer between the pair of first semiconductor regions, the first control electrode is formed on the first gate oxide film, the first channel dope layer is formed between the pair of first semiconductor regions within the first semiconductor layer, the transistor of the second type comprises: a pair of second semiconductor regions of the second conductivity type formed selectively and independently of each other within the second semiconductor layer; and a second gate oxide film which is formed on the second semiconductor layer between the pair of second semiconductor regions, the second control electrode is formed on the second gate oxide film, the second channel dope layer is formed between the pair of second semiconductor regions within the second semiconductor layer, the transistor of the third type comprises: a pair of third semiconductor regions of the second conductivity type formed selectively and independently of each other within the third semiconductor layer; and a third gate oxide film which is formed on the third semiconductor layer between the pair of third semiconductor regions, the third control electrode is formed on the third gate oxide film, the third channel dope layer is formed between the pair of third semiconductor regions within the third semiconductor layer, the first, the second and the third control electrodes include a first, a second and a third impurity layers, respectively, which have different impurity concentrations from each other, the first to the third gate oxide films have the same thickness, and the first to the third channel dope layers have the same impurity concentration.

Accordingly, in the second aspect of the invention, since the first to the third control electrodes includes the first to the third impurity layers which have different impurity concentrations from each other, the first to the third gate oxide films have the same thickness and the first to the third channel dope layers have the same impurity concentration, in a DRAM, for instance, by applying the first type of transistor as a sense amplifier circuit, the second type of transistor as a peripheral circuit and the third type of transistor as a memory cell array, the impurity concentrations of the control electrodes are each changed and the effective thicknesses of the gate oxide films are changed, so that it is possible to set threshold values. Hence, it is not necessary to change the impurity concentrations of the channel dope layers depending on the characteristics of the transistors unlike in the conventional techniques, and it is possible to fix the concentrations at such values with which a leak current (i.e., diffusion layer leak) from a diffusion layer can be suppressed as small as possible. Hence, by setting the impurity concentrations of the channel dope layers at such values with which a diffusion layer leak is as small as possible while setting threshold values by means of the impurity concentrations of the gate electrodes, it is possible to break the trade-off relationship between the threshold values and the diffusion layer leak and hence to eliminate a restriction imposed on circuit designing. To change the impurity concentrations of the gate electrodes independently is less influential over tse other structures than to change the impurity concentrations of the channel dope layers which are formed within the semiconductor substrate. That is, when ions are to be implanted into the semiconductor substrate, in particular, when implantation at a high dose is to be executed, this causes crystal deterioration of the semiconductor substrate. However, in the present invention, since ions are implanted into the gate electrodes which are located in the outer-most layer, this problem does not occur.

According to a third aspect of the invention, in the semiconductor device of the first aspect, the transistor of the first type comprises: a pair of first semiconductor regions of the second conductivity type formed selectively and independently of each other within the first semiconductor layer; and a first gate oxide film which is formed on the first semiconductor layer between the pair of first semiconductor regions, the first control electrode is formed on the first gate oxide film, the first channel dope layer is formed between the pair of first semiconductor regions within the first semiconductor layer, the transistor of the second type comprises: a pair of second semiconductor regions of the second conductivity type formed selectively and independently of each other within the second semiconductor layer; and a second gate oxide film which is formed on the second semiconductor layer between the pair of second semiconductor regions, the second control electrode is formed on the second gate oxide film, the second channel dope layer is formed between the pair of second semiconductor regions within the second semiconductor layer, the transistor of the third type comprises: a pair of third semiconductor regions of the second conductivity type formed selectively and independently of each other within the third semiconductor layer; a third gate oxide film which is formed on the third semiconductor layer between the pair of third semiconductor regions; a floating gate electrode which is formed on the third gate oxide film; and an inter-layer insulation film which is formed on the floating gate electrode, the third control electrode is formed on the inter-layer insulation film, the third channel dope layer is formed between the pair of third semiconductor regions within the third semiconductor layer, the first, the second and the third control electrodes include a first, a second and a third impurity layers, respectively, which have different impurity concentrations from each other, the first and the second gate oxide films have the same thickness which is a first thickness but the third gate oxide film has a second thickness which is thicker than the first thickness, and the first to the third channel dope layers have the same impurity concentration.

Accordingly, in the third aspect-of the invention, since the first and the second gate oxide films have the same first thickness but the third gate oxide film has a second thickness which is thinner than the first thickness while the first to the third channel dope layers have the same impurity concentration, in a flash memory, for instance, by applying the first type of transistor as a high-voltage resistant circuit, the second type of transistor as a peripheral circuit and the third type of transistor as a memory cell array, the impurity concentrations of the control electrodes are each changed and the effective thicknesses of the gate oxide films are changed. Hence, it is not necessary to change the thicknesses of the gate oxide films of the transistors which have different breakdown voltages from each other to have different thicknesses from each other. Further, it is possible to set threshold values by changing the effective thicknesses of the gate oxide films, it is not necessary to change the impurity concentrations of the channel dope layers depending on tse characteristics of the transistors, and it is possible to fix the concentrations at such values with which a leak current (i.e., diffusion layer leak) from a diffusion layer can be suppressed as small as possible. Hence, by setting the impurity concentrations of the channel dope layers at such values with which a diffusion layer leak is as small as possible while adjusting the breakdown voltage characteristics and the threshold values by means of the impurity concentrations of the gate electrodes, it is possible to satisfy the requirements regarding the breakdown voltages, to break the trade-off relationship between the threshold values and the diffusion layer leak, and hence, to eliminate a restriction imposed on circuit designing. Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

According to a fourth aspect of the invention, in the semiconductor device of the first aspect, the transistor of the first type comprises: a pair of first semiconductor regions of the second conductivity type formed selectively and independently of each other within the first semiconductor layer; and a first gate oxide film which is formed on the first semiconductor layer between the pair of first semiconductor regions, the first control electrode is formed on the first gate oxide film, the first channel dope layer is formed between the pair of first semiconductor regions within the first semiconductor layer, the transistor of the second type comprises: a pair of second semiconductor regions of the second conductivity type formed selectively and independently of each other within the second semiconductor layer; and a second gate oxide film which is formed on the second semiconductor layer between the pair of second semiconductor regions, the second control electrode is formed on the second gate oxide film, the second channel dope layer is formed between the pair of second semiconductor regions within the second semiconductor layer, the transistor of the third type comprises: a pair of third semiconductor regions of the second conductivity type formed selectively and independently of each other within the third semiconductor layer; and a third gate oxide film which is formed on the third semiconductor layer between the pair of third semiconductor regions, the third control electrode is formed on the third gate oxide film, the third channel dope layer is formed between the pair of third semiconductor regions within the third semiconductor layer, the first and the second control electrodes include a first and a second impurity layers, respectively, which have the same impurity concentration with each other, the third control electrode includes a third impurity layer whose concentration is lower than those of the first and the second impurity layers, the first to the third gate oxide films have the same thickness, and the first and the third channel dope layers have the same impurity concentration.

Accordingly, in the fourth aspect of the invention, impurity layers the first and the second control electrodes include the first and the second impurity layers, respectively, which have the same impurity concentrations with each other, the third control electrode includes the third impurity layer whose concentration is lower than those of the first and the second impurity layers, the first to the third gate oxide films have the same thickness. Hence, in a LOGIC in DRAM, for instance, by applying the first type of transistor as a logic circuit, the second type of transistor as a sense amplifier circuit and the third type of transistor as a memory cell array, in the memory cell array portion where the impurity concentration is low, a depletion layer is created in a large area within the gate electrode, so that the oxide film thickness becomes effectively thick and the threshold value is high. Thus, by setting the impurity concentrations of the first to the third channel dope layers at such values with which a diffusion layer leak is as small as possible while setting the threshold values by means of the impurity concentrations of the first to the third control electrodes, it is possible to break the trade-off relationship between the threshold values and the diffusion layer leak and hence to eliminate a restriction imposed on circuit designing.

According to a fifth aspect of the invention, in the semiconductor device of the first aspect, wherein the transistor of the first type comprises: a pair of first semiconductor regions of the second conductivity type formed selectively and independently of each other within the first semiconductor layer; and a first gate oxide film which is formed on the first semiconductor layer between the pair of first semiconductor regions, the first control electrode is formed on the first gate oxide film, the first channel dope layer is formed between the pair of first semiconductor regions within the first semiconductor layer, the transistor of the second type comprises: a pair of second semiconductor regions of the second conductivity type formed selectively and independently of each other within the second semiconductor layer; and a second gate oxide film which is formed on the second semiconductor layer between the pair of second semiconductor regions, the second control electrode is formed on the second gate oxide film, the second channel dope layer is formed between the pair of second semiconductor regions within the second semiconductor layer, the transistor of the third type comprises: a pair of third semiconductor regions of the second conductivity type formed selectively and independently of each other within the third semiconductor layer; a third gate oxide film which is formed on the third semiconductor layer between the pair of third semiconductor regions; a floating gate electrode which is formed on the third gate oxide film; and an inter-layer insulation film which is formed on the floating gate electrode, the third control electrode is formed on the inter-layer insulation film, the third channel dope layer is formed between the pair of third semiconductor regions within the third semiconductor layer, the first and the third control electrodes include a first and a third impurity layers, respectively, which have the same impurity concentrations with each other, the second control electrode includes a second impurity layers whose concentration is lower than those of the first and the third impurity layers, the first and the second gate oxide films have the same thickness which is a first thickness but the third gate oxide film has a second thickness which is thicker than the first thickness, and the first to the third channel dope layers have the same impurity concentration.

Accordingly, in the fifth aspect of the invention, the first and the second gate oxide films have the same first thickness, but the third gate oxide film has a second thickness which is thicker than the first thickness, and the first to the third channel dope layers have the same impurity concentration. Hence, in a LOGIC in FLASH, for instance, by applying the first type of transistor as a logic circuit, the second type of transistor as a circuit in which a high breakdown voltage is required and the third type of transistor as a memory cell array, in the circuit in which a high breakdown voltage where the impurity concentration is low, a depletion layer is created in a large area within the gate electrode, so that the oxide film thickness becomes effectively thick and the threshold value is high. Thus, by setting the impurity concentrations of the first to the third the channel dope layers at such values with which a diffusion layer leak is as small as possible while setting the threshold values by means of the impurity concentrations of the first to the third the control electrodes, it is possible to break the trade-off relationship between the threshold values and the diffusion layer leak and hence to eliminate a restriction imposed on circuit designing.

A sixth aspect of the present invention is directed to a method of manufacturing a semiconductor device in which there are at least one of a first to a third types of transistors on a semiconductor substrate, comprising the steps of: (a) forming a first to a third semiconductor layers of the first conductivity type at positions within a surface of the semiconductor substrate at which the first to the third types of transistors are formed; (b) selectively forming a first, a second and a third channel dope layers of the first conductivity type within the first, the second and the third semiconductor layers, respectively, by ion implantation; and (c) forming a first to a third control electrodes at positions facing the first to the third channel dope layers on the first to the third semiconductor layers, wherein the step (c) of forming the first to the third control electrodes includes a step of forming an impurity layer of the first conductivity type which has a concentration distribution in the direction of depth within at least one of the first to the third control electrodes.

Accordingly, the method of manufacturing a semiconductor device of the sixth aspect of the invention is appropriate for manufacturing the semiconductor device of the first aspect of the invention.

According to a seventh aspect of the invention, in the method of manufacturing a semiconductor device of the sixth aspect, the step (c) comprises the steps of: forming an oxide film on the first to the third semiconductor layers; forming a first conductive layer on the oxide film; implanting an impurity of the second conductivity type into the first conductive layer at a dose n1 to thereby form a second conductive layer which has a concentration distribution in the direction of depth within the first conductive layer; masking over the second conductive layer at a position at which the third type of transistor is formed and implanting an impurity of the second conductivity type into the not-masked second conductive layer at a dose n2 to thereby form a third conductive layer which has a concentration distribution in the direction of depth within the second conductive layer; masking over the third and the second conductive layers at positions at which the second and the third type of transistors are formed and implanting an impurity of the second conductivity type into the not-masked third conductive layer at a dose n3 to thereby form a fourth conductive layer which has a concentration distribution in the direction of depth within the third conductive layer; and selectively removing the second to the fourth conductive layers and the oxide film by patterning, to thereby form a first gate oxide film and a first control electrode on the first semiconductor layer, a second gate oxide film and a second control electrode on the second semiconductor layer, and a third gate oxide film and a third control electrode on the third semiconductor layer.

Accordingly, the method of manufacturing a semiconductor device of the seventh aspect of the invention is appropriate for manufacturing the semiconductor device of the second aspect of the invention.

According to an eighth aspect of the invention, in the method of manufacturing a semiconductor device of the sixth aspect, the step (c) comprises the steps of: forming an oxide film on the first to the third semiconductor layers; forming a first conductive layer on the oxide film; patterning the first conductive layer and the oxide film to thereby selectively remove the first conductive layer and the oxide film; selectively implanting an impurity of the second conductivity type into the first conductive layer at a dose n1 to thereby form a second conductive layer which has a concentration distribution in the direction of depth within the first conductive layer; masking over the second conductive layer at a position at which the third type of transistor is formed and implanting an impurity of the second conductivity type into the not-masked second conductive layer at a dose n2 to thereby form a third conductive layer which has a concentration distribution in the direction of depth within the second conductive layer; and masking over the third and the second conductive layers at positions at which the second and the third type of transistors are formed and implanting an impurity of the second conductivity type into the not-masked third conductive layer at a dose n3 to thereby form a fourth conductive layer which has a concentration distribution in the direction of depth within the third conductive layer.

Accordingly, the method of manufacturing a semiconductor device of the eighth aspect of the invention is appropriate for manufacturing the semiconductor device of the second aspect of the invention. In addition, since patterning is performed before forming the second to the fourth conductive layers into which the impurity is implanted, the patterning step is easy, and hence, the manufacturing steps are shortened.

According to a ninth aspect of the invention, in the method of manufacturing a semiconductor device of the sixth aspect, the step (c) comprises the steps of: forming a first oxide film having a first thickness on the first to the third semiconductor layers; selectively forming a first conductive layer which ununiformly has an impurity of the second conductivity type on the first oxide film on the third semiconductor layer; selectively forming an insulation film on the first conductive layer while removing the first oxide film at positions where the first and the second types of transistors are formed; forming a second oxide film having a second thickness which is thinner than the first thickness on the first and the second semiconductor layer; forming a second conductive layer on the second oxide film and the insulation film; implanting an impurity of the second conductivity type into the second conductive layer at a dose n1 to thereby form a third conductive layer which has a concentration distribution in the direction of depth within the second conductive layer; masking over the third conductive layer at a position at which the first type of transistor is formed and implanting an impurity of the second conductivity type into the not-masked third conductive layer at a dose n2 which remains to thereby form a fourth conductive layer which has a concentration distribution in the direction of depth within the third conductive layer; masking over the third and the fourth conductive layers at positions at which the first and the third type of transistors are formed and implanting an impurity of the second conductivity type into the not-masked fourth conductive layer at a dose n3 which remains to thereby form a fifth conductive layer which has a concentration distribution in the direction of depth within the fourth conductive layer; and selectively removing the third to the fifth conductive layers, the first and the second oxide films, and the insulation film by patterning, to thereby form a first gate oxide film and a first control electrode on the first semiconductor layer, a second gate oxide film and a second control electrode on the second semiconductor layer, and a third gate oxide film, a floating gate electrode, an inter-layer insulation film and a third control electrode on the third semiconductor layer.

According to a tenth aspect of the invention, in the method of manufacturing a semiconductor device of the sixth aspect, the step (b) includes a step of forming the first and the third channel dope layers so that the first and the third channel dope layers have the same impurity concentration, and the step (c) comprises the steps of: forming an oxide film having a first thickness on the first to the third semiconductor layers; forming a first conductive layer on the oxide film; implanting an impurity of the second conductivity type into the first conductive layer at a dose n1 to thereby form a second conductive layer which has a concentration distribution in the direction of depth within the second conductive layer; masking over the second conductive layer at a position at which the third type of transistor is formed and implanting an impurity of the second conductivity type into the not-masked second conductive layer at a dose n2 which remains to thereby form a third conductive layer which has a concentration distribution in the direction of depth within the second conductive layer; selectively removing the second and the third conductive layers and the insulation film by patterning, to thereby form a first gate oxide film and a first control electrode on the first semiconductor layer, a second gate oxide film and a second control electrode on the second semiconductor layer, and a third gate oxide film and a third control electrode on the third semiconductor layer.

According to an eleventh aspect of the invention, in the method of manufacturing a semiconductor device of the sixth aspect, the step (c) comprises the steps of: forming a first oxide film having a first thickness on the first to the third semiconductor layers; selectively forming a first conductive layer which ununiformly has an impurity of the second conductivity type on the first oxide film on the third semiconductor layer; selectively forming an insulation film on the first conductive layer while removing the first oxide film at positions where the first and the second types of transistors are formed; forming a second oxide film having a second thickness which is thinner than the first thickness on the first and the second semiconductor layer; forming a second conductive layer on the second oxide film and the insulation film; implanting an impurity of the second conductivity type into the second conductive layer at a dose n1 to thereby form a third oxide film which has a concentration distribution in the direction of depth within the second conductive layer; masking over the third conductive layer at a position at which the second type of transistor is formed and implanting an impurity of the second conductivity type into the not-masked third conductive layer at a dose n2 which remains to thereby form a fourth conductive layer which has a concentration distribution in the direction of depth within the third conductive layer; and selectively removing the first, the third and the fourth conductive layers, the first and the second oxide films, and the insulation film by patterning, to thereby form a first gate oxide film and a first control electrode on the first semiconductor layer, a second gate oxide film and a second control electrode on the second semiconductor layer, and a third gate oxide film, a floating gate electrode, an inter-layer insulation film and a third control electrode on the third semiconductor layer.

Accordingly, the methods of manufacturing a semiconductor device of the ninth to the eleventh aspects of the invention is appropriate for mansfacturing the semiconductor devices of the third to the fifth aspects of the invention.

A twelfth aspect of the invention is directed a method of manufacturing a semiconductor device in which there are a first and a second types of transistors formed on a single semiconductor substrate, comprising the. steps of: (a) selectively forming a field oxide film on a main surface of the semiconductor substrate to thereby define a first and a second regions in which the first and the second types of transistors are formed; (b) forming an oxide film on the first and the second regions and over the field oxide film; (c) forming a conductive layer, which becomes a control electrode, on the oxide film; and (d) introducing an impurity of the same conductivity type as that of a source/drain layer into the conductive layer on at least one of the first and the second regions.

Accordingly, in the methods of manufacturing a semiconductor device of the twelfth aspect of ths invention, the impurity of the same conductivity type as that of the source/drain layer is implanted into the conductive layer on at least one of the first and the second regions. Hence, it is possible to obtain a semiconductor device in which the effective thicknesses of the gate oxide films are changed and threshold values are set by changing the impurity concentrations of the control electrodes between the first and the second types of transistors. Even when different voltages are applied to the control electrodes of the first and the second S types of transistors, it is not necessary to change the thicknesses of the oxide films. This simplifies the manufacturing steps than where it is necessary to form the oxide films separately.

According to a thirteenth aspect of the invention, in the method of manufacturing a semiconductor device of the first aspect, the step (d) includes the steps of: selectively forming a resist on said conductive layer on at least the first region among the first and she second regions and implanting the impurity around the resist by ion implantation; and thermally diffusing the impurity which is implanted to thereby introduce the impurity into the conductive layer on at least the first region among the first and the second regions.

Accordingly, in the methods of manufacturing a semiconductor device of the thirteenth aspect of the invention, since the impurity is implanted directly by thermal diffusion into the conductive layer on at least the first region among the first and the second regions, it is possible to adjust the impurity concentration finer than where impurity ions are implanted directly.

According to a fourteenth aspect of the invention, in the method of manufacturing a semiconductor device of the first aspect, the step (d) includes the steps of: selectively forming a resist on a portion extending from an edge portion of the conductive layer on at least the first region among the first and the second regions to the field oxide film and implanting the impurity into the conductive layer which is not covered with the resist by ion implantation; and thermally diffusing the impurity which is implanted to thereby introduce the impurity into the conductive layer on at least the first region among the first and the second regions in such a manner that the impurity-has a high concentration at a central portion taken in a plane direction but has a lower concentration with a distance toward the edge portion.

Accordingly, in the methods of manufacturing a semiconductor device of the fourteenth aspect of the invention, since the impurity is implanted into the conductive layer on at least the first region in such a manner that the impurity has a high concentration at a central portion taken in a plane direction but has a lower concentration with a distance toward the edge portion, the range in which a depletion layer is formed becomes larger within the edge portion of the conductive layer, the effective thickness of the oside film, and the threshold value is partially increased. In the case where an SOI substrate is used as the semiconductor substrate, for instance, a problem of a decreased threshold value due to the structure of the edge portion is solved.

According to a fifteenth aspect of the invention, in the method of manufacturing a semiconductor device of the first aspect, the step (c) includes a step of (c-1) stacking a first conductive layer which uniformly contains the impurity and the second conductive layer which does not contain the impurity to thereby form the conductive layers, and the step (d) includes a step of diffusing the impurity naturally from the first conductive layer into the second conductive layer with respect to the first and the second conductive layers at least on the first region to thereby distribute the impurity.

Accordingly, in the methods of manufacturing a semiconductor device of the fifteenth aspect of the invention, since the impurity is diffused naturally from the fisst conductive layer into the second conductive layer among the first and the second conductive layers at least on the first region to thereby distribute the impurity, it is possible to adjust the impurity concentration finer than where impurity ions are implanted directly.

According to a sixteenth aspect of the invention, in the method of manufacturing a semiconductor device of the first aspect, the step (c-1) includes a step of forming a diffusion suppression film which suppresses a quantity of diffusion of the impurity between the first conductive layer and the second conductive layer.

Accordingly, in the methods of manufacturing a semiconductor device of the sixteenth aspect of the invention, since the diffusion suppression film which suppresses a quantity of diffusion of the impurity is formed between the first conductive layer and the second conductive layer, it is possible to suppress diffusion of the impurity and adjust the quantity of diffusion.

Accordingly, an object of the present invention is to provide for a semiconductor device in which there is no trade-off relationship between a threshold value and a diffusion layer leak and it is not necessary to form gate oxide films at more than one steps, and to provide for a method of manufacturing such a semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 45 to 57 are diagrams showing manufacturing. steps according to the fourth preferred embodiment of the present invention;

DESCRIPTION OF THE PREFERRED EMBODIMENTS

In general, a gate electrode forming a MOS transistor is doped with an N-type impurity or a P-type impurity. This aims at reducing the resistance of a gate by means of doping with the impurity. Further, whether to use an N-type impurity or a P-type impurity depends on the type of a well layer. That is, when a P-type gate electrode is selected for an N-type well or an N-type gate electrode is selected for a P-type well, it is possible to suppress a threshold value.

Figure 1:
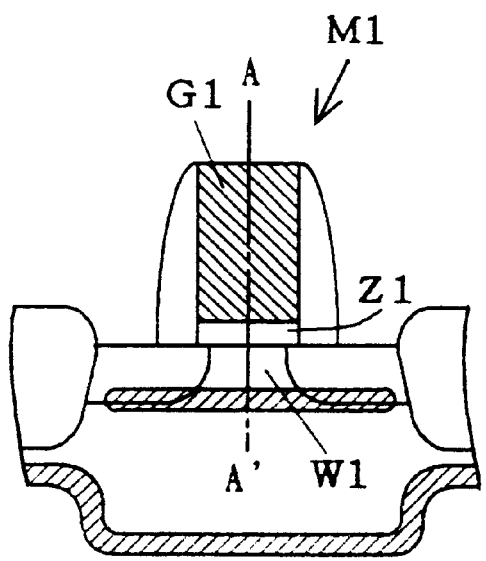
FIG. 1 is a diagram for describing the function of an impurity within a gate electrode.

Roughly speaking, there are two methods to form an electrode which is doped, with an impurity. One method is to form a gate electrode by stacking a doped polysilicon layer. In other words, a stacking material of polysilicon and material gas of an impurity are flown at the same time by a CVD method, so as to dope with an impurity concurrently with formation of a polysilicon layer. With this method, it is possible to keep an impurity profile constant within the polysilicon. FIG. 1 shows a structure of a MOS transistor M1 which is formed in this manner, and FIG. 2 shows an impurity profile within a gate electrode of the MOS transistor M1.

Figure 2:
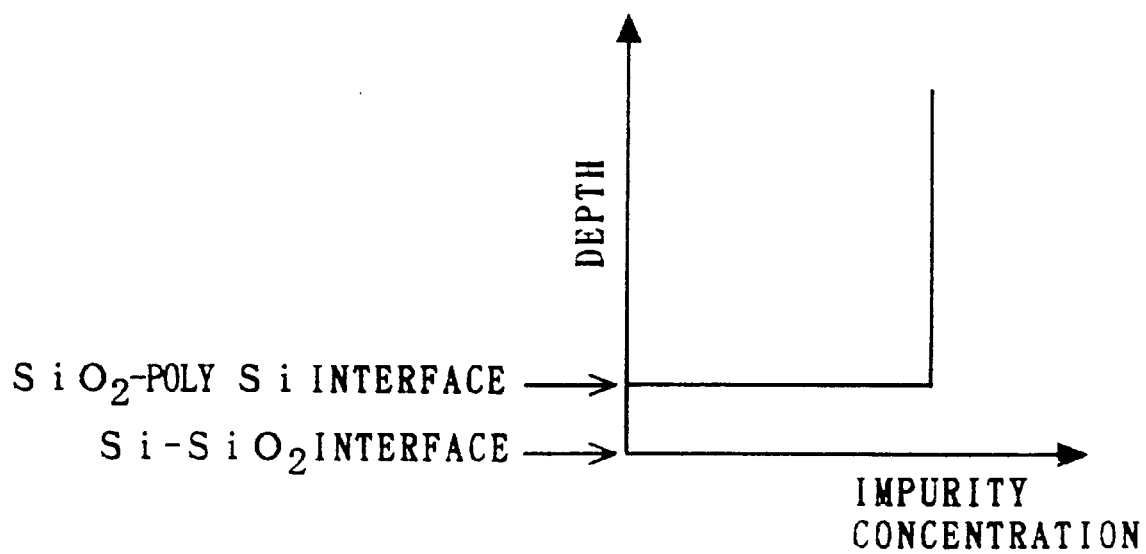
FIG. 2 is a diagram for describing a distribution of an impurity within the gate electrode.

As shown in FIG. 2, the impurity concentration of a gate electrode G1 of the MOS transistor M1 shown in FIG. 1 taken along A–A' line abruptly surges at an interface between a gate oxide film ($SiO_2$) Z1 and the gate electrode (polysilicon) G1 and remains at a constant value within the gate electrode G1. In FIG. 2, the impurity concentration is measured along a horizontal axis while a distance (i.e., depth) in the direction of the A–A' line is measured along a vertical axis. The Si—SiO$_2$ interface is a junction surface between a well layer W1 and the gate oxide film Z1 in FIG. 2.

However, with this method, since all gate electrodes within one chip are doped with the same type of impurity, in the case where N-type doped polysilicon is stacked, for example, although it is possible to suppress a threshold value of an N-channel type MOS transistor which is formed within a P-type well layer, a threshold value of a P-channel type MOS transistor which is formed within an N-type well layer becomes high. This gives rise to a necessity to adjust the threshold values by means of channel engineering such as to form a channel buried layer or the like.

Figure 3:
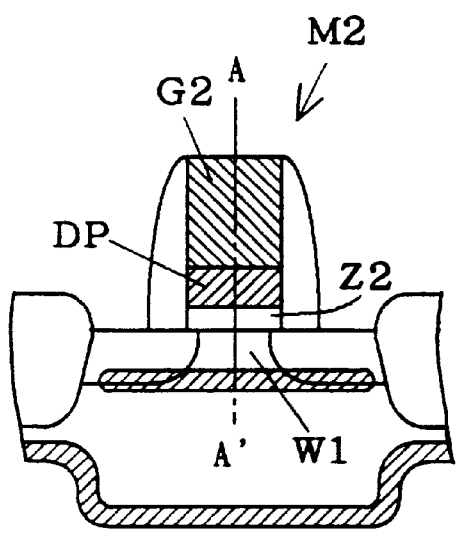
FIG. 3 is a diagram for describing the function of an impurity within a gate electrode.

Another method is to utilize an ion implantation technique. Namely, a method in which after forming a non-doped polysilicon layer, a gate electrode is doped with an impurity by implanting impurity ions. With this method, by limiting an implantation resion using a resist mask, for example, it is possible to form an N-type gate electrode and a P-type gate electrode separately in an easy manner. FIG. 3 shows a structure of a MOS transistor M2 which is formed in this manner, and FIG. 4 shows an impurity profile within the gate electrodes.

Figure 4:
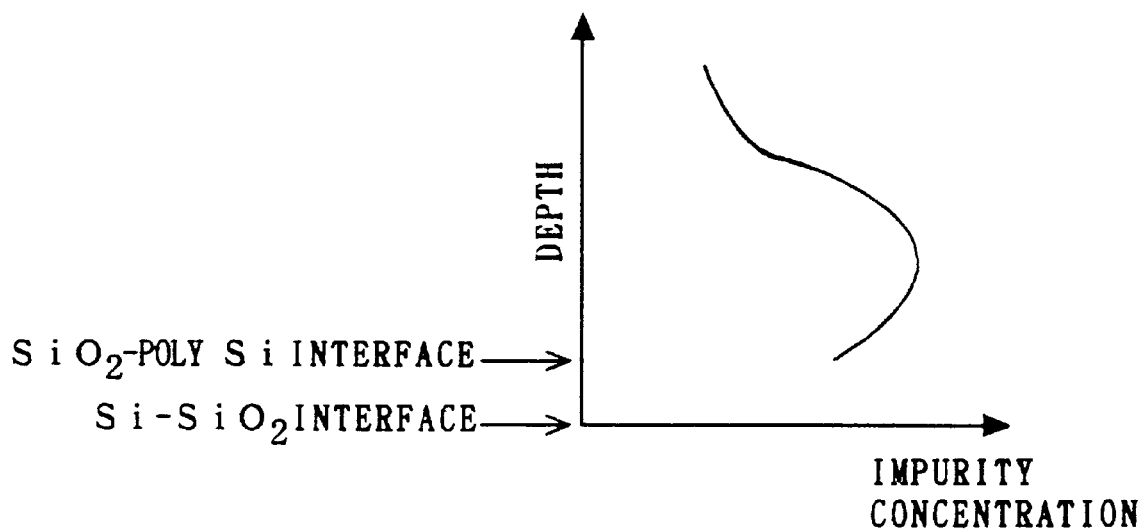
FIG. 4 is a diagram for describing a distribution of an impurity within the gate electrode.

As shown in FIG. 4, the impurity concentration of a gate electrode G2 of the MOS transistor M2 shown in FIG. 3 taken along the A–A' line shows such a distribution of increasing in the form of a curve at an interface between a gate oxide film (SiO$_2$) Z2 and the gate electrode (polysilicon) G2, reaching a peak within the gate electrode G2, and thereafter decreasing again in the form of a curve.

In the case of such ion implantation, it is not possible to attain uniform distributions of the impurity within the gate electrodes, so that the impurity concentration becomes low at the interfaces between the gate electrodes and the gate oxide films. Hence, upon operation of the transistors, depletion layers DP are created within the gate electrodes. If the depletion layers are created, voltage drop results within the depletion layer, and therefore, a voltage which is applied to an element becomes lower than the applied voltage. That is, an oxide film thickness becomes effectively thick, creating a problem such as an increased threshold value and a reduction in a drain current.

Figure 5:
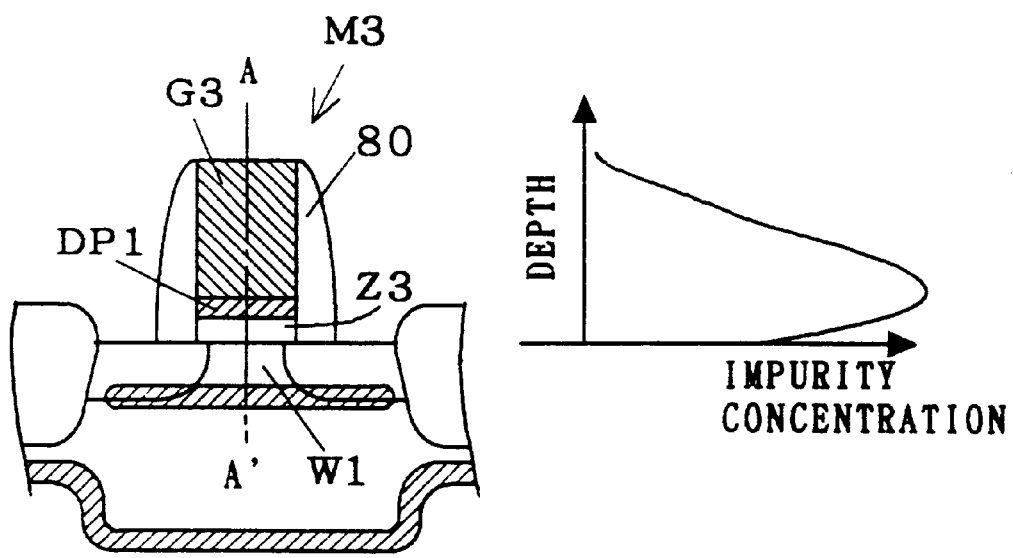
FIGS. 5 and 6 are diagrams for describing the function of an impurity within a gate electrode.
Figure 6:
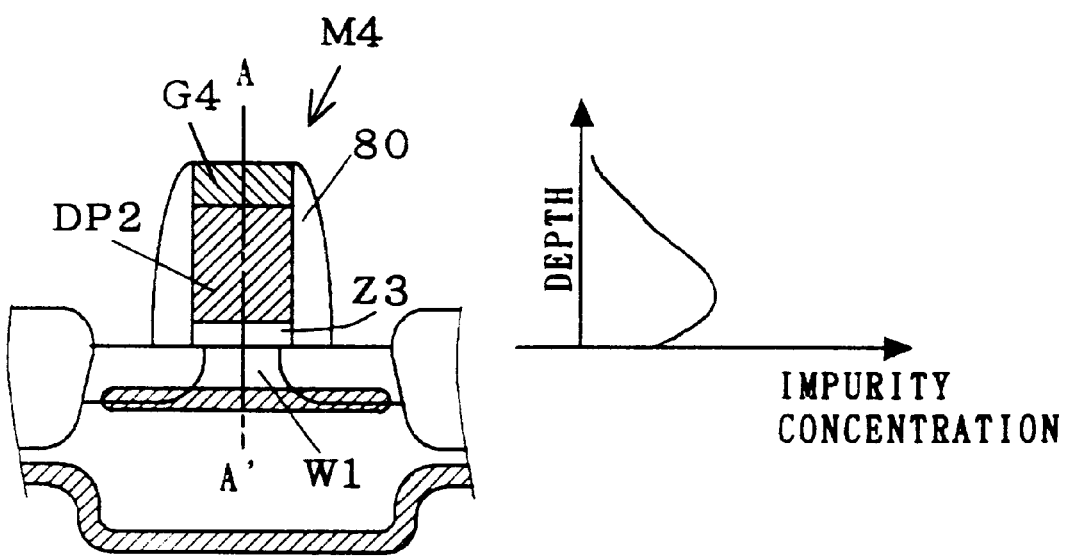

A conventional approach to prevent creation of depletion layers within the gate electrodes is to utilize a fact that the higher the impurity concentration is, the more unlikely a depletion layer is created, so that the impurity concentrations within the gate electrodes are as high as possible. FIGS. 5 and 6 show this phenomena.

FIG. 5 shows a condition of a depletion layer DP1 which is formed within a gate electrode G3 in a MOS transistor M3 in the case where the impurity concentration within the gate electrode G3 is relatively high, and the impurity profile of the gate electrode G3 taken along the A–A' line.

FIG. 6 shows a condition of a depletion layer DP2 which is formed within a gate electrode G4 in a MOS transistor M4 in the case where the impurity concentration within the gate electrode G4 is relatively high, and the impurity profile of the gate electrode G4 taken along the A–A' line.

Comparing the two, it is understood that the depletion layer DP2 of the gate electrode G4 is formed to spread larger than the depletion layer DP1 of the gate electrode G3.

The present invention makes a positive use of the depletion layers which are formed within the gate electrodes, so that by means of adjustment of the ranges in which the depletion layers are formed, a plurality of types of transistors which have different effective oxide film thicknesses from each other are formed within one chip.

In the following, preferred embodiments of the present invention will be described in relation to examples of a DRAM, a flash memory, a logic in DRAM, and a LOGIC in flash memory.

First Preferred Embodiment

<1-1. Structure Of Device>

Figure 7:
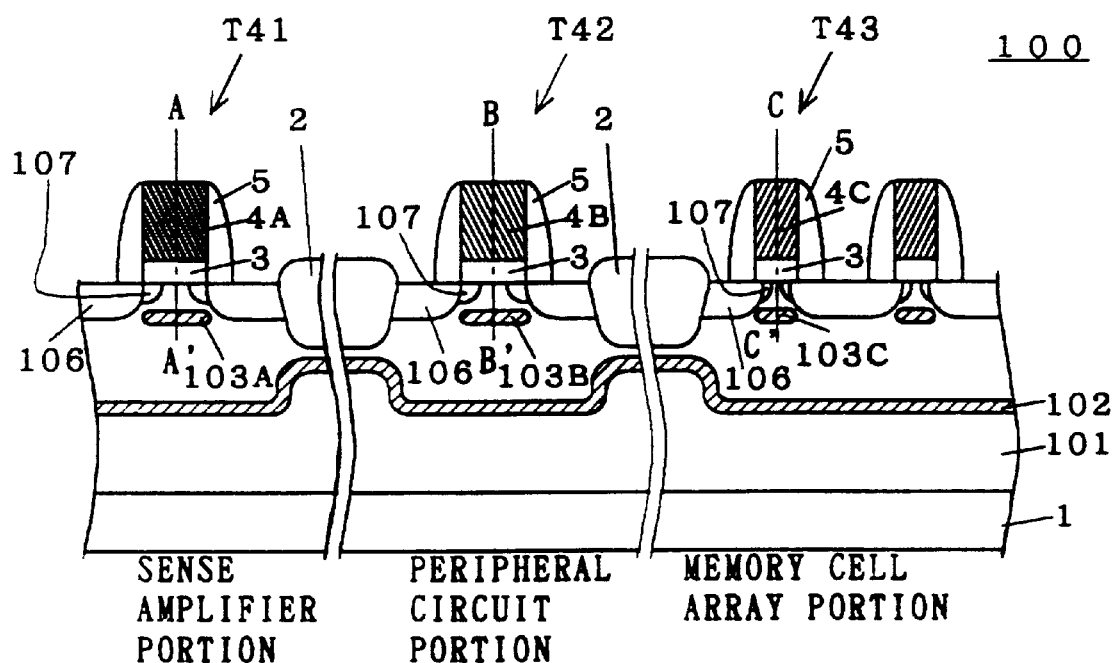
FIG. 7 is a cross sectional view showing a structure of a first preferred embodiment of the present invention.

FIG. 7 shows a partial structure of a DRAM 100 in which a plurality of types of transistors are formed, as a first preferred embodiment of the present invention. In general, a DRAM comprises not only a memory cell array portion for storing data, but also a sense amplifier portion and a peripheral circuit portion (e.g., an address buffer, an X decoder, a Y decoder, a row/column clock circuit, an I/O pass circuit, a refresh circuit, etc.).

Any these portions are formed -by transistors, and different characteristics are required from the respective transistors. For example, with respect to threshold values, while a threshold value for a transistor of the memory cell array portion is about 1V and a threshold value for transistors of the peripheral circuit portions are about 0.8V, a threshold value for the transistor of the sense amplifier portion must be suppressed as low as 0.4V.

FIG. 7 shows cross sections of N-channel MOS transistors T41 to T43 which are used for the sense amplifier portion, the peripheral circuit portion, and the memory cell array portion.

In FIG. 7, the N-channel MOS transistors T41 to T43 formed within a P-type well layer 101 which is formed on the same semiconductor substrate 1 (of the P-type). The well layer 101 is element-separated by a channel cut layer 102 and a LOCOS layer 2 in such a manner that the N-channel MOS transistors T41 to T43 are formed in regions which are created by element separation.

The N-channel MOS transistor T41 of the sense amplifier portion comprises a pair of source/drain layers 106 formed within the well layer 101 independently of each other but parallel to each other and a pair of lightly doped drain layers (hereinafter "LDD layers") 107 formed adjacent to edge portions facing each other of the source/drain layers 106.

The gate oxide film 3 is formed on the LDD layers 107, and a gate electrode 4A is formed on the gate oxide film 3. A side wall oxide film 5 is formed on a side surface of the gate oxide film 3 and the gate electrode 4A. Within the well layer 101 under the gate electrode 4A, a channel dope layer 103A is formed.

The N-channel MOS transistor T42 of the peripheral circuit portion comprises a pair of source/drain layers 106 formed within the well layer 101 independently of each other but parallel to each other and a pair of LDD layers 107. The gate oxide film 3 is formed on the LDD layers 107, and a gate electrode 4B is formed on the gate oxide film 3. The side wall oxide film 5 is formed on a side surface of the gate oxide film 3 and the gate electrode 4B. Within the well layer 101 under the gate electrode 4B, a channel dope layer 103B is formed.

The N-channel MOS transistor T43 of the memory cell array portion comprises a pair of source/drain layers 106 formed within the well layer 101 independently of each other but parallel to each other and a pair of LDD layers 107. A gate oxide film 3 is formed on the source/drain layers 106 and the LDD layers 107, and a gate electrode 4C is formed on the gate oxide film 3. The side wall oxide film 5 is formed on a side surface of the gate oxide film 3 and the gate electrode 4C. Within the well layer 101 under the gate electrode 4C, a channel dope layer 103C is formed. The memory cell array portion has a gate array structure in which adjacent gates share one source/drain layer 106. Such structures are arranged successively.

Table 5 shows figures regarding the structures of the N-channel MOS transistors T41 to T43.

thicknesses of the respective gate oxide films are progressively thicker in the order of the sense amplifier portion, the peripheral circuit portion and the memory cell array portion.

<1-2. Manufacturing Method>

In the following, a description will be given on a method of manufacturing the N-channel MOS transistors T41, T42 and T43 of the sense amplifier portion, the peripheral circuit portion and the memory cell array portion which form the

TABLE 5

|  | SENSE AMPLIFIER PORTION (T41) | PERIPHERAL CIRCUIT PORTION (T42) | MEMORY CELL ARRAY PORTION (T43) |
| --- | --- | --- | --- |
| FIELD OXIDE FILM THICKNESS | 4000 Å | 4000 Å | 4000 Å |
| GATE OXIDE FILM THICKNESS | 100 Å | 100 Å | 100 Å |
| GATE ELECTRODE FILM THICKNESS | 2000 Å | 2000 Å | 2000 Å |
| SIDE WALL | 1000 Å | 1000 Å | 1000 Å |
| WELL | B 700 keV $1 \times 10^{13}/cm^2$ | B 700 keV $1 \times 10^{13}/cm^2$ | B 700 keV $1 \times 10^{13}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $1 \times 10^{12}/cm^2$ | B 50 keV $1 \times 10^{12}/cm^2$ | B 50 keV $1 \times 10^{12}/cm^2$ |
| LDD | As 30 keV $1 \times 10^{13}/cm^2$ | As 30 keV $1 \times 10^{13}/cm^2$ | As 30 keV $1 \times 10^{13}/cm^2$ |
| SOURCE/DRAIN | As 50 keV $5 \times 10^{15}/cm^2$ | As 50 keV $5 \times 10^{15}/cm^2$ | As 50 keV $5 \times 10^{15}/cm^2$ |
| GATE IMPLANTATION | As 30 keV $5 \times 10^{15}/cm^2$ | As 30 keV $3 \times 10^{15}/cm^2$ | As 30 keV $1 \times 10^{15}/cm^2$ |
| THERMAL POROCESSING |  | 850° C. 60 min |  |

In Table 5, impurity dose for forming the gate electrodes layers of the N-channel MOS transistors T41, T42 and T43 are $5 \times 10^{15}/cm^2$, $3 \times 10^{15}/cm^2$ and $1 \times 10^{15}/cm^2$, respectively. Arsenic (As) is implanted as an impurity for either layers with the implantation energy of 30 keV.

Figure 8:
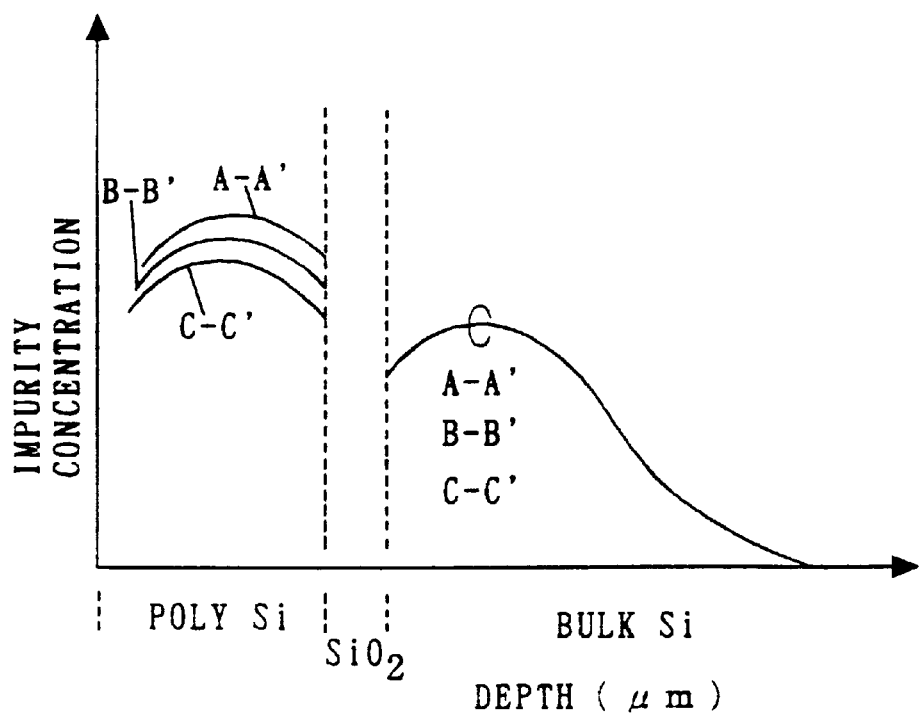
FIG. 8 is a diagram for describing a distribution of an impurity according to the first preferred embodiment of the present invention.

FIG. 8 shows impurity profiles of the N-channel MOS transistors T41, T42 and T43 forming the sense amplifier portion, the peripheral circuit portion and the memory cell array portion, all of which shown in FIG. 7, taken at cross sectional portions along A–A' line, B–B' line and C–C' line, respectively.

In FIG. 8, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 5, since impurity dose-are different from each other among gate electrodes 4A to 4C of the N-channel MOS transistors T41 to T43, impurity concentrations are different from each other. The impurity concentrations within the gate electrodes are set progressively lower in the order of higher threshold values which are expected in the gate electrodes. In short, as indicated at the A–A' line, the transistor T41 of the sense amplifier portion (B–B' line) has the highest value, followed by the transistor T42 of the peripheral circuit portion and the transistor T43 of the memory cell array portion (C–C' line) in this order. Since impurity dose are the same between the channel dope layers 103A to 103C of the N-channel MOS transistors T41 to T43, the A–A' line, the B–B' line and the C–C' line overlap each other.

Hence, in the memory cell array portion, the depletion layer is the largest at the gate electrode, the effective thickness of the oxide film is thickest, and the threshold value is the highest.

Figure 9:
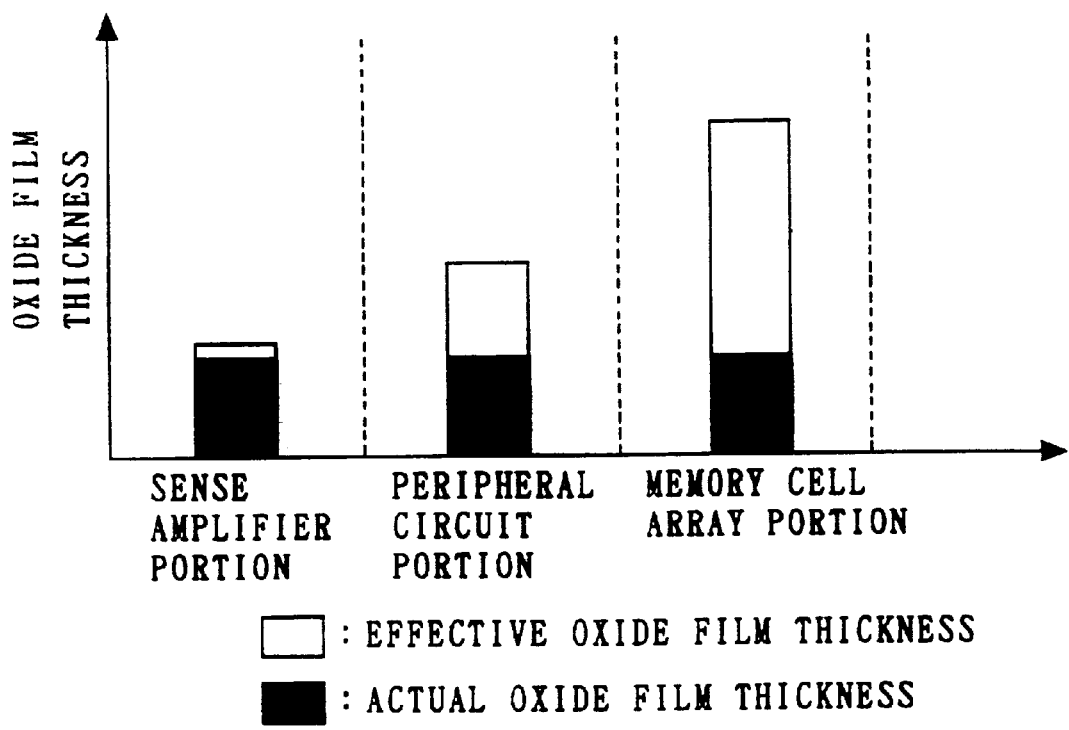
FIG. 9 is a diagram for describing a thickness of a gate oxide film in the first preferred embodiment of the present invention.

FIG. 9 shows actual thicknesses and effective thicknesses of the respective gate oxide films. FIG. 9 shows the N-channel MOS transistors of the sense amplifier portion, the peripheral circuit portion and the memory cell array portion in this order from the left-hand side along the horizontal axis. As clearly shown in FIG. 9, the effective DRAM 100 which is shown in FIG. 7, with reference to FIGS. 10 to 15.

Figure 10:
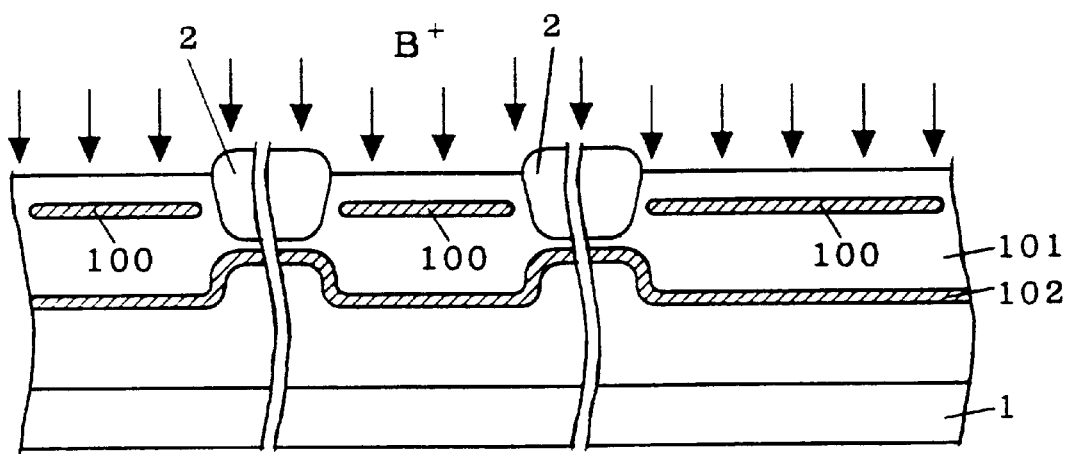
FIGS. 10 to 15 are diagrams showing manufacturing steps according to the first preferred embodiment of the present invention.

First, at a step shown in FIG. 10, a LOCOS layer (i.e., field oxide film) 2 is formed into a thickness of 4,000 Å, for instance, by a LOCOS method on a surface of the semiconductor substrate 1 of the P-type. Following this, boron ions, for instance, are implanted with the energy of 700 keV and at a dose of $1 \times 10^{13}/cm^2$, thereby forming a P-type well region 101 within the semiconductor substrate 1. Although an N-type well region as well is formed in the semiconductor substrate 1 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 102 within the semiconductor substrate 1. The channel cut layer 102 is formed in such a shape which together with the LOCOS layer 2 creates the element-separated regions.

Next, at a predetermined position within the well region 101, a channel dope layer 100 which will become the channel dope layers 103A to 103C is formed. At this stage, the channel dope layer 100 is formed also in regions within the transistors T2 and T3 of the peripheral circuit portion and the memory cell array portion. The channel dope layer 100 is formed by implanting boron ions, for instance, with the energy of 50 keV and at a dose of $1 \times 10^{12}/cm^2$.

Figure 11:
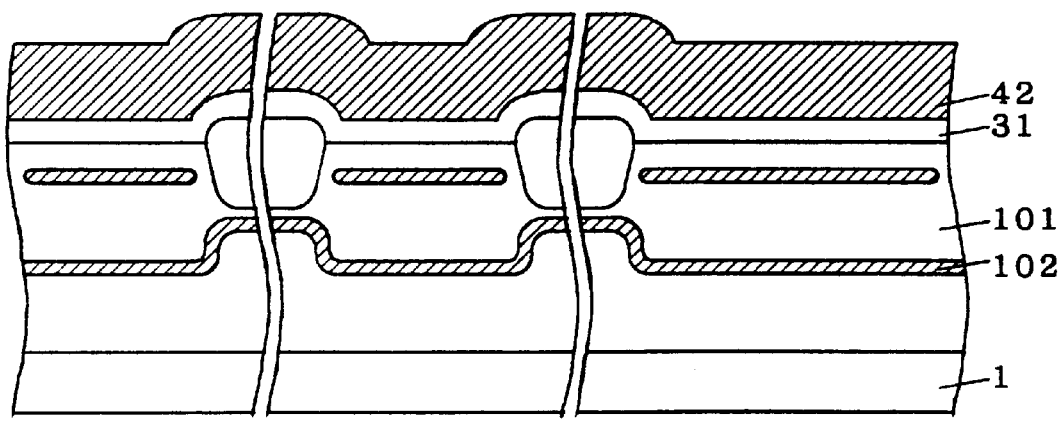

Next, at a step shown in FIG. 11, after forming an oxide film 31 which will become the gate oxide film 3 on a main surface of the semiconductor substrate 1 by a thermal oxide method, a (non-doped) polysilicon layer 42 is formed as a gate electrode material on the gate oxide film 3 by a CVD method. The oxide film 31 has a thickness of about 100 Å, whereas the polysilicon layer 42 has a thickness of about 2,000 Å.

Figure 12:
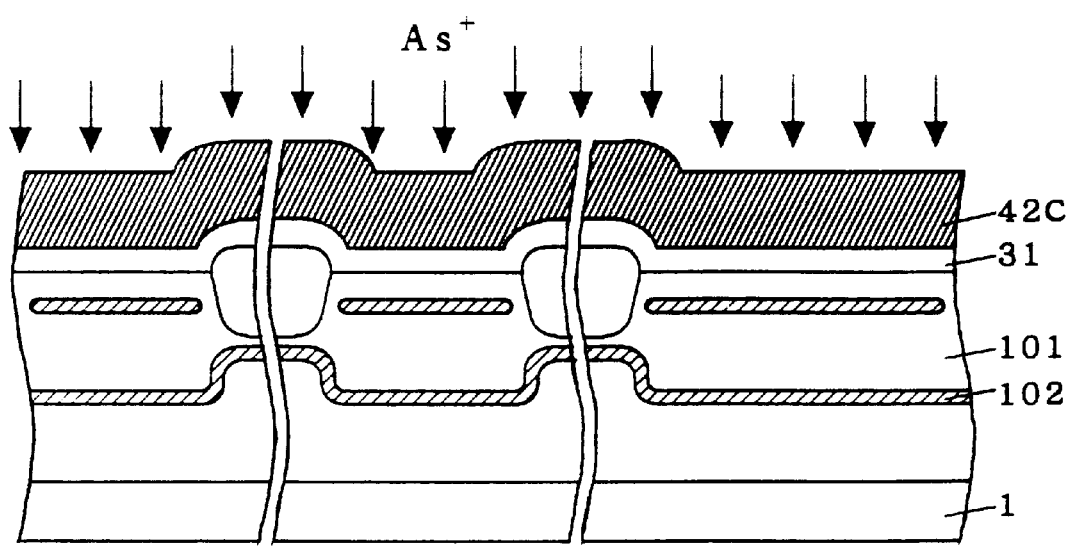

Next, at a step shown in FIG. 12, impurity ions are implanted into the polysilicon layer 42 in accordance with the gate electrode of the N-channel MOS transistor T43, which has the lowest impurity concentration, of the memory cell array portion, thereby forming a doped polysilicon layer 42C. At this stage, the doped polysilicon layer 42C is formed also in the peripheral circuit portion and the memory cell array portion. The doped polysilicon layer 42C is formed by implanting arsenic ions, for instance, with the energy of 30 keV and at a dose of $1 \times 10^{15}/cm^2$.

Figure 13:
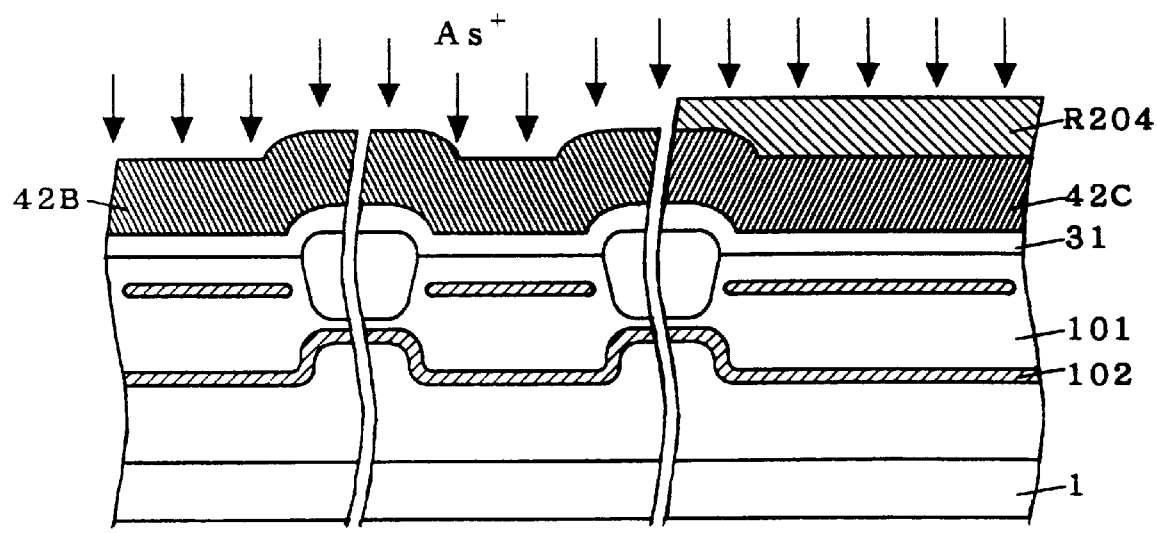

Next, at a step shown in FIG. 13, a resist mask R204 is formed on the memory cell array portion. An impurity is additionally implanted in a selective fashion into the doped polysilicon layer 42C of the sense amplifier portion and the peripheral circuit portion, thereby forming a doped polysilicon layer 42B which has an impurity concentration in accordance with the N-channel MOS transistor T42 of the peripheral circuit portion. The doped polysilicon layer 42B is formed by implanting arsenic ions, for instance, with the energy of 30 keV and at a dose of $2\times10^{15}/cm^2$.

Figure 14:
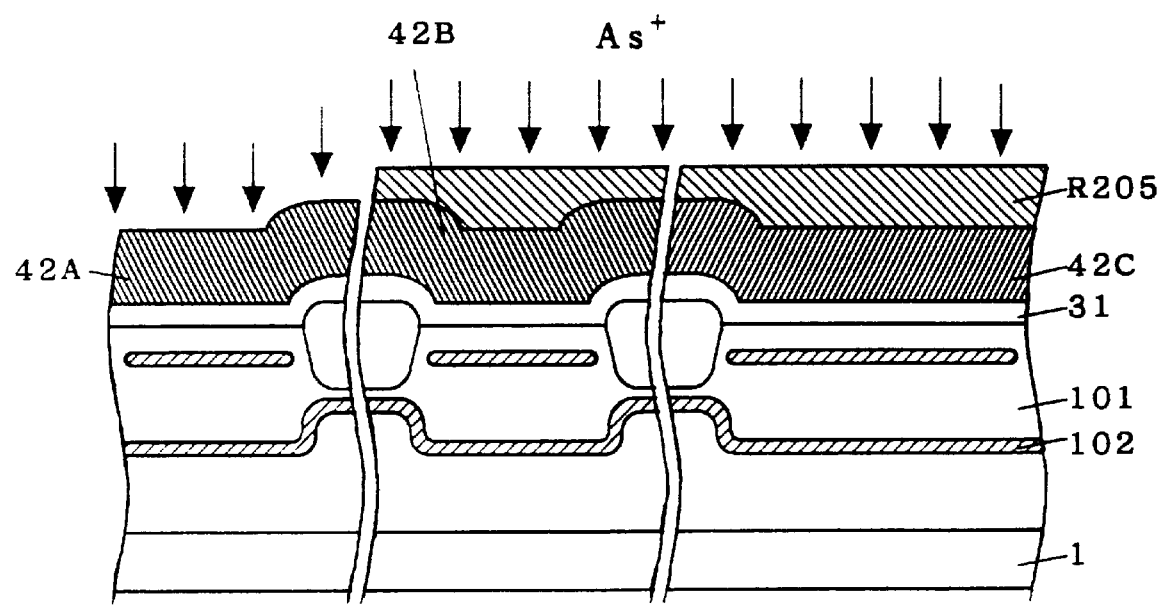

Next, after removing the resist mask R204, at a step shown in FIG. 14, a resist mask R205 is formed on the memory cell array portion and the peripheral circuit portion and an impurity is additionally implanted in a selective fashion into the doped polysilicon layer 42B of the sense amplifier portion, thereby forming a doped polysilicon layer 42A which has an impurity concentration in accordance with the N-channel MOS transistor T41 of the sense amplifier portion. The doped polysilicon layer 42A is formed by implanting arsenic ions, for instance, with the energy of 30 keV and at a dose of $2\times10^{15}/cm^2$.

Figure 15:
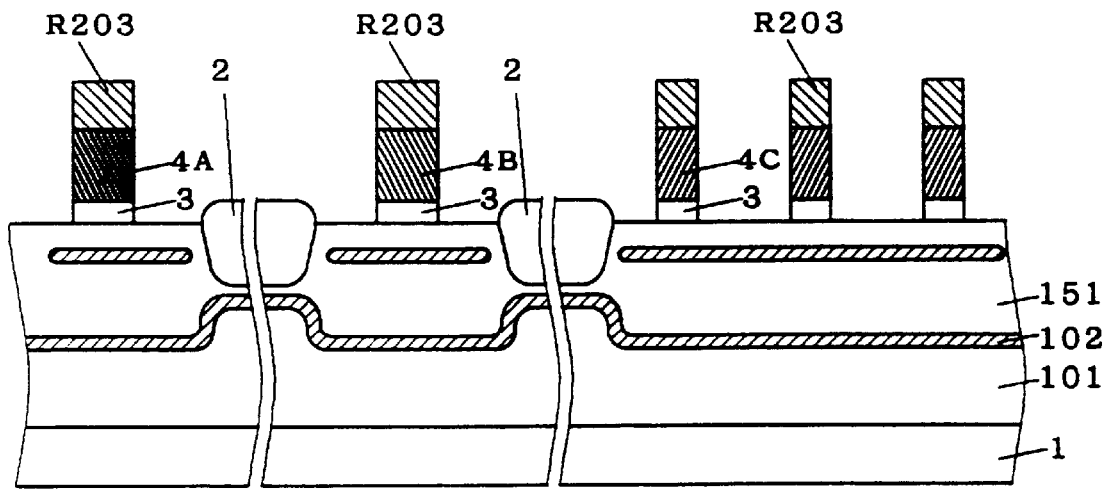

Next, at a step shown in FIG. 15, a resist mask R203 is formed on the doped polysilicon layers 42A to 42C and patterned so that the gate electrodes 4A to 4C and the gate oxide film 3 are formed.

Next, after forming the LDD layers 107 in the sense amplifier portion, the peripheral circuit portion and the memory cell array portion by ion implantation, the side wall oxide film 5 is formed on a side surface of the gate oxide film 3 and the gate electrodes 4A to 4C into a thickness of about 1,000 Å. Using the side wall oxide film 5 as a mask, by ion implantation, the source/drain layers 106 are formed. In this manner, the structure of the DRAM 100 which is shown in FIG. 7 is obtained.

The LDD layers 107 are obtained by injecting arsenic (As) ions, for instance, with the energy of 30 keV and at a dose of $1\times10^{13}/cm^2$. Meanwhile, the source/drain layers 106 are obtained by injecting arsenic ions, for instance, with the energy of 50 keV and at a dose of $5\times10^{15/cm2}$ and thereafter annealing at 850° C. for 60 minutes.

Although this is followed by formation of a capacitor, an inter-layer insulation film, a wiring layer and the like to form the DRAM, this will not be described nor is shown in the drawings.

<1-3. Characteristic Function And Effect>

As described above, the DRAM 100 according to the first preferred embodiment of the present invention has such a structure in which the impurity concentrations of the gate electrodes are changed among the plurality of types of transistors having different characteristics from each other (e.g., having different required specifications from each other) so that the effective thicknesses of the respective gate oxide films are changed and the threshold values are set. This eliminates the necessity of changing the impurity concentrations of the channel dope layers in accordance with the characteristics of the transistors, and therefore, it is possible to fix the concentrations at such values with which a leak current (i.e., diffusion layer leak) from a diffusion layer can be suppressed as small as possible.

Hence, by setting the impurity concentrations of the channel dope layers at such values with which a diffusion layer leak is as small as possible while setting threshold values by means of the impurity concentrations of the gate electrodes, it is possible to break the trade-off relationship between the threshold values and the diffusion layer leak and hence to eliminate a restriction imposed on circuit designing.

To change the impurity concentrations of the gate electrodes independently is less influential over the other structures than to change the impurity concentrations of the channel dope layers which are formed within the semiconductor substrate. That is, when ions are to be implanted into the semiconductor substrate, in particular, when implantation at a high dose is to be executed, this causes crystal deterioration of the semiconductor substrate. However, in the present invention, since ions are implanted into the gate electrodes which are located in the outer-most layer, this problem does not occur. It is only necessary to set an implantation range in such a manner that an impurity will not reach the gate oxide films.

Although the foregoing has described that the impurity concentrations of the channel dope layers 103A to 103C are the same, the impurity concentrations do not have to be the same with each other. For instance, when it is not possible to adjust the threshold values sufficiently only by changing the impurity concentrations of the gate electrodes, the threshold values may be adjusted by changing the impurity concentrations of the channel dope layers 103A to 103C. Since this is an auxiliary process, an increase in the impurity concentrations is small. This does not largely increase in the diffusion layer leak, nor allows ion implantation to cause crystal deterioration of the semiconductor substrate.

<1-4. Modifications>

The foregoing has described the manufacturing method of manufacturing the DRAM 100 according to the first preferred embodiment described with reference to FIGS. 10 to 15, in relation to an example where after forming the doped polysilicon layers 42A to 42C, at the step shown in FIG. 15, the gate electrodes 4A to 4C and the gate oxide film 3 are formed by patterning. However, the impurity may be implanted after the gate electrodes are formed by patterning.

In other words, after the polysilicon layer 42 is formed at the step shown in FIG. 15, a predetermined resist mask is formed on the polysilicon layer 42 and patterned so that the gate electrodes and the gate oxide film are formed. Following this, in accordance with the gate electrode of the N-channel MOS transistor T43 of the memory cell array portion, impurity ions are implanted into the polysilicon layer 42. Resist masks are thereafter formed sequentially on the gate electrodes of the memory cell array portion and the peripheral circuit portion and an impurity is additionally implanted, whereby the gate electrodes 4A to 4C are formed.

When such step is performed, an impurity is not implanted into the gate electrodes during etching which is executed for forming the gate electrodes, and therefore, it is easy to perform etching. That is, an etching rate changes depending on an impurity concentration within the polysilicon. When ion implantation is executed, in particular, an impurity distribution is created in the direction of the depth of the gate electrodes, which in turn changes the etching rate depending on the position. In this case, unless an etching speed is adjusted, due to differences in the etching rates, a problem such as an irregularity of an etching surface is created. However, at the step described above, since the non-doped polysilicon is etched, such a problem does not occur.

Further, when it is possible to combine a condition of implanting an impurity into the polysilicon layers (i.e., energy, dose) with a condition of implanting an impurity for forming the LDD layers, the LDD layers are created at the same time that the gate electrode of the N-channel MOS transistor of the memory cell array portion, which shortens the manufacturing process.

While the foregoing has described the structure in which various types of transistors are formed on a monocrystal substrate as the first preferred embodiment of the present invention, it is possible to achieve similar function and effect in the case where various types of transistors are formed on an SOI (silicon on insulator) substrate.

Second Preferred Embodiment

<2-1. Structure Of Device>

Figure 16:
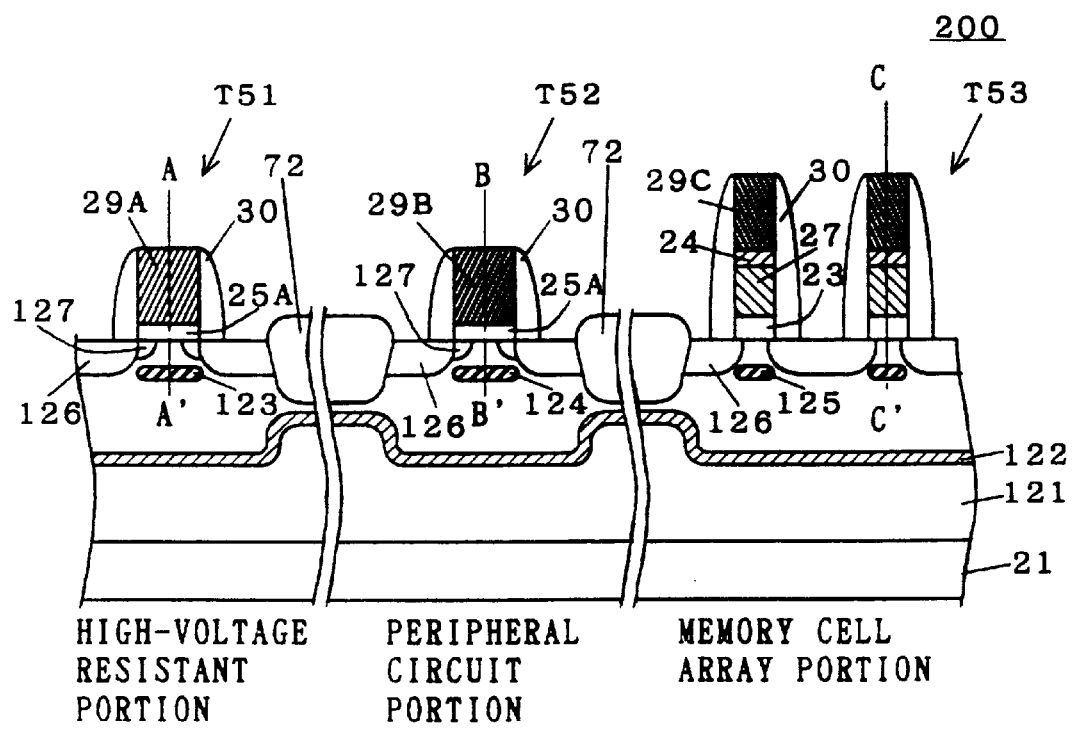
FIG. 16 is a cross sectional view showing a structure of a second preferred embodiment of the present invention.

FIG. 16 shows a partial structure of a flash memory 200 in which a plurality of types of transistors are formed, as a second preferred embodiment of the present invention. In general, a flash memory is different from a DRAM in using a high voltage, such as 10V, for writing and erasing. To this end, a flash memory comprises not only a memory cell array portion for storing data, but also a high-voltage resistant portion, such as an X decoder and a Y decoder, which is used after stepping up, a peripheral circuit portion (i.e., an address buffer, a row/column clock portion, an I/O pass portion, a data register portion, a sense amplifier portion, an operation control portion), and the like. Although any these portions are formed by transistors, due to differences between voltages used, a plurality of types of transistors which have different characteristics from each other are needed.

FIG. 16 shows cross sections of N-channel MOS transistors T51 to T53 which are used for the high-voltage resistant portion, the peripheral circuit portion, and the memory cell array portion.

The gate oxide film 25A is formed on the LDD layers 127, and a gate electrode 29B is formed on the gate oxide film 25A. The side wall oxide film 30 is formed on a side surface of the gate oxide film 25A and the gate electrode 29B. Within the well layer 121 under the gate electrode 291B, a channel dope layer 124 is formed.

The N-channel MOS transistor T53 of the memory cell array portion comprises a pair of source/drain layers 126 formed within the well layer 121 independently of each other but parallel to each other. A tunnel oxide film 23 is formed on edge portions of the source/drain layers 126. A floating gate electrode 27, an inter-layer insulation film (ONO film) 24 and a control gate electrode 29C are formed in this order on the tunnel oxide film 23.

Further, the side wall oxide film 30 is formed on a side surface of the tunnel oxide film 23, the floating gate electrode 27, the inter-layer insulation film 24 and the control gate electrode 29C.

In addition, a channel dope layer 125 is formed within the well layer 121 under the floating gate electrode 27. The memory cell array portion has a gate array structure in which adjacent gates share one source/drain layer 126. Such structures are arranged successively:

Table 6 shows figures regarding the structures of the N-channel MOS transistors T51 to T53.

TABLE 6

|  | HIGH-VOLTAGE RESISTANT PORTION (T51) | PERIPHERAL CIRCUIT PORTION (T52) | MEMORY CELL ARRAY PORTION (T53) |
|---|---|---|---|
| FIELD OXIDE FILM THICKNESS | 4000 Å | 4000 Å | 4000 Å |
| GATE OXIDE FILM THICKNESS | 80 Å | 80 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TEOS/Si_3N_4/TEOS = 100/100/100$ Å |
| CONTROL GATE ELECTRODE FILM THICKNESS | 2000 Å | 2000 Å | 2000 Å |
| SIDE WALL | 2000 Å | 2000 Å | 2000 Å |
| WELL | B 700 keV $1 \times 10^{13}/cm^2$ | B 700 keV $1 \times 10^{13}/cm^2$ | B 700 keV $1 \times 10^{13}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $5 \times 10^{12}/cm^2$ | B 50 keV $5 \times 10^{12}/cm^2$ | B 50 keV $5 \times 10^{12}/cm^2$ |
| LDD | As 30 keV $1 \times 10^{13}/cm^2$ | As 30 keV $1 \times 10^{13}/cm^2$ | — |
| SOURCE/DRAIN | As 50 keV $5 \times 10^{15}/cm^2$ | As 50 keV $5 \times 10^{15}/cm^2$ | As 50 keV $5 \times 10^{15}/cm^2$ |
| GATE IMPLANTATION | As 30 keV $5 \times 10^{14}/cm^2$ | As 30 keV $5 \times 10^{15}/cm^2$ | As 30 keV $1 \times 10^{15}/cm^2$ |
| THERMAL POROCESSING | | 850° C. 60 min | |

In FIG. 16, the N-channel MOS transistors T51 to T53 formed within a P-type well layer 121 which is formed on the same semiconductor substrate 21 (of the P-type). The well layer 121 is element-separated by a channel cut layer 122 and a LOCOS layer 22 in such a manner that the N-channel MOS transistors T51 to T53 are formed in regions which are created by element separation.

The N-channel MOS transistor T51 of the high-voltage resistant portion comprises a pair of source/drain layers 126 formed within the well layer 121 independently of each other but parallel to each other and a pair of LDD layers 127 formed adjacent to edge portions facing each other of the source/drain layers 126.

The gate oxide film 25A is formed on the LDD layers 127, and a gate electrode 29A is formed on the gate oxide film 25A. A side wall oxide film 30 is formed on a side surface of the gate oxide film 25A and the gate electrode 29A. Within the well layer 121 under the gate electrode 29A, a channel dope layer 123 is formed.

The N-channel MOS transistor T52 of the peripheral circuit portion comprises a pair of source/drain layers 126 formed within the well layer 121 independently of each other but parallel to each other and a pair of LDD layers 127.

In Table 6, the flash memory 200 is characteristic in that the gate electrode 29A of the N-channel MOS transistor T51 of the high-voltage resistant portion has the lowest impurity concentration, and the impurity concentration of the gate electrode 29C of the N-channel MOS transistor T53 of the memory cell array portion and the impurity concentration of the gate electrode 29B of the N-channel MOS transistor T52 of the peripheral circuit portion are higher in this order.

Figure 17:
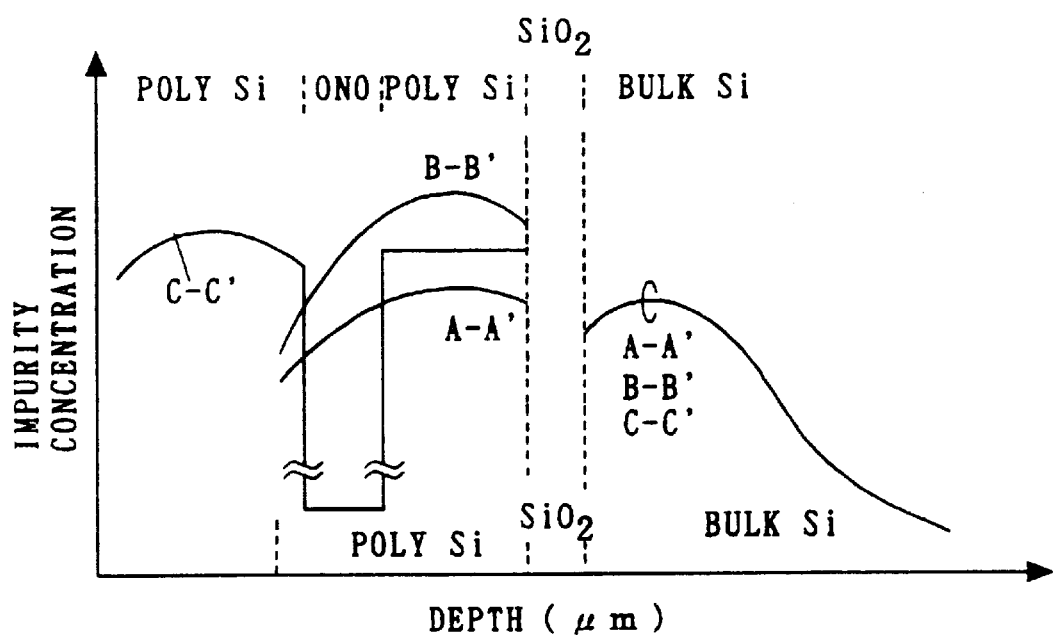
FIG. 17 is a diagram for describing a distribution of an impurity according to the second preferred embodiment of the present invention.

FIG. 17 shows impurity profiles of the N-channel MOS transistors T51, T52 and T53 forming the high-voltage resistant portion, the peripheral circuit portion and the memory cell array portion, all of which shown in FIG. 16, taken at cross sectional portions along A–A' line, B–B' line and C–C' line, respectively.

In FIG. 17, a position (i.e., depth) in a cross sectional direction is shown along a horizontal axis and an impurity concentration is shown along a vertical axis. The order in which the structure of the N-channel MOS transistor T53 of the memory cell array portion is fabricated is illustrated in an upper portion of FIG. 17, while the order in which the other structures are fabricated is illustrated along the horizontal axis.

The upper portion of FIG. 17 shows the control gate electrode (polysilicon layer), the inter-layer insulation film (ONO film), the floating gate electrode (polysilicon layer), the tunnel oxide film ($SiO_2$ layer) and the well layer (bulk silicon layer) in this order from the left-hand side.

Further, FIG. 17 shows the gate electrode (polysilicon layer), the gate oxide film (SiO, layer) and the well layer (bulk silicon layer) in this order along the horizontal axis.

In FIG. 17, as indicated at the B–B' line, the impurity concentration of the gate electrode in the peripheral circuit portion is the highest, and the impurity concentration of the gate electrode in the high-voltage resistant portion indicated at the A–A' line is the lowest.

Hence, in the high-voltage resistant portion, the depletion layer is the largest at the control gate electrode so that the effective thickness of the oxide film is thickest and the high-voltage resistant portion can withstand a high voltage.

Figure 18:
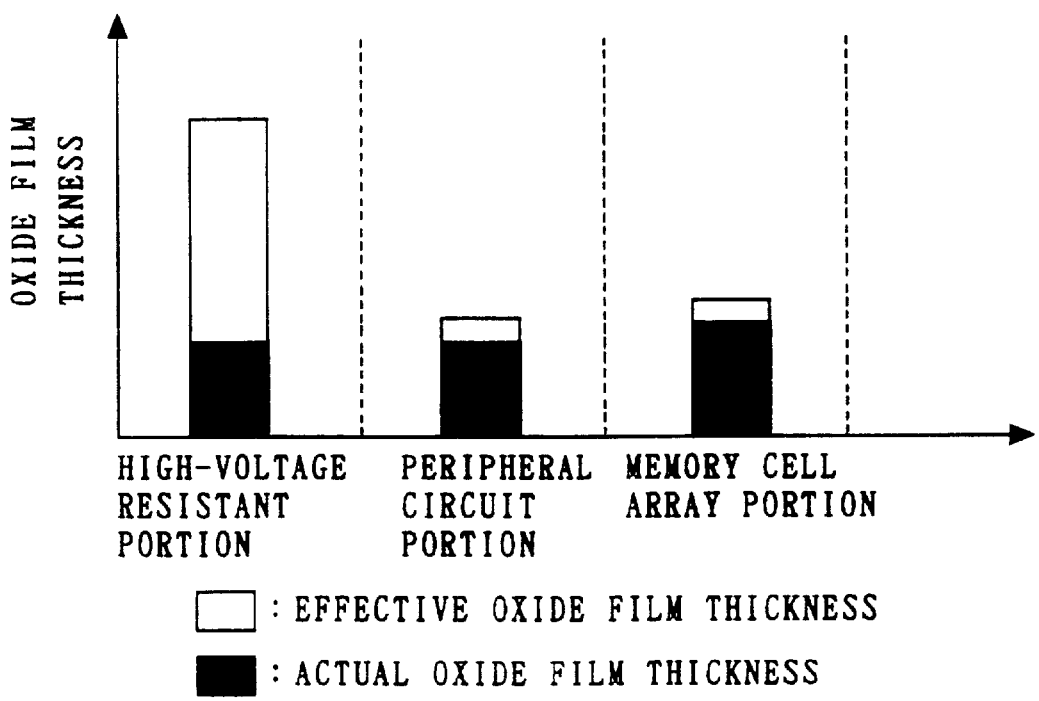
FIG. 18 is a diagram for describing a thickness of a gate oxide silm in the second preferred embodiment of the present invention.

FIG. 18 shows actual thicknesses and effective thicknesses of the respective gate oxide films. FIG. 18 shows the N-channel MOS transistors of the high-voltage resistant portion, the peripheral circuit portion and the memory cell array portion in this order from the left-hand side along the horizontal axis. In the memory cell array portion, the tunnel oxide film is treated as the gate oxide film. As clearly shown in FIG. 18, among the effective thicknesses of the respective gate oxide films, the effective thickness is particularly thick in the high-voltage resistant portion.

Further, as shown in FIG. 17, in any one of the transistors of the high-voltage resistant portion (A–A' line), the peripheral circuit portion (B–B' line) and the memory cell array portion (C–C' line), the impurity concentration of the channel dope layer stays the same.

Since the floating gate electrode of the N-channel MOS transistor T53 of the memory cell array portion is formed by a CVD method, the impurity concentration remains constant.

<2-2. Manufacturing Method>

In the following, a description will be given on a method of manufacturing the N-channel MOS transistors T51, T52 and T53 of the high-voltage resistant portion, the peripheral circuit portion and the memory cell array portion, all of which shown in FIG. 16, with reference to FIGS. 19 to 32.

Figure 19:
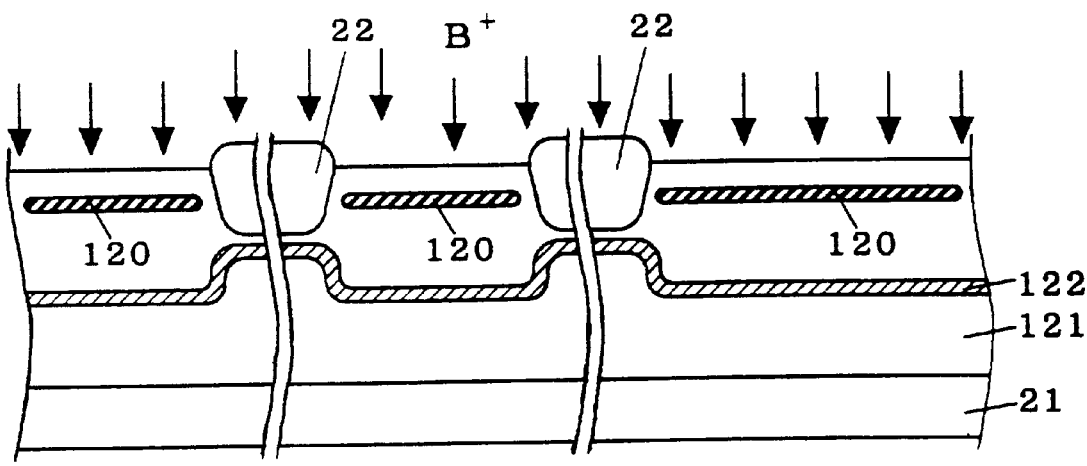
FIGS. 19 to 32 are diagrams showing manufacturing steps according to the second preferred embodiment of the present invention.

First, at a step shown in FIG. 19, a LOCOS layer (i.e., field oxide film) 22 is formed into a thickness of 4,000 Å, for instance, by a LOCOS method on a surface of the semiconductor substrate 21 of the P-type. Following this, boron ions, for instance, are implanted with the energy of 700 keV and at a dose of $1 \times 10^{13}/cm^2$, thereby forming a P-type well region 121 within the semiconductor substrate 21. Although an N-type well region as well is formed in the semiconductor substrate 21 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 122 within the semiconductor substrate 21. The channel cut layer 122 is formed in such a shape which together with the LOCOS layer 22 creates the element-separated regions.

Next, at a predetermined position in the high-voltage resistant portion, the peripheral circuit portion and the memory cell array portion within the well region 121, a channel dope layer 120. The channel dope layer 120 is formed by implanting boron ions, for instance, with the energy of 50 keV and at a dose of $5 \times 10^{12}/cm^2$.

Figure 20:
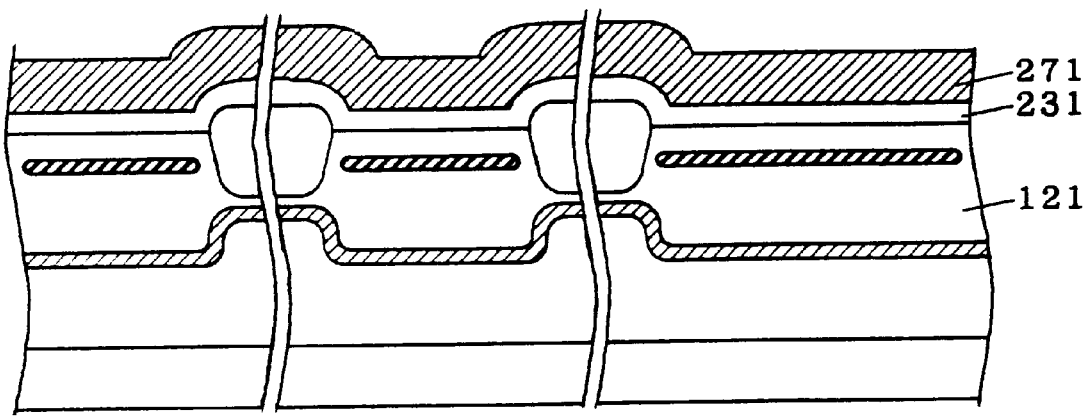

Next, at a step shown in FIG. 20, after forming an oxide film 231 which will become the tunnel oxide film 23 on a main surface of the semiconductor substrate 21 by a thermal oxide method, a doped polysilicon layer 271, for instance, is formed as a gate electrode material on the oxide film 231 by a CVD method. The oxide film 231 has a thickness of about 100 Å, whereas the doped polysilicon layer 271 has a thickness of about 1,000 Å. Phosphorus (P) is used as an impurity. The concentration of the impurity is about $1 \times 10^{20}/cm^2$.

Figure 21:
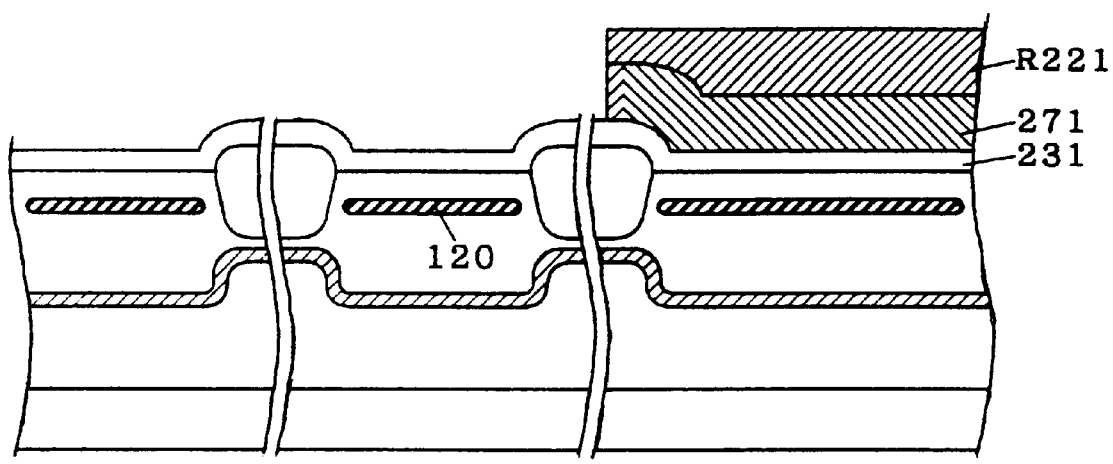
Figure 22:
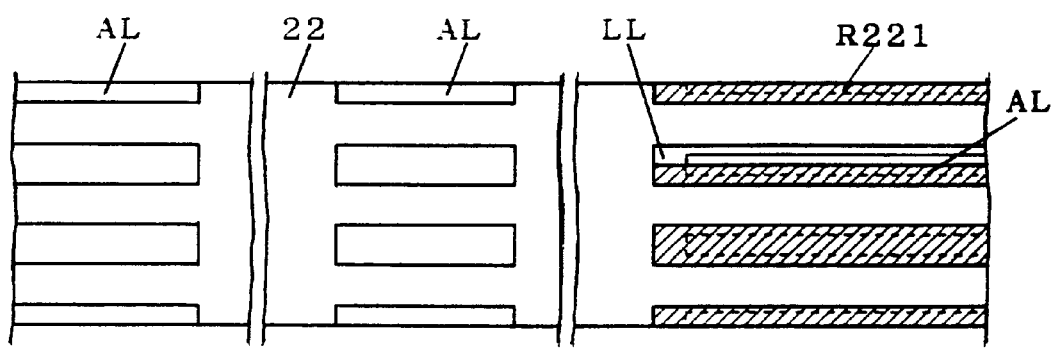

Next, at a step shown in FIG. 21, a resist mask R221 is formed selectively on the doped polysilicon layer 271 within the memory cell array portion. In this case, the resist mask R221 is formed along the gate-width direction of the memory cell array portion. A portion of the doped polysilicon layer 271 which is not covered with the resist mask R221 is removed by anisotropic etching. FIG. 22 shows this condition.

FIG. 22 is a plan view viewing FIG. 21 from the upper surface side (i.e., the side on which the resist mask R221 is formed). Within the memory cell array portion, the resist mask R221 is formed as rectangle islands which are arranged regularly. The resist mask R221 is formed to cover an active layer AL which has a configuration like a rectangle island and an LOCOS layer LL around the same. Within the high-voltage resistant portion and the peripheral circuit portion, since the resist mask is not formed, the active layer AL is exposed.

Figure 23:
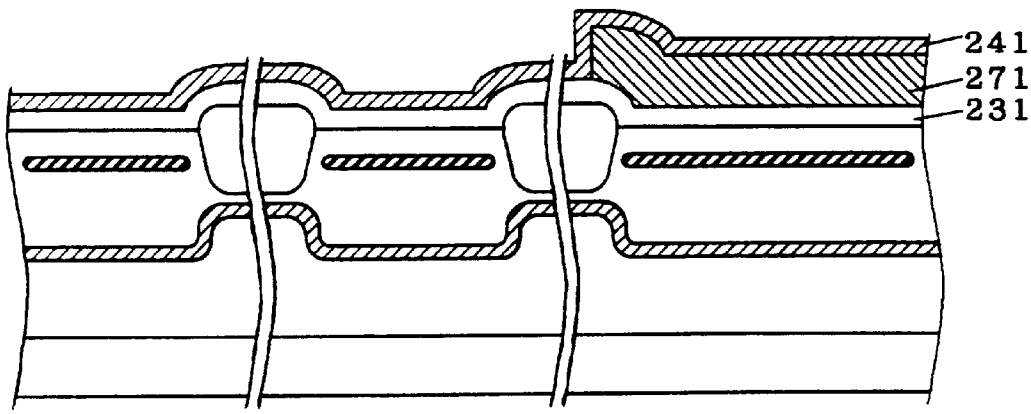

Next, after removing the resist mask R221, at a step shown in FIG. 23, an insulation film 241, which will become the inter-layer insulation film 24 which insulates the floating gate from the control gate, is formed on the doped polysilicon layer 271 by a CVD method. The inter-layer insulation film 24 is referred to as "ONO film" in some cases. The insulation film 241 is formed on the high-voltage resistant portion and the peripheral circuit portion as well. This film has a structure in which a TEOS (tetraethyl orthosilicate) film, a nitride film ($Si_3N_4$) film, a TEOS film each having a thickness of 100 Å are stacked in this order.

Figure 24:
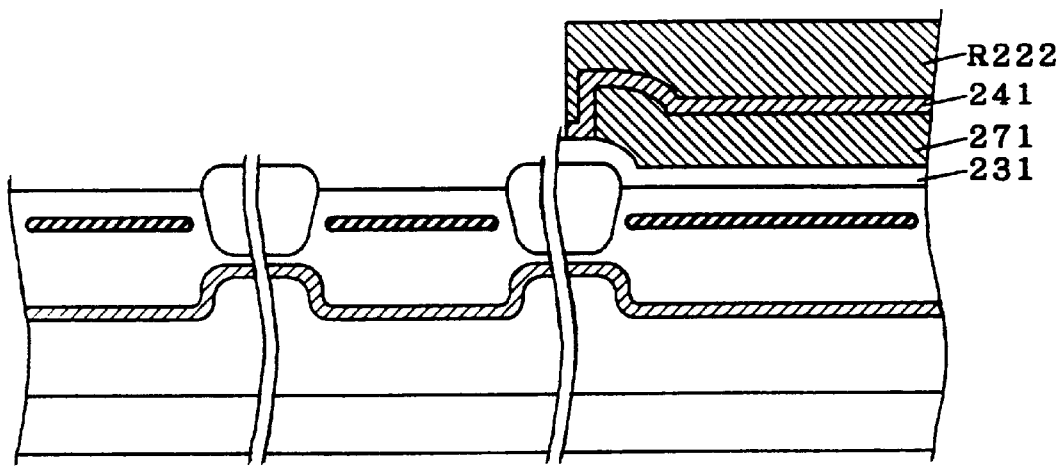
Figure 25:
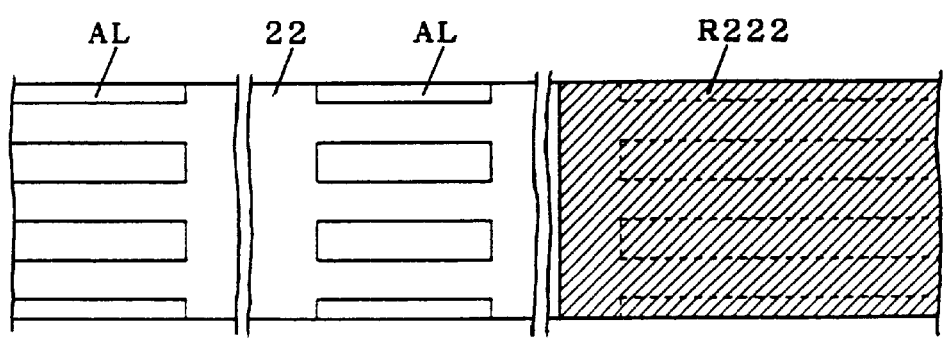

Next, at a step shown in FIG. 24, a resist mask R222 is formed on the insulation film 241 of the memory cell array portion, and the insulation film 241 in all other regions is removed. In this case, in the other regions, ths oxide film 231 is removed as well. FIG. 25 shows this condition.

FIG. 25 is a plan view viewing FIG. 24 from the upper surface side (i.e., the side on which the resist mask R222 is formed). The resist mask P222 is formed to entirely cover the memory cell array portion. However, within the high-voltage resistant portion and the peripheral circuit portion, since the resist mask R222 is not formed, the active layer AL is exposed.

Figure 26:
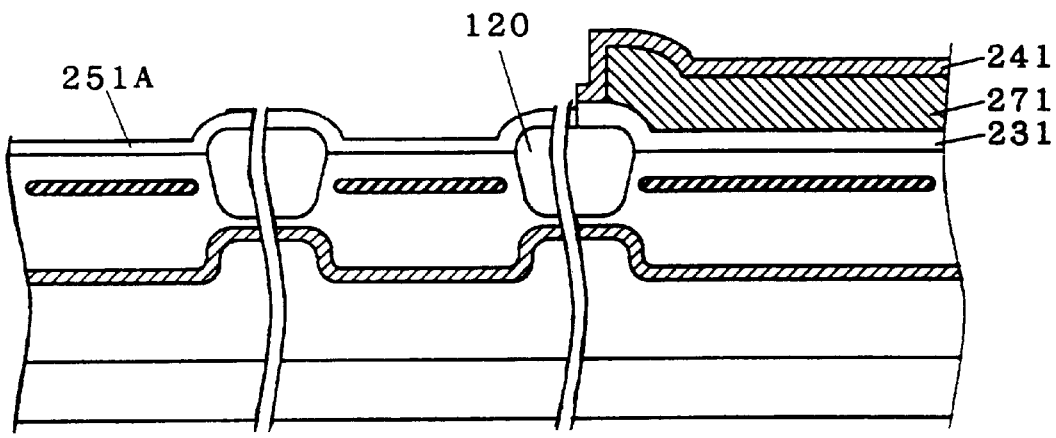

Next, after removing the resist mask R222, at a step shown in FIG. 26, an oxide film 251A which will become the gate oxide film 25A is formed entirely on the main surface of the semiconductor substrate 21 by a thermal oxide method. At this stage, since the insulation film 241 on the memory cell array portion includes the nitride film, the insulation film 241 is not oxidized and the thickness of the insulation film 241 is maintained. The thickness of the oxide film 251A is about 80 Å.

Figure 27:
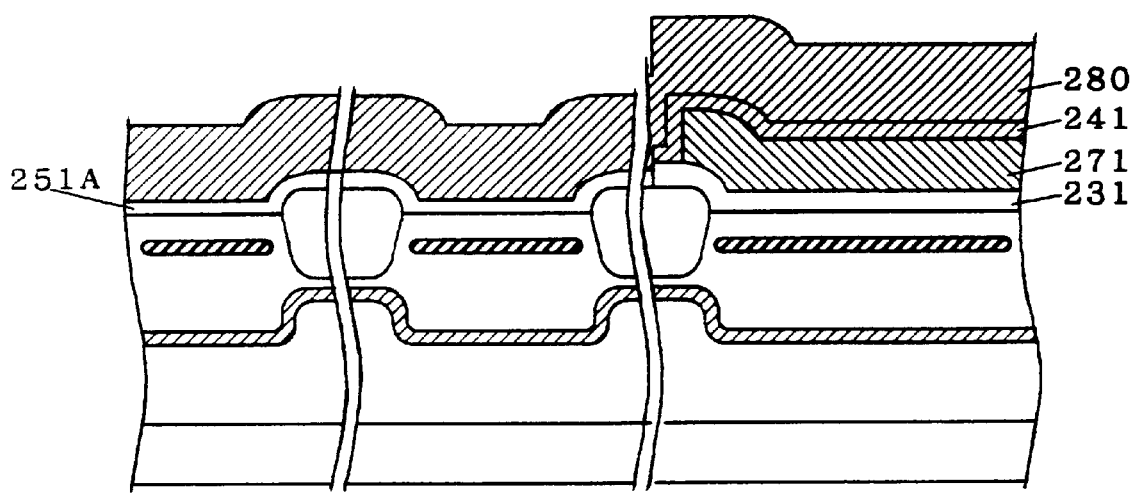

Next, at a step shown in FIG. 27, a (nonsdoped) polysilicon layer 280 is formed entirely on a main surface of the semiconductor substrate 21 as a gate electrode material by a CVD method. The polysilicon layer 280 has a thickness of about 2,000 Å.

Figure 28:
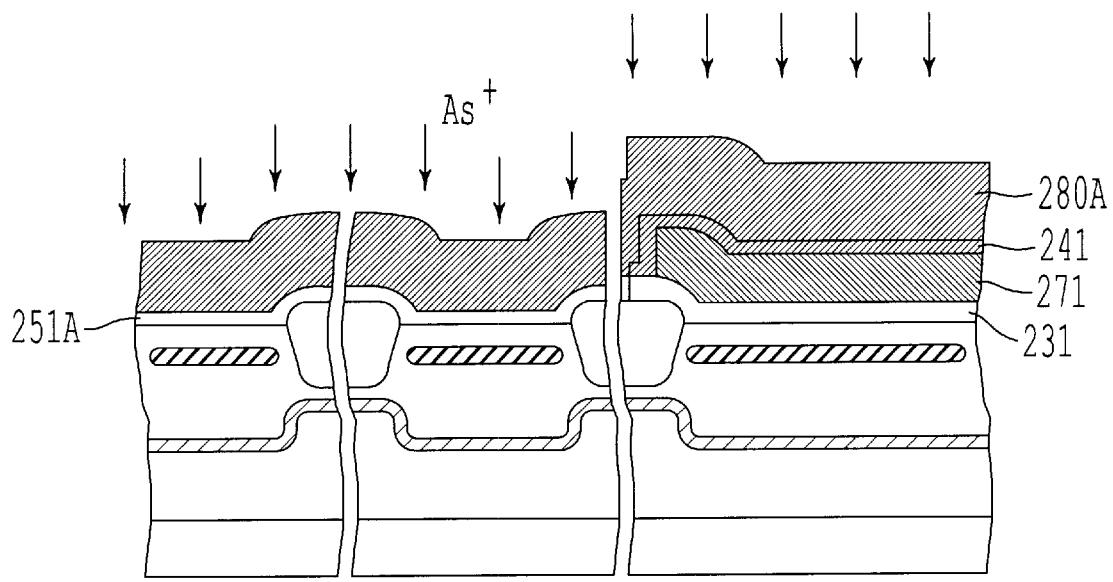

Next, at a step shown in FIG. 28, impurity ions are implanted into the polysilicon layer 280 in accordance with the gate electrode of the N-channel MOS transistor T51, which has the lowest impurity concentration, of the high-voltage resistant portion, thereby forming a doped polysilicon layer 280A. At this stage, the doped polysilicon layer 280A is formed also in the peripheral circuit portion and the memory cell array portion. The doped polysilicon layer 280A is formed by implanting arsenic ions, for instance, with the energy of 30 keV and at a dose of $5 \times 10^{14}/\text{cm}^2$.

Figure 29:
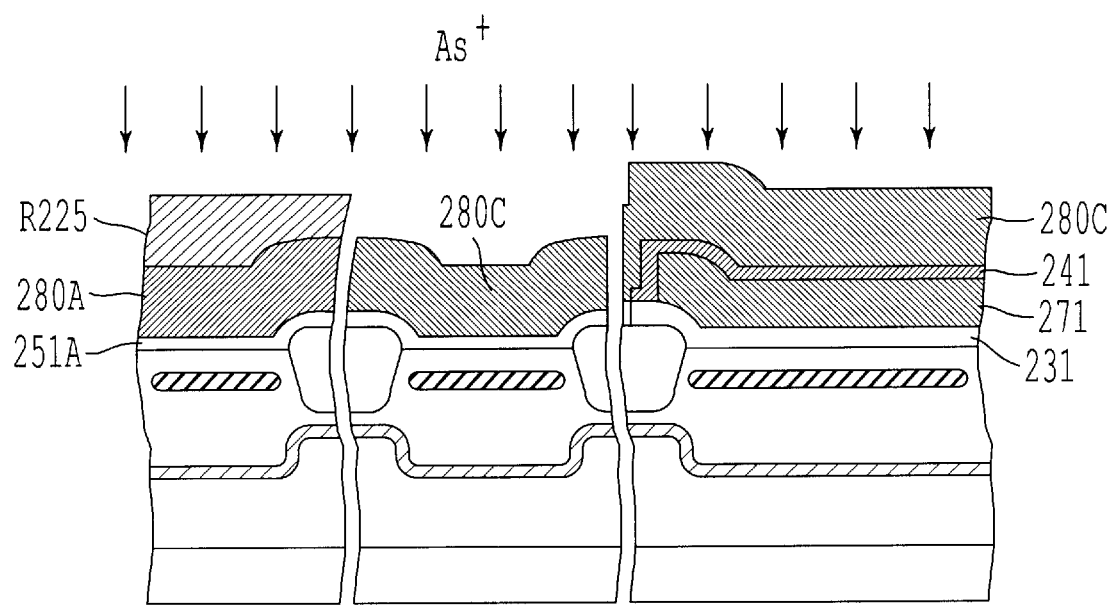

Next, at a step shown in FIG. 29, a resist mask R225 is formed on the high-voltage resistant portion. An impurity is additionally implanted in a selective fashion into the doped polysilicon layer 280A of the peripheral circuit portion and the memory cell array portion, thereby forming a doped polysilicon layer 280C which has an impurity concentration in accordance with the N-channel MOS transistor T53 of the memory cell array portion. The doped polysilicon layer 280C is formed by implanting arsenic ions, for instance, with the energy of 30 keV and at a dose of $5 \times 10^{14}/\text{cm}^2$.

Figure 30:
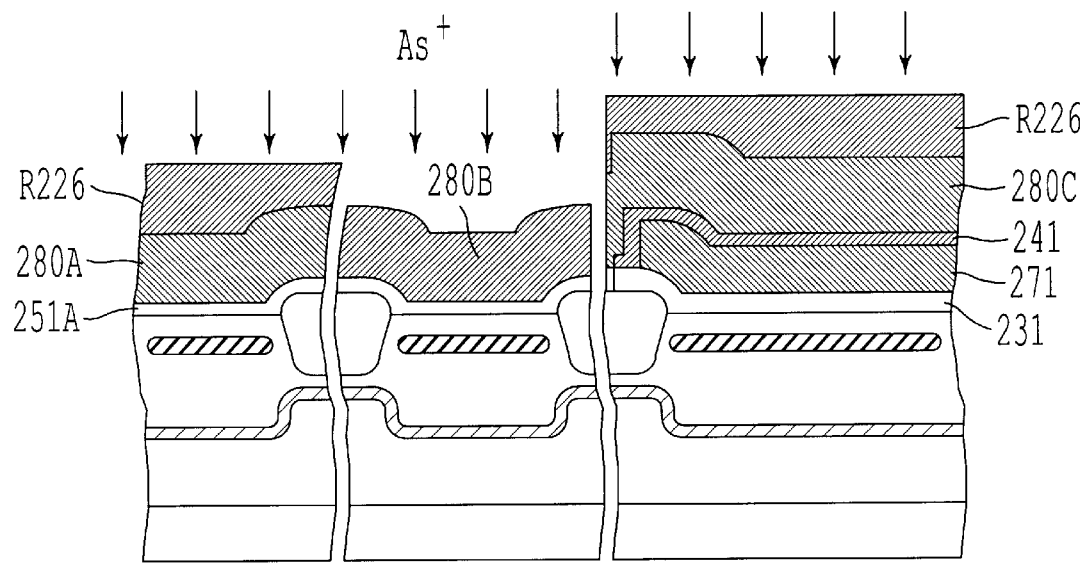

Next, after removing the resist mask R225, at a step shown in FIG. 30, a resist mask R226 is formed on the memory cell array portion and the high-voltage resistant portion and an impurity is additionally implanted in a selective fashion into the doped polysilicon layer 280C of the peripheral circuit portion, thereby forming a doped polysilicon layer 280B which has an impurity concentration in accordance with the N-channel MOS transistor T52 of the peripheral circuit portion. The doped polysilicon layer 280B is formed by implanting arsenic ions, for instance, with the energy of 30 keV and at a dose of $4 \times 10^{15}/\text{cm}^2$.

Figure 31:
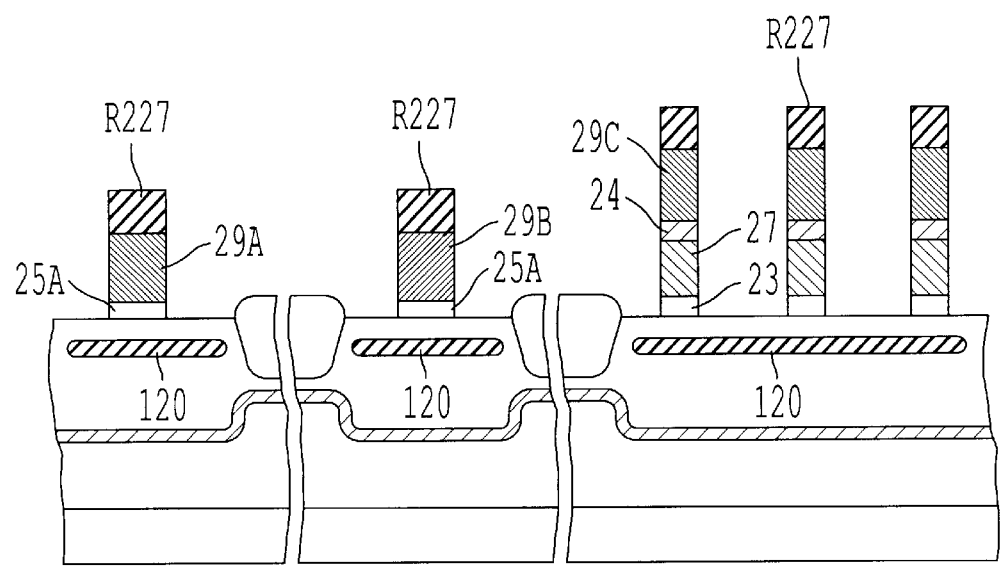
Figure 32:
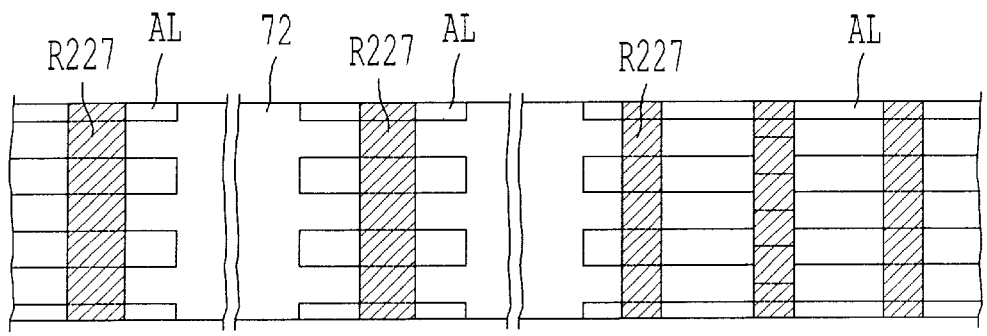

Next, at a step shown in FIG. 31, after removing the resist mask R226, a resist mask R227 is formed on the doped polysilicon layers 280A to 280C and patterned. FIG. 32 shows this condition.

FIG. 32 is a plan view viewing FIG. 31 from the upper surface side (i.e., the side on which the resist mask R227 is formed). The resist mask R227 is formed to be perpendicular to the active layer AL which has a rectangular configuration.

As a result of patterning, the gate oxide film 25A and gate electrode 29A are formed within the high-voltage resistant portion, the gate oxide film 25A and gate electrode 29B are formed within the peripheral circuit portion, and the tunnel oxide film 23, the floating gate electrode 27, the inter-layer insulation film 24 and the control gate electrode 29C are formed within the memory cell array portion.

Following this, after forming the LDD layers 127 by implanting ions into the high-voltage resistant portion and the peripheral circuit portion, the side wall oxide film 30 of about 1,000 Å in thickness is formed on a side surface of the gate oxide film 25A and gate electrode 29A, on a side surface of the gate oxide film 25A and gate electrode 29B, and on a side surface of the tunnel oxide film 23, the floating gate electrode 27, the inter-layer insulation film 24 and the control gate electrode 29C. Using the side wall oxide film 30 as a mask, by ion implantation, the source/drain layers 126 are formed. In this manner, the structure of the flash memory which is shown in FIG. 16 is obtained.

Now, the LDD layers 127 are obtained by implanting arsenic ions, for instance, with the energy of 30 keV and at a dose of $1 \times 10^{13}/\text{cm}^2$. Meanwhile, the source/drain layers 126 are obtained by injecting arsenic ions, for instance, with the energy of 50 keV and at a dose of $5 \times 10^{15}/\text{cm}^2$ and thereafter annealing at 850° C. for 60 minutes.

Although this is followed by formation of a capacitor, an inter-layer insulation film, a wiring layer and the like to form the flash memory, this will not be described nor is shown in the drawings.

<2-3. Characteristic Function And Effect>

As described above, the flash memory 200 according to the second preferred embodiment of the present invention has such a structure in which the impurity concentrations of the gate electrodes are changed among the plurality of types of transistors having different characteristics from each other (e.g., having different required specifications from each other) so that the effective thicknesses of the respective gate oxide films are changed. Hence, it is not necessary to form the gate oxide films which have different breakdown voltages from each other to have different thicknesses from each other.

Further, since it is possible to set the threshold values by changing the effective thicknesses of the gate oxide films, it is not necessary to change the impurity concentrations of the channel dope layers in accordance with the characteristics of the transistors, and therefore, it is possible to fix the concentrations at such values with which a leak current (i.e., diffusion layer leak) from a diffusion layer can be suppressed as small as possible.

Hence, by setting the impurity concentrations of the channel dope layers at such values with which a diffusion layer leak is as small as possible while adjusting the breakdown voltage characteristics and the threshold values by means of the impurity concentrations of the gate electrodes, it is possible to satisfy the requirements regarding the breakdown voltages, to break the trade-off relationship between the threshold values and the diffusion layer leak, and hence, to eliminate a restriction imposed on circuit designing.

Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

That is, in the structure shown in FIG. 16, since the thicknesses of the gate oxide films of the transistors of the high-voltage resistant portion and the peripheral circuit portion are the same with each other, there two types of the gate oxide films. Further, with respect to the steps for forming the oxide films, there are only the step for forming the oxide film 231 (See FIG. 23) and the step for forming the oxide film 251A (See FIG. 26). Since the oxide films are formed by carrying out thermal oxidation once at either steps, unlike in the conventional manufacturing method described with reference to FIGS. 78 to 91, it is not necessary to form one oxide film at more than one stages and there is no concern that an impurity may be mixed in or the controllability of controlling film thickness may deteriorate.

While the foregoing has described the structure in which various types of transistors are formed on a monocrystal substrate as the second preferred embodiment of the present invention, it is possible to achieve similar function and effect in the case where various types of transistors are formed on an SOI (silicon on insulator) substrate.

Third Preferred Embodiment

<3-1. Structure Of Device>

Figure 33:
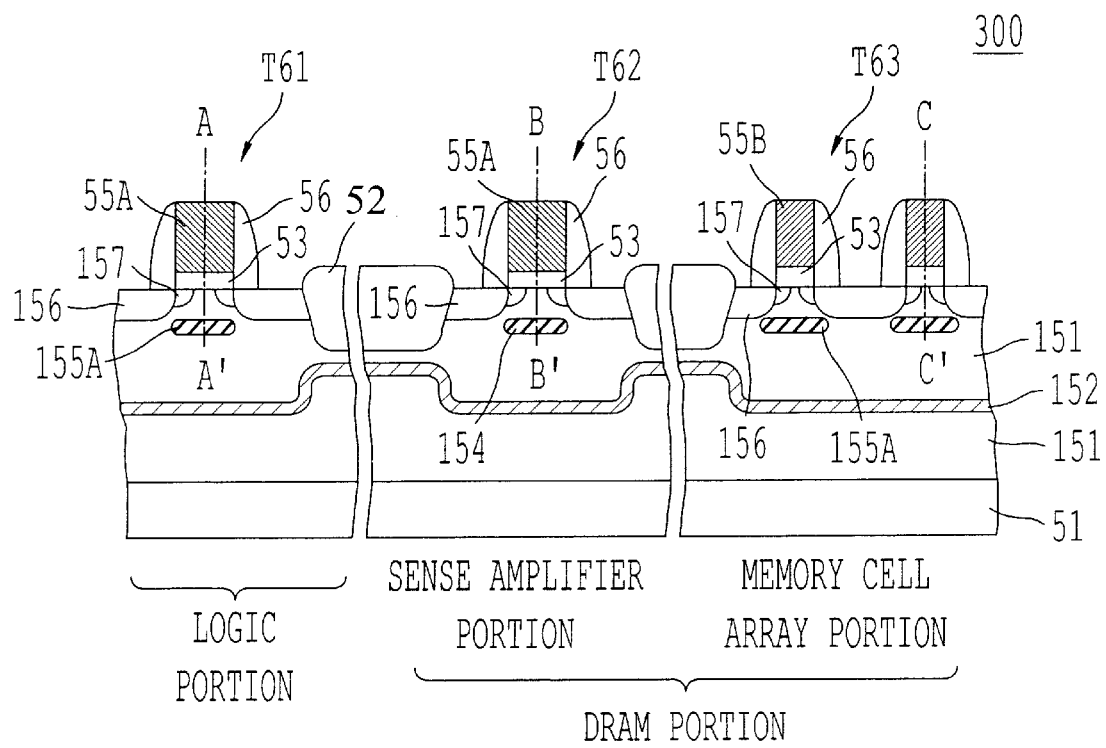
FIG. 33 is a cross sectional view showing a structure of a third preferred embodiment of the present invention.

FIG. 33 shows a partial structure of a DRAM which comprises a logic circuit (hereinafter "LOGIC in DRAM") 300, as a third preferred embodiment of the present invention.

A LOGIC in DRAM is a device which executes a high performance and requires only a low cost, since a logic circuit is formed within the same chip so that the DRAM and the logic circuit, which have been heretofore formed as separate chips, are combined with each other.

In general, a LOGIC in DRAM is roughly divided into a logic portion and a DRAM portion. A requirement to the logic portion is an operation at a high speed, that is, a high driving capability and a low capacity. Meanwhile, as described earlier in relation to the first preferred embodiment, the DRAM portion includes a memory cell array portion in which a low leak current is demanded, a sense amplifier portion in which an operation at a low voltage is demanded, etc. That is, a plurality of types of transistors which have different characteristics from each other are needed within a LOGIC in DRAM which is formed as one chip.

FIG. 33 shows cross sections of N-channel MOS transistors T61 to T63 which are used for the logic portion, the sense amplifier portion and the memory cell array portion.

In FIG. 33, the N-channel MOS transistors T61 to T63 are formed within a P-type well layer 151 which is formed on the same semiconductor substrate 51 (of the P-type). The well layer 151 is element-separated by a channel cut layer 152, which is formed within the well layer 151, and a LOCOS layer 52 in such a manner that the N-channel MOS transistors T61 to T63 are formed in regions which are created by element separation.

The N-channel MOS transistor T61 of the logic portion comprises a pair of source/drain layers 156 formed within the well layer 151 independently of each other but parallel to each other and a pair of LDD layers 157 formed adjacent to edge portions facing each other of the source/drain layers 156.

A gate oxide film 53 is formed on the LDD layers 157, and a gate electrode 55A is formed on the gate oxide film 53. A side wall oxide film 56 is formed on a side surface of the gate oxide film 53 and the gate electrode 55A. Within the well layer 151 under the gate electrode 55A, a channel dope layer 155A is formed.

The N-channel MOS transistor T62 of the sense amplifier portion comprises a pair of source/drain layers 156 formed within the well layer 151 independently of each other but parallel to each other and a pair of LDD layers 157.

The gate oxide film 53 is formed on the LDD layers 157, and a gate electrode 55A is formed on the gate oxide film 53. The side wall oxide film 56 is formed on a side surface of the gate oxide film 53 and the gate electrode 55A. Within the well layer 151 under the gate electrode 55A, a channel dope layer 154 is formed.

The N-channel MOS transistor T63 of the memory cell array portion comprises a pair of source/drain layers 156 formed within the well layer 151 independently of each other but parallel to each other and a pair of LDD layers 157.

The gate oxide film 53 is formed on the source/drain layers 156 and the LDD layers 157, and the gate electrode 55B is formed on the gate oxide film 53. The side wall oxide film 56 is formed on a side surface of the gate oxide film 53 and the gate electrode 55B. Within the well layer 151 under the gate electrode 55B, a channel dope layer 155A is formed. The memory cell array portion has a gate array structure in which adjacent gates share one source/drain layer 156. Such structures are arranged successively.

Table 7 shows figures regarding the structures of the N-channel MOS transistors T61 to T63.

TABLE 7

|  | LOGIC PORTION (T61) | SENSE AMPLIFIER PORTION (T62) | MEMORY CELL ARRAY PORTION (T63) |
|---|---|---|---|
| FIELD OXIDE FILM THICKNESS | 4000 Å | 4000 Å | 4000 Å |
| GATE OXIDE FILM THICKNESS | 60 Å | 60 Å | 60 Å |
| GATE ELECTRODE FILM THICKNESS | 2000 Å | 2000 Å | 2000 Å |
| SIDE WALL | 1000 Å | 1000 Å | 1000 Å |
| WELL | B 700 keV $1 \times 10^{15}/cm^2$ | B 700 keV $1 \times 10^{15}/cm^2$ | B 700 keV $1 \times 10^{15}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $5 \times 10^{12}/cm^2$ | B 50 keV $1 \times 10^{12}/cm^2$ | B 50 keV $5 \times 10^{12}/cm^2$ |
| LDD | As 30 keV $1 \times 10^{13}/cm^2$ | As 30 keV $1 \times 10^{13}/cm^2$ | As 30 keV $1 \times 10^{13}/cm^2$ |
| SOURCE/DRAIN | As 50 keV $5 \times 10^{15}/cm^2$ | As 50 keV $5 \times 10^{15}/cm^2$ | As 50 keV $5 \times 10^{15}/cm^2$ |
| GATE IMPLANTATION | As 30 keV $5 \times 10^{15}/cm^2$ | As 30 keV $5 \times 10^{15}/cm^2$ | As 30 keV $1 \times 10^{15}/cm^2$ |
| THERMAL POROCESSING |  | 850° C. 60 min |  |

In Table 7, impurity dose for forming the channel dope layers of the N-channel MOS transistors T61, T62 and T63 are $5 \times 10^{12}/cm^2$, $1 \times 10^{12}/cm^2$ and $5 \times 10^{12}/cm^2$, respectively. Boron (B) is implanted as an impurity for either layers with the implantation energy of 50 keV.

Further, the thicknesses of the gate oxide films of the N-channel MOS transistors T61 to T63 are 60 Å.

Meanwhile, impurity dose for forming the gate electrodes of the N-channel MOS transistors T61, T62 and T63 are $5 \times 10^{15}/cm^2$, $5 \times 10^{15}/cm^2$ and $1 \times 10^{15}/cm^2$, respectively. Arsenic (As) is implanted as an impurity for either layers with the implantation energy of 30 keV.

Figure 34:
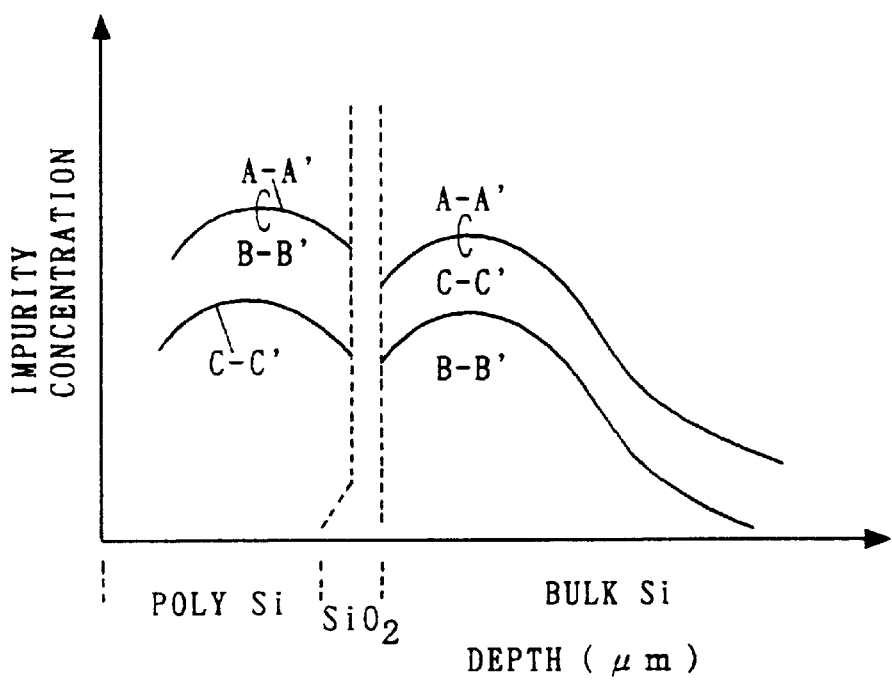
FIG. 34 is a diagram for describing a distribution of an impurity according to the third preferred embodiment of the present invention.

FIG. 34 shows impurity profiles of the N-channel MOS transistors T61, T62 and T63 of the logic portion, the sense amplifier portion and the memory cell array portion, all of which shown in FIG. 33, taken at cross sectional portions along A–A' line, B–B' line and C–C' line, respectively.

In FIG. 34, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 7, the impurity concentrations in the gate electrodes are the same with each other between the transistors T61 and T62, and therefore, the A–A' line and the B–B' line are one atop the other. Since the impurity concentrations in the channel dope layers within the well layer are the same with each other between the transistors T61 and T63, the A–A' line and the C–C' line are one atop the other. In the transistor of the sense amplifier portion which requires a low threshold value, a channel dose is small and the impurity concentration at an interface between the oxide film and the bulk is low.

Figure 35:
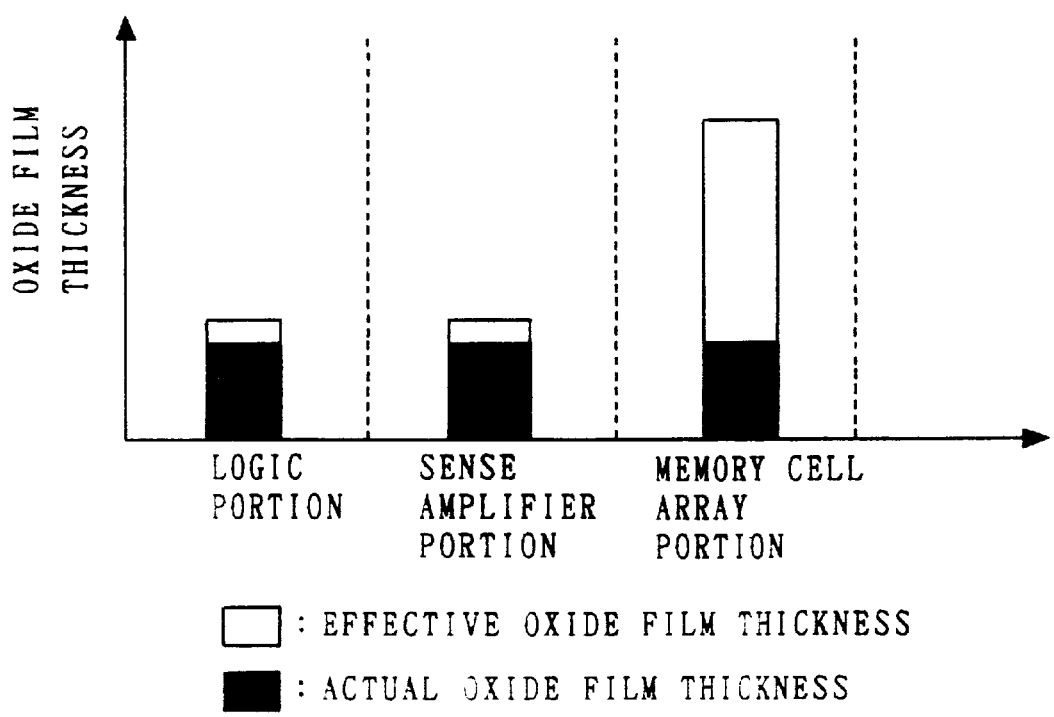
FIG. 35 is a diagram for describing a thickness of a gate oxide film in the third preferred embodiment of the present invention.

FIG. 35 shows the actual thicknesses and the effective thicknesses of the respective gate oxide films. In FIG. 35, the N-channel MOS transistors of the logic portion, the sense amplifier portion and the memory cell array portion are shown in this order along the horizontal axis from the left-hand side. As shown in FIG. 35, although the actual thicknesses of the transistors are the same with each other, among the effective thicknesses of the transistors, the effective thickness is particularly thick in the memory cell array portion.

<3-2. Manufacturing Method>

In the following, a description will be given on a method of manufacturing the N-channel MOS transistors T61, T62 and T63 of the logic portion, and of the sense amplifier portion and the memory cell array portion of the flash memory portion, which are shown in FIG. 33, with reference to FIGS. 36 to 41.

Figure 36:
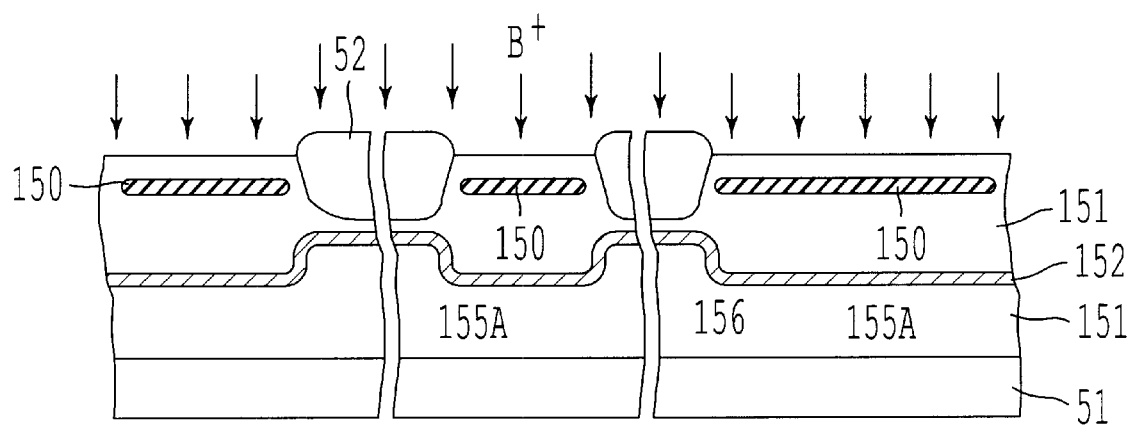
FIGS. 36 to 41 are diagrams showing manufacturing steps according to the third preferred embodiment of the present invention.

First, at a step shown in FIG. 36, a LOCOS layer (i.e., field oxide film) 52 is formed into a thickness of 4,000 Å, for instance, by a LOCOS method, on a surface of the semiconductor substrate 51 of the P-type. Following this, boron ions, for instance, are implanted with the energy of 700 keV and at a dose of $1 \times 10^{13}/cm^2$, thereby forming a P-type well region 151 within the semiconductor substrate 51. Although an N-type well region as well is formed in the semiconductor substrate 51 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 152 within the semiconductor substrate 51. The channel cut layer 152 is formed in such a shape which together with the LOCOS layer 52 creates the element-separated regions.

Next, the channel dope layer 150 which has the lowest impurity concentration is formed within the well region 151 of the transistor T62 of the sense amplifier portion. At this stage, the channel dope layer 150 is also formed in the transistors T61 and T63 of the logic portion and the memory cell array portion. The channel dope layer 150 is formed by implanting boron ions, for instance, with the energy of 50 keV and at a dose of $1 \times 10^{12}/cm^2$.

Figure 37:
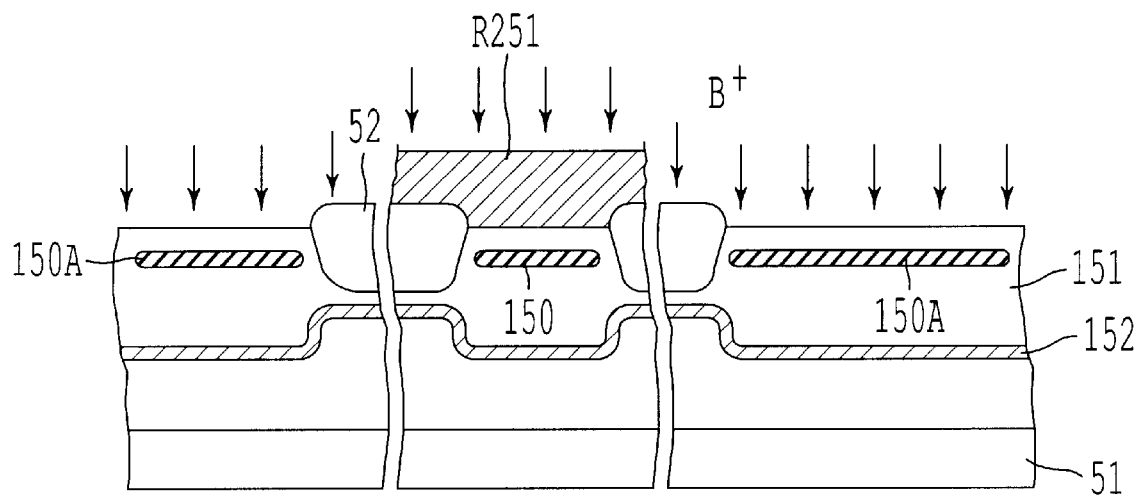

Next, at a step shown in FIG. 37, a resist mask R251 is formed on the sense amplifier portion. An impurity is additionally implanted in a selective fashion into the channel dope layer 150 of the logic portion and the memory cell array portion, thereby forming the channel dope layer 150A which has an impurity concentrations in accordance with the transistor T63 of the memory cell array portion. The channel dope layer 150A is formed by implanting boron ions, for instance, with the energy of 50 keV and at a dose of $4 \times 10^{12}/cm^2$.

Figure 38:
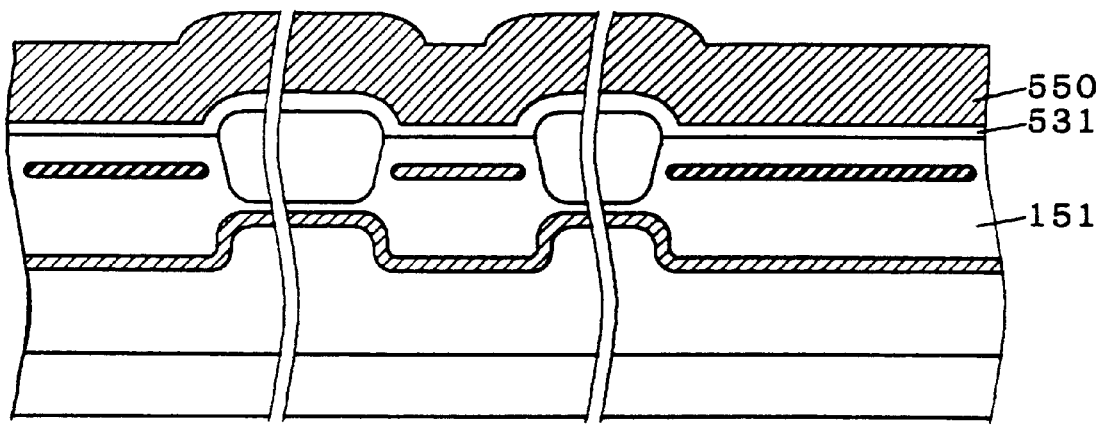

Next, at a step shown in FIG. 38, after forming an oxide film 531 which will become the gate oxide film 53 on the main surface of the semiconductor substrate 51 by a thermal oxide method, a (non-doped) polysilicon layer 550 is formed on the oxide film 531 as a gate electrode material by a CVD method. The oxide film 531 has a thickness of about 60 Å, whereas the polysilicon layer 550 has a thickness of about 2,000 Å.

Figure 39:
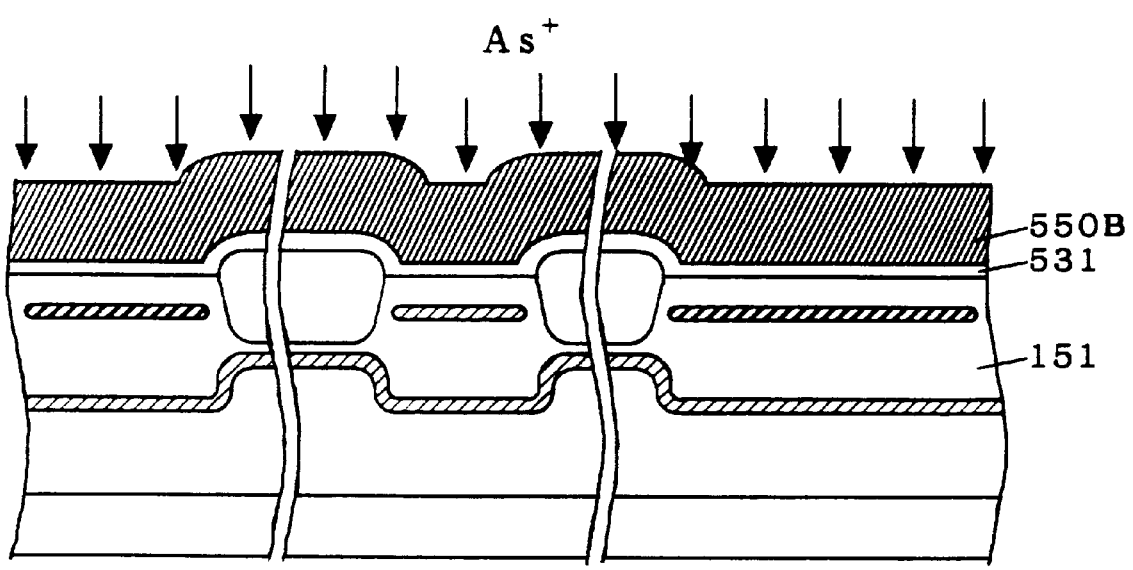

Next, at a step shown in FIG. 39, impurity ions are implanted into the polysilicon layer 550 in accordance with the gate electrode of the N-channel MOS transistor T63, which has the lowest impurity concentration, of the memory cell array portion, thereby forming a doped polysilicon layer 550B. At this stage, the doped polysilicon layer 550B is formed also in the logic portion and the sense amplifier portion. The doped polysilicon layer 550B is formed by implanting arsenic ions, for instance, with the energy of 30 keV and at a dose of $1 \times 10^{15}/cm^2$.

Figure 40:
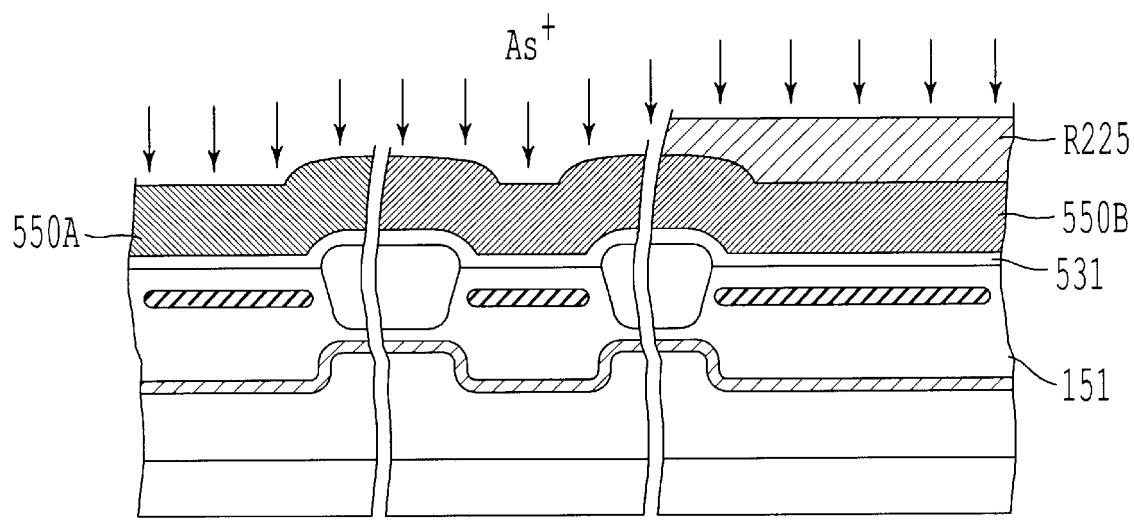

Next, at a step shown in FIG. 40; a resist mask R225 is formed on the memory cell array portion. An impurity is additionally implanted in a selective fashion into the doped polysilicon layer 550B of the logic portion and the sense amplifier portion, thereby forming a doped polysilicon layer 550A which has an impurity concentration in accordance with the N-channel MOS transistors T61 and T62 of the logic portion and the sense amplifier portion. The doped polysilicon layer 550A is formed by implanting arsenic ions, for instance, with the energy of 30 keV and at a dose of $4 \times 10^{15}/cm^2$.

Figure 41:
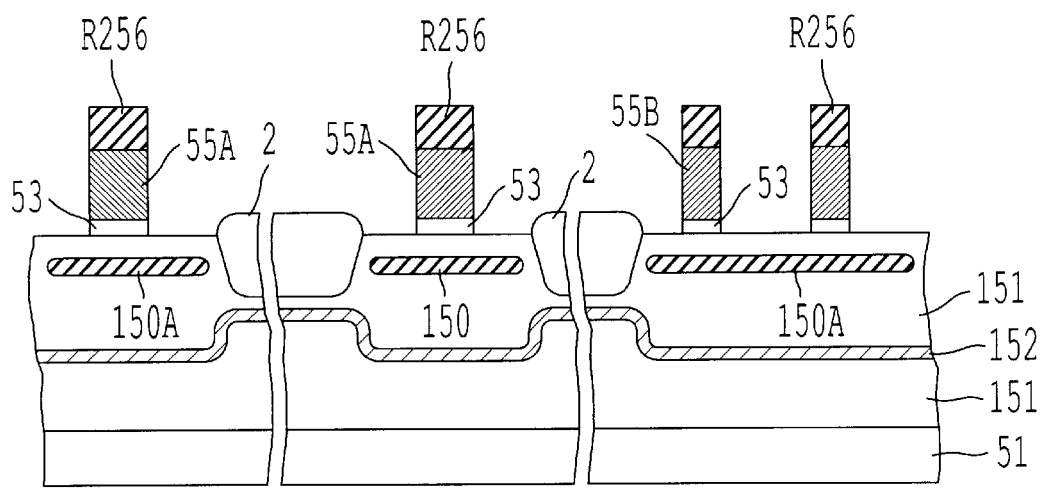

Next, at a step shown in FIG. 41, a resist mask R256 is formed on the doped polysilicon layers 550A and 550B. By patterning, the gate electrodes 55A, 55B and the gate oxide film 53 are formed.

Following this, after forming the LDD layers 157 by implanting ions into the logic portion, the sense amplifier portion and the memory cell array portion, the side wall oxide film 56 of about 1,000 Å in thickness is formed on a side surface of the gate oxide film 53 and gate electrodes 55A, 55B. Using the side wall oxide film 56 as a mask, by ion implantation, the source/drain layers 156 are formed. In this manner, the structure of the LOGIC in DRAM 300 which is shown in FIG. 33 is obtained.

Now, the LDD layers 157 are obtained by implanting arsenic (As) ions, for instance, with the energy of 30 keV and at a dose of $1 \times 10^{13}/cm^2$. Meanwhile, the source/drain layers 156 are obtained by injecting arsenic ions, for instance, with the energy of 50 keV and at a dose of $5 \times 10^{15/cm2}$ and thereafter annealing at 850° C. for 30 minutes.

Although this is followed by formation of a capacitor, an inter-layer insulation film, a wiring layer and the like to form the LOGIC in DRAM, this will not be described nor is shown in the drawings.

<3-3. Characteristic Function And Effect>

As described above, the LOGIC in DRAM 300 according to the third preferred embodiment of the present invention has such a structure in which the impurity concentrations of the gate electrodes and the impurity concentrations of the channel dope layers are changed among the plurality of types of transistors having different characteristics from each other (e.g., having different required specifications from each other) so that the effective thicknesses of the respective gate oxide films are changed and the threshold values are set.

That is, as shown in FIG. 34, in the memory cell array portion where the impurity concentration is low, a depletion layer is created in a large area within the gate electrode, so that the oxide film thickness becomes effectively thick and the threshold value is high.

Further, as shown in FIG. 34, in the sense amplifier portion, by ensuring a lower impurity concentration in the channel dope layer, it is possible to suppress a leak current (i.e., diffusion layer leak) from a diffusion layer as small as possible.

Thus, by setting the impurity concentrations of the channel dope layers at such values with which a diffusion layer leak is as small as possible while setting the threshold values by means of the impurity concentrations of the gate electrodes, it is possible to break the trade-off relationship between the threshold values and the diffusion layer leak and hence to eliminate a restriction imposed on circuit designing.

While the foregoing has described the structure in which various types of transistors are formed on a monocrystal substrate as the third preferred embodiment of the present invention, it is possible to achieve similar function and effect in the case where various types of transistors are formed sn an SOI (silicon on insulator) substrate.

Fourth Preferred Embodiment

<4-1. Structure Of Device>

Figure 42:
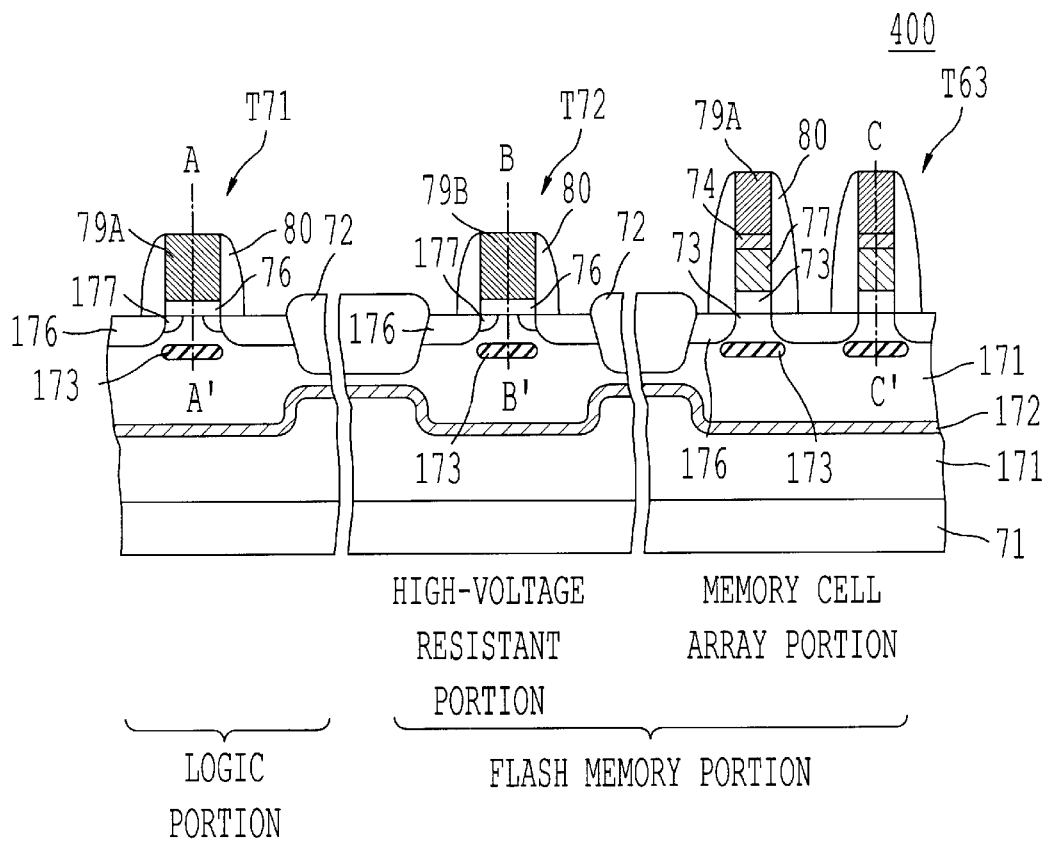
FIG. 42 is a cross sectional view showing a structure of a fourth preferred embodiment of the present invention.

FIG. 42 shows a partial structure of a flash memory which comprises a logic circuit (hereinafter "LOGIC in FLASH") 400, as a fourth preferred embodiment of the present invention.

In general, a LOGIC in FLASH is roughly divided into a logic portion and a flash memory portion. A requirement to the logic portion is an operation at a high speed, that is, a high driving capability and a low capacity.

Meanwhile, the flash memory portion includes a high-voltage resistant portion in which a high voltage is applied, a cell array portion in which a tunnel oxide film needs to be highly reliable, and the like. That is, a plurality of types of transistors which have different characteristics from each other are needed within a LOGIC in FLASH which is formed as one chip.

FIG. 42 shows cross sections of N-channel MOS transistors T71 to T73 which are used for she logic portion, the high-voltage resistant portion and the memory cell array portion.

In FIG. 42, the N-channel MOS transistors T71 to T73 are formed within a P-type well layer 171 which is formed on the same semiconductor substrate 71 (of the P-type). The well layer 171 is element-separated by a channel cut layer 171 which is formed within the well layer 171 and a LOCOS layer 72 in such a manner that the N-channel MOS transistors T71 to T73 are formed in regions which are created by element separation.

The N-channel MOS transistor T71 of the logic portion comprises a pair of source/drain layers 176 formed within the well layer 171 independently of each other but parallel to each other and a pair of LDD layers 177 formed adjacent to edge portions facing each other of the source/drain layers 176.

A gate oxide film 76 is formed on the LDD layers 177, and a gate electrode 79A is formed on the gate oxide film 76. A side wall oxide film 80 is formed on a side surface of the gate oxide film 76 and the gate electrode 79A. Within the well layer 171 under the gate electrode 79A, a channel dope layer 173 is formed.

The N-channel MOS transistor T72 of the high-voltage resistant portion of the flash memory portion comprises a pair of source/drain layers 176 formed within the well layer 171 independently of each other but parallel to each other and a pair of LDD layers 177.

A gate oxide film 76 is formed on the LDD layers 177, and a gate electrode 79B is formed on the gate oxide film 76. The side wall oxide film 80 is formed on a side surface of the gate oxide film 76 and the gate electrode 79B. Within the well layer 171 under the gate electrode 79B, a channel dope layer 173 is formed.

The N-channel MOS transistor T73 of the memory cell array portion of the flash memory portion comprises a pair of source/drain layers 176 formed within the well layer 171 independently of each other but parallel to each other. A tunnel oxide film 73 is formed on esge portions of the source/drain layers 176. A floating gate electrode 77, an inter-layer insulation film 74 and a control gate electrode 79A are formed in this order on the tunnel oxide film 73.

The side wall oxide film 80 is formed on a side surface of the tunnel oxide film 73, the floating gate electrode 77, the inter-layer insulation film 74 and the control gate electrode 79A.

Within the well layer 171 under the floating electrode 77, a channel dope layer 173 is formed. The memory cell array portion has a gate array structure in which adjacent gates share one source/drain layer 176. Such structures are arranged successively.

Table 8 shows figures regarding the structures of the N-channel MOS transistors T71 to T73.

TABLE 8

| | LOGIC PORTION (T71) | HIGH-VOLTAGE RESISTANT PORTION (T72) | MEMORY CELL ARRAY PORTION (T73) |
|---|---|---|---|
| FIELD OXIDE FILM THICKNESS | 4000 Å | 4000 Å | 4000 Å |
| FLOATING GATE OXIDE FILM THICKNESS | 50 Å | 50 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TEOS/Si_3N_4/TEOS = 100/100/100$ Å |
| CONTROL GATE ELECTRODE FILM THICKNESS | 2000 Å | 2000 Å | 2000 Å |
| SIDE WALL | 1000 Å | 1000 Å | 1000 Å |
| WELL | B 700 keV $1 \times 10^{15}/cm^2$ | B 700 keV $1 \times 10^{15}/cm^2$ | B 700 keV $1 \times 10^{15}/cm^2$ |
| CHANNEL CUT | B 130 keV $5 \times 10^{12}/cm^2$ | B 130 keV $5 \times 10^{12}/cm^2$ | B 130 keV $5 \times 10^{12}/cm^2$ |
| CHANNEL DOPE | B 50 keV $1 \times 10^{12}/cm^2$ | B 50 keV $1 \times 10^{12}/cm^2$ | B 50 keV $1 \times 10^{12}/cm^2$ |
| LDD | P 30 keV $1 \times 10^{13}/cm^2$ | P 30 keV $1 \times 10^{13}/cm^2$ | — |
| SOURCE/DRAIN | P 50 keV $5 \times 10^{15}/cm^2$ | P 50 keV $5 \times 10^{15}/cm^2$ | P 50 keV $5 \times 10^{15}/cm^2$ |
| GATE IMAPLANTATION | As 30 keV $5 \times 10^{15}/cm^2$ | As 30 keV $5 \times 10^{14}/cm^2$ | As 30 keV $5 \times 10^{15}/cm^2$ |
| THERMAL POROCESSING | | 850° C. 60 MIN | |

In Table 8, the thicknesses of the gate oxide films of the N-channel MOS transistors T71, T72 and T73 are 50 Å, 50 Å and 100 Å, respectively.

Moreover, an impurity dose for forming the channel dope layers of the N-channel MOS transistors T71, T72 and T73 is $1 \times 10^{12}/cm^2$. Boron (B) is implanted as an impurity for either layers with the implantation energy of 50 KeV.

Further, an impurity dose for forming the gate electrodes of the N-channel MOS transistors T71, T72 and T73 are $5 \times 10^{15}/cm^2$, $5 \times 10^{14}/cm^2$ and $5 \times 10^{15}/cm^2$. Arsenic (AS) is implanted as an impurity for either layers with the implantation energy of 30 KeV.

Figure 43:
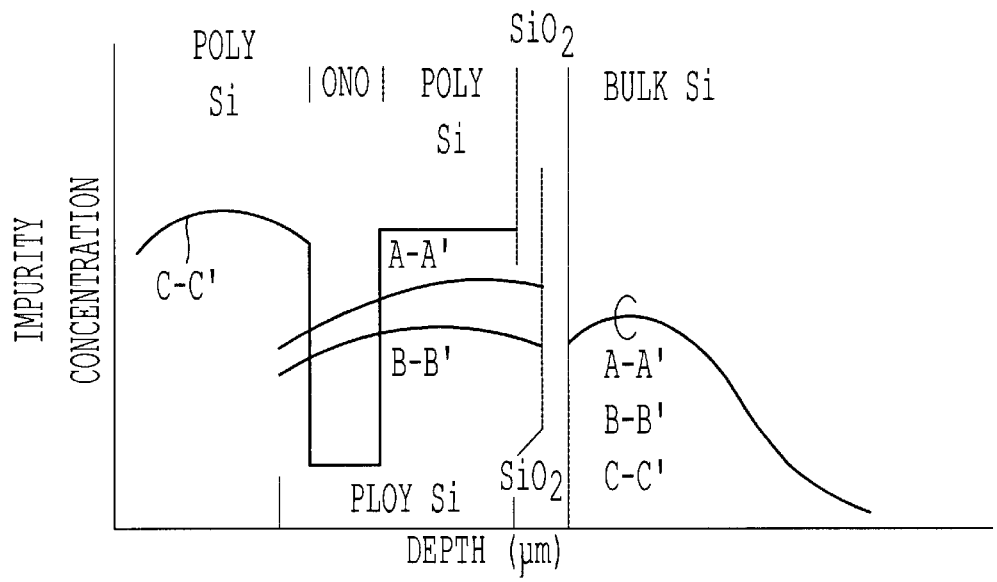
FIG. 43 is a diagram for describing a distribution of an impurity according to the fourth preferred embodiment of the present invention.

FIG. 43 shows impurity profiles of the N-channel MOS transistors T71, T72 and T73 forming the logic portion, the high-voltage resistant portion and the memory cell array portion, all of which shown in FIG. 42, taken at cross sectional portions along A–A' line, B–B' line and C–C' line, respectively.

In FIG. 43, a position (i.e., depth) in a cross sectional direction is shown along a horizontal axis and an impurity concentration is shown along a vertical axis. The order in which the structure of the N-channel MOS transistor T73 of the memory cell array portion is fabricated is illustrated in an upper portion of FIG. 43.

The upper portion of FIG. 43 shows the control gate electrode (polysilicon layer), the inter-layer insulasion film (ONO film), the floating gate electrode (polysilicon layer), the tunnel oxide film ($SiO_2$ layer) and the well layer (bulk silicon layer) in this order from the left-hand side.

Further, FIG. 43 shows the gate electrode (polysilicon layer), the gate oxide film ($SiO_2$ layer) and the well layer (bulk silicon layer) in this order along the horizontal axis.

In FIG. 43, as indicated at the C–C' line, the impurity concentration of the gate electrode in the memory cell array portion is the highest, and the impurity concentration of the gate electrode in the high-voltage resistant portion indicated at the B–B' line is the lowest.

Hence, in the high-voltage resistant portion, the depletion layer is the largest at the control gate electrode so that the effective thickness of the oxide film is thickest and the high-voltage resistant portion can withstand a high voltage.

Figure 44:
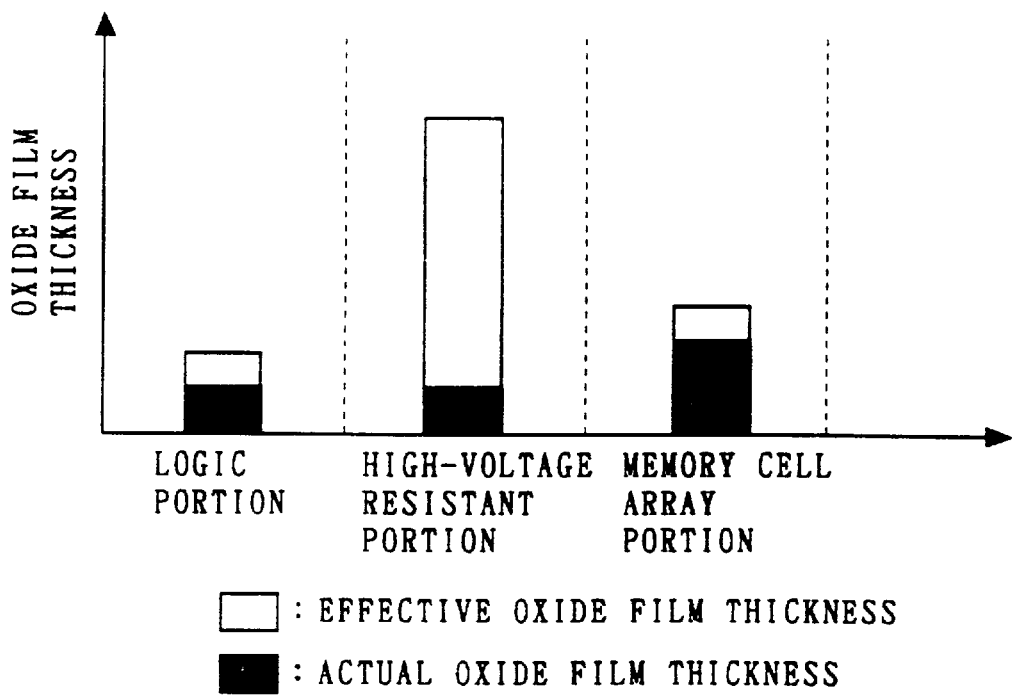
FIG. 44 is a diagram for describing a thickness of a gate oxide film in the fourth preferred embodiment of the present invention.

FIG. 44 shows actual thicknesses and effective thicknesses of the respective gate oxide films. FIG. 44 shows the N-channel MOS transistors of the logic portion, the high-voltage resistant portion and the memory cell array portion in this order from the left-hand side along the horizontal axis. As clearly shown in FIG. 44, among the effective thicknesses of the respective gate oxide films, the effective thickness is particularly thick in the high-voltage resistant portion.

Further, as shown in FIG. 43, in any one of the transistors of the logic portion (A–A' line), the high-voltage resistant portion (B–B' line) and the memory cell array portion (C–C' line), the impurity concentration of the channel dope layer stays the same.

Since the floating gate electrode of the N-channel MOS transistor T73 of the memory cell array portion is formed by a CVD method, the impurity concentration remains constant.

<4-2. Manufacturing Method>

In the following, a description will be given on a method of manufacturing the N-channel MOS transistors T71, T72 and T73 of the logic portion, and of the sense amplifier portion and the memory cell array portion of the flash memory portion, all of which shown in FIG. 42, with reference to FIGS. 45 to 57.

Figure 45:
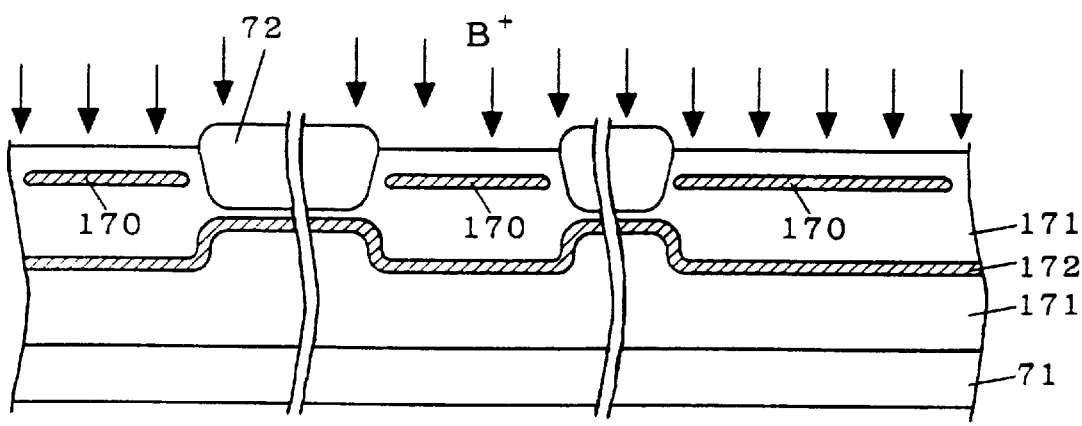

First, at a step shown in FIG. 45, a LOCOS layer (i.e., field oxide film) 72 is formed into a thickness of 4,000 Å, for instance, by a LOCOS method on a surface of the semiconductor substrate 71 of the P-type. Following this, boron ions, for instance, are implanted with the energy of 700 keV and at a dose of $1 \times 10^{13}/cm^2$, thereby forming a P-type well region 171 within the semiconductor substrate 71. Although an N-type well region as well is formed in the semiconductor substrate 71 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 172 within the semiconductor substrate 71. The channel cut layer 172 is formed in such a shape which together with the LOCOS layer 22 creates the element-separated regions.

Next, at a predetermined position in the high-voltage resistant portion, the peripheral circuit portion and the memory cell array portion within the well region 171, a channel dope layer 173. The channel dope layer 173 is formed by implanting boron ions, for instance, with the energy of 50 keV and at a dose of $1 \times 101^{12}/cm^2$.

Figure 48:
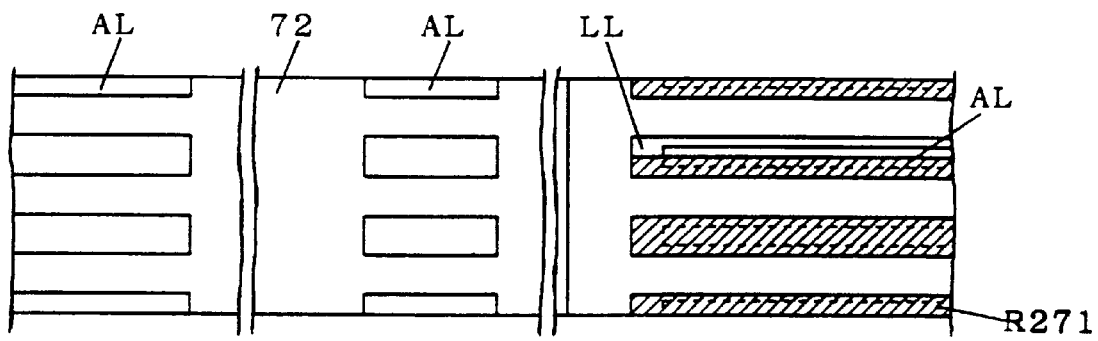

Next, at a step shown in FIG. 46, after forming an oxide film 731 which will become the tunnel oxide film 73 on a main surface of the semiconductor substrate 71 by a thermal oxide method, a doped polysilicon layer 771, for instance, is formed as a gate electrode material on the oxide film 731 by a CVD method. The oxide film 731 has a thickness of about 100 Å, whereas the doped polysilicon layer 771 has a thickness of about 1,000 Å. Phosphorus (P) is used as an impurity. The concentration of the impurity is about $1 \times 10^{20}/cm^{3.}$ Next, at a step shown in FIG. 47, a resist mask R271 is formed selectively on the doped polysilicon layer 771 within the memory cell array portion. In this case, the resist mask R271 is formed along the gate-width direction of the memory cell array portion. A portion of the doped polysilicon layer 771 which is not covered with the resist mask R271 is removed by anisotropic etching. FIG. 48 shows this condition.

FIG. 48 is a plan view viewing FIG. 47 from the upper surface side (i.e., the side on which the resist mask R271 is formed). Within the memory cell array portion, the resist mask R271 is formed as rectangle islands which are arranged regularly. The resist mask R271 is formed to cover an active layer AL which has a configuration like a rectangle island and an LOCOS layer LL around the same. Within the high-voltage resistant portion and the logic portion, since the resist mask is not formed, the active layer AL is exposed.

Figure 49:
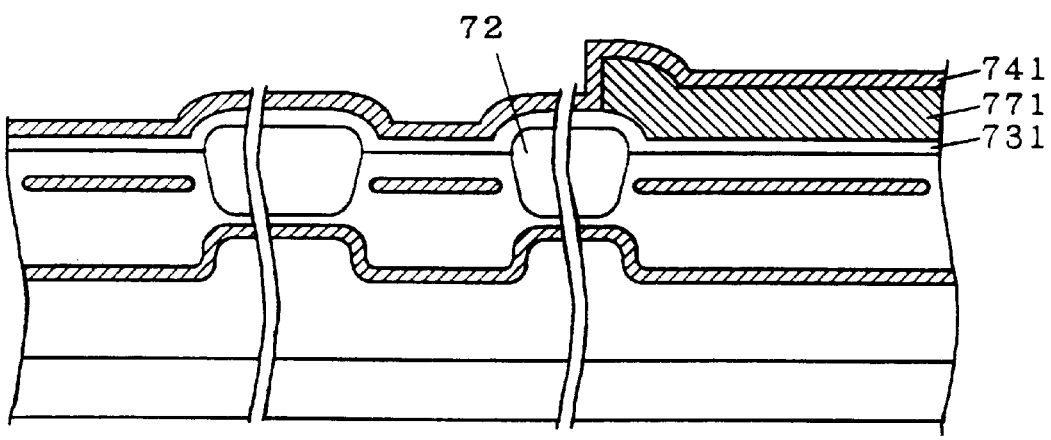

Next, after removing the resist mask R271, at a step shown in FIG. 49, an insulation film 741, which will become the inter-layer insulation film 74 which insulates the floating gate from the control gate, is formed on the doped polysilicon layer 771 by a CVD method. This film has a structure in which a TEOS (tetraethyl orthosilicate) film, a nitride film ($Si_3N_4$) film, a TEOS film each having a thickness of 100 Å are stacked in this order. The insulation film 741 is formed on the high-voltage resistant portion and the logic portion as well.

Figure 50:
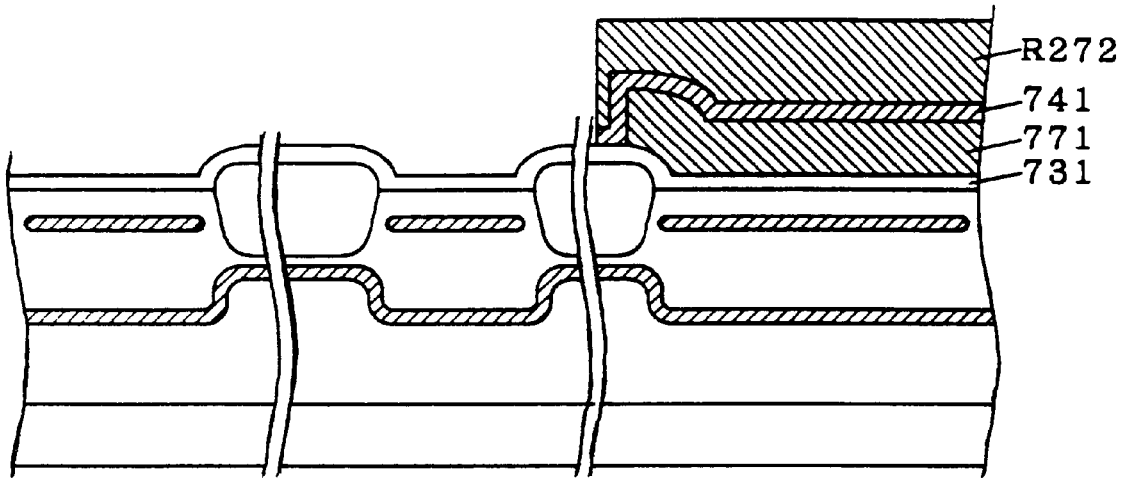
Figure 51:
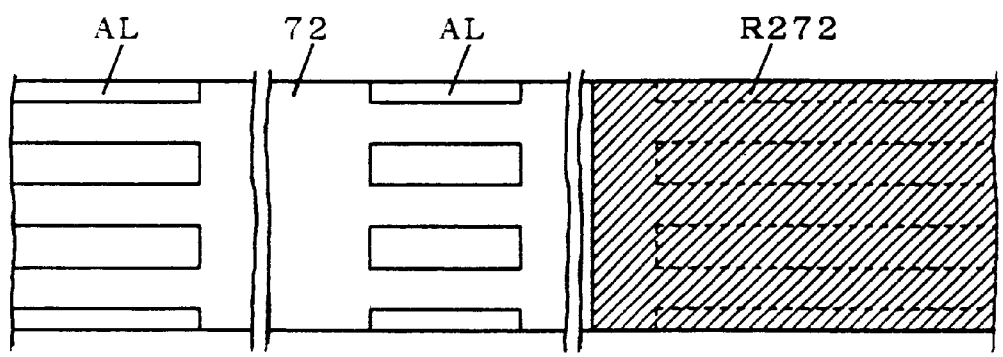

Next, at a step shown in FIG. 50, a resist mask R272 is formed on the insulation film 741 of the memory cell array portion, and the insulation film 741 in all other regions is removed. In this case, in the other regions, the oxide film 731 is removed as well. FIG. 51 shows this condition.

FIG. 51 is a plan view viewing FIG. 50 from the upper surface side (i.e., the side on which the resist mask R272 is formed). The resist mask R272 is formed to entirely cover the memory cell array portion. However, within the high-voltage resistant portion and the logic portion, since the resist mask R272 is not formed, the active layer AL is exposed.

Figure 52:
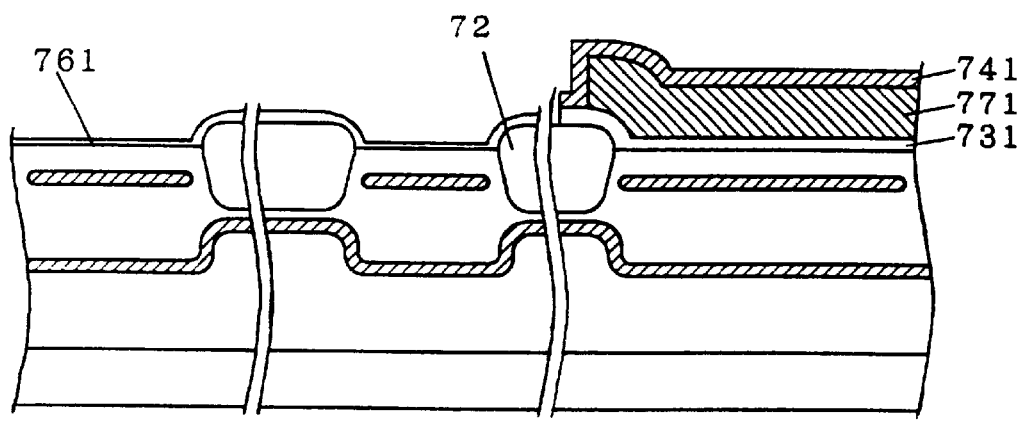

Next, after removing the resist mask R272, at a step shown in FIG. 52, an oxide film 761 which will become the gate oxide film 76 is formed entirely on the main surface of the semiconductor substrate 71 by a thermal oxide method. At this stage, since the insulation film 741 on the memory cell array portion includes the nitride film, the insulation film 741 is not oxidized and the thickness of the insulation film 741 is maintained. The thickness of the oxide film 761 is about 50 Å.

Figure 53:
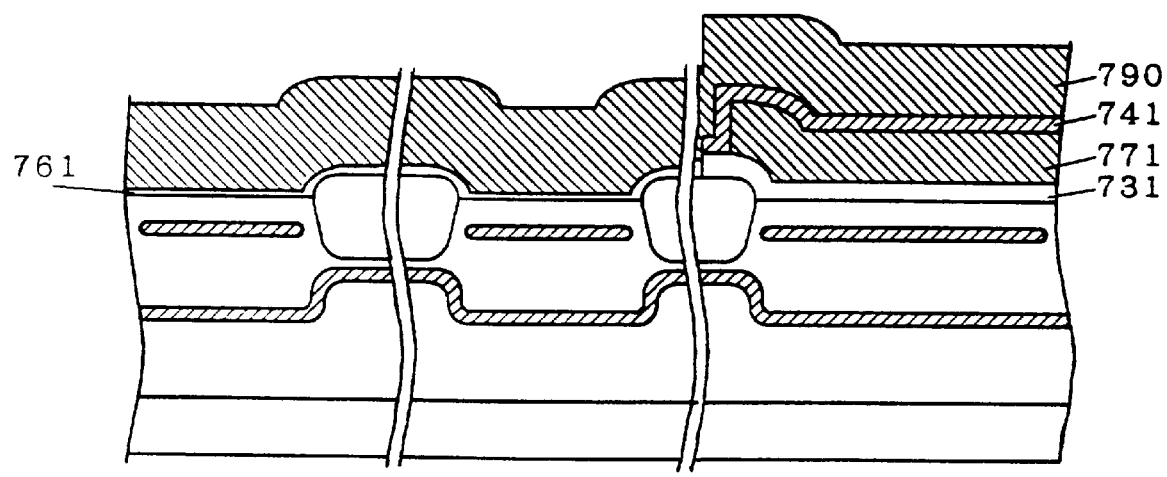

Next, at a step shown in FIG. 53, a (non-doped) polysilicon layer 790 is formed entirely on a main surface of the semiconductor substrate 71 as a gate electrode material by a CVD method. The polysilicon layer 790 has a thickness of about 2,000 Å.

Figure 54:
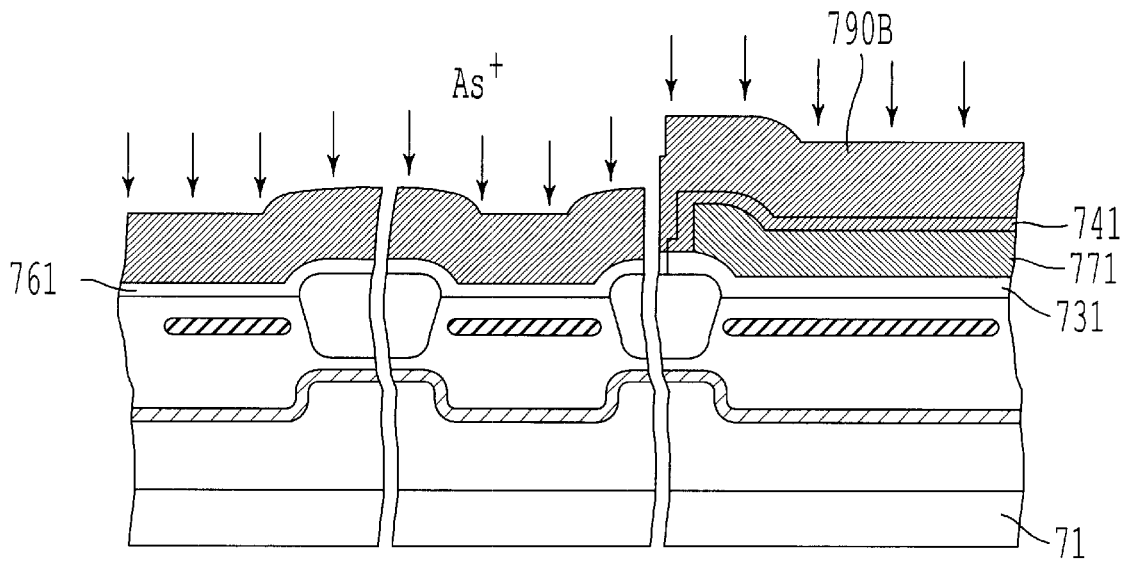

Next, at a step shown in FIG. 54, impurity ions are implanted into the polysilicon layer 790 in accordance with the gate electrode of the N-channel MOS transistor T72, which has the lowest impurity concentration, of the high-voltage resistant portion, thereby forming a doped polysilicon layer 790B. At this stage, the doped polysilicon layer 790B is formed also in the logic portion and the memory cell array portion. The doped polysilicon layer 790B is formed by implanting arsenic ions, for instance, with the energy of 30 keV and at a dose of $5 \times 10^{14}/cm^2$.

Figure 55:
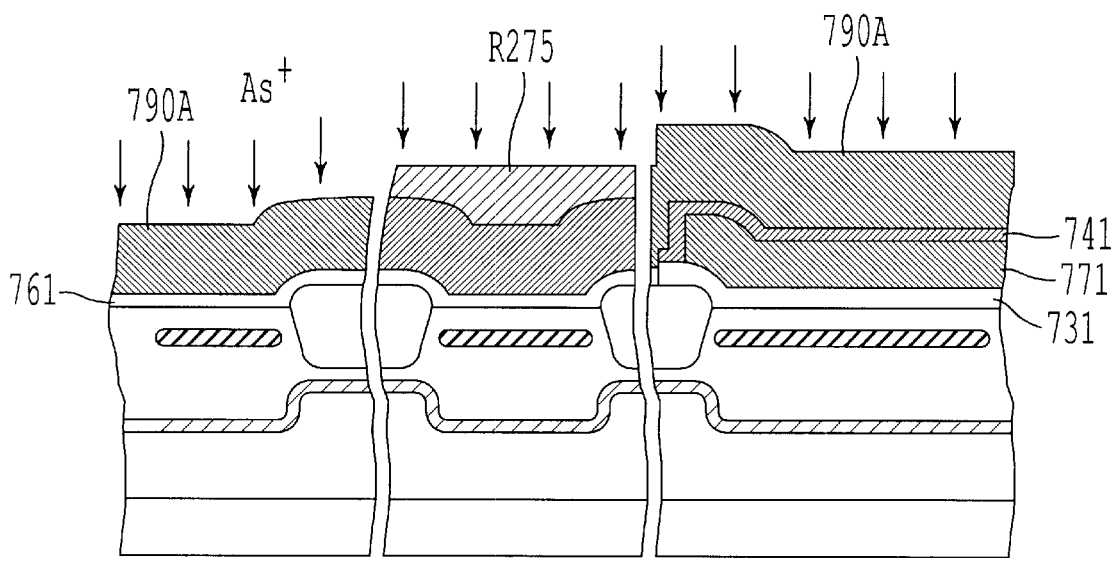

Next, at a step shown in FIG. 55, a resist mask R275 is formed on the high-voltage resistant portion. An impurity is additionally implanted in a selective fashion into the doped polysilicon layer 790B of the logic portion and the memory cell array portion, thereby forming a doped polysilicon layer 790A which has an impurity concentration in accordance with the N-channel MOS transistors T71 and T73 of the logic portion and the memory cell array portion. The doped polysilicon layer 790A is formed by implanting arsenic ions, for instance, with the energy of 30 keV and at a dose of $4.5 \times 10^{15}/cm^2$.

Figure 56:
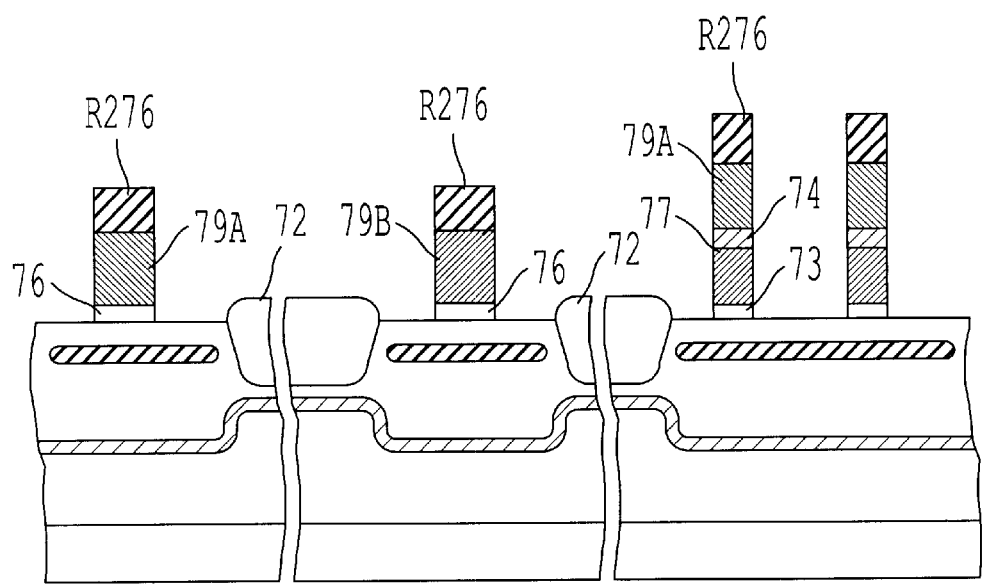
Figure 57:
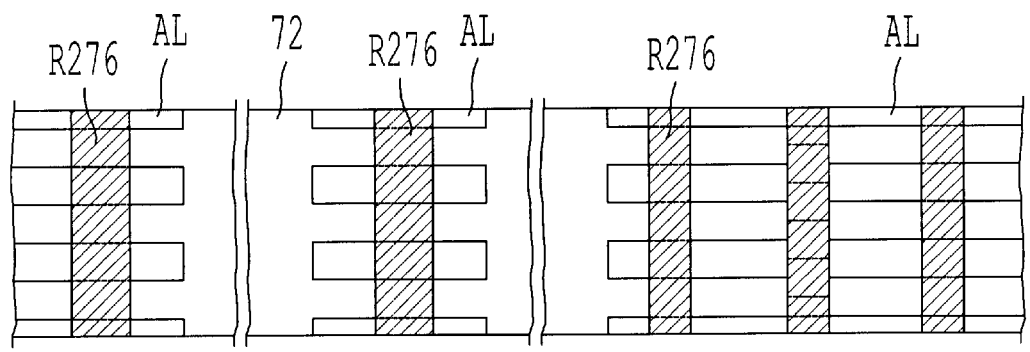

Next, after removing the resist mask R275, at a step shown in FIG. 56, a resist mask R276 is formed on the doped polysilicon layers 790A and 790B and patterned. FIG. 57 shows this condition.

FIG. 57 is a plan view viewing FIG. 56 from the upper surface side (i.e., the side on which the resist mask R276 is formed). The resist mask R276 is formed to be perpendicular to the active layer AL which has a rectangular configuration.

As a result of patterning, the gate oxide film 76 and gate electrode 79A are formed within the logic portion, the gate oxide film 76 and gate electrode 79B are formed within the high-voltage resistant portion, and the tunnel oxide film 73, the floating gate electrode 77, the inter-layer insulation film 74 and the control gate electrode 79A are formed within the memory cell array portion.

Following this, after forming the LDD layers 177 by implanting ions into the logic portion and the high-voltage resistant portion, the side wall oxide film 80 of about 1,000 Å in thickness is formed on a side surface of the gate oxide film 76 and gate electrode 79A, on a side surface of the gate oxide film 76 and gate electrode 79B, and on a side surface of the tunnel oxide film 73, the floating gate electrode 77, the inter-layer insulation film 74 and the control gate electrode 79A. Using the side wall oxide film 80 as a mask, by ion implantation, the source/drain layers 176 are formed. In this manner, the structure of the flash memory which is shown in FIG. 42 is obtained.

Now, the LDD layers 177 are obtained by implanting arsenic ions, for instance, with the energy of 30 keV and at a dose of $1 \times 101^{13}/cm^2$. Meanwhile, the source/drain layers 176 are obtained by injecting arsenic ions, for instance, with the energy of 50 keV and at a dose of $5 \times 10^{15}/cm^2$ and thereafter annealing at 850 degrees Centsgrade for 30 minutes.

Although this is followed by formation of a capacitor, an inter-layer insulation film, a wiring layer and the like to form the LOGIC in FLASH, this will not be described nor is shown in the drawings.

<4-3. Characteristic Function And Effect>

As described above, the LOGIC in FLASH 400 according to the fourth preferred embodiment of the present invention has such a structure in which the impurity concentrations of the gate electrodes are changed among the plurality of types of transistors having different characteristics from each other (e.g., having different required specifications from each other) so that the effective thicknesses of the respective gate oxide films are changed and hence the threshold values are set.

That is, as shown in FIG. 43, in the high-voltage resistant portion where the impurity concentration is low, a depletion layer is created in a large area within the gate electrode, so that the oxide film shickness becomes effectively thick and the threshold value is high.

Further, since it is possible to set the threshold values by changing the effective thicknesses of the gate oxide films, it is not necessary to change the impurity concentrations of the channel dope layers in accordance with the characteristics of the transistors, and therefore, it is possible to fix the concentrations at such values with which a leak current (i.e., diffusion layer leak) from a diffusion layer can be suppressed as small as possible.

Hence, by setting the impurity concentrations of the channel dope layers at such values with which a diffusion layer leak is as small as possible while adjusting the breakdown voltage characteristics and the threshold values by means of the impurity concentrations of the gate electrodes, it is possible to satisfy the requirements regarding the breakdown voltages, to break the trade-off relationship between the threshold values and the diffusion layer leak, and hence, to eliminate a restriction imposed on circuit designing.

Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

That is, in the structure shown in FIG. 42, since the thicknesses of the gate oxide films of the transistors of the logic portion and the high-voltage resistant portion are the same with each other, there two types of the gate oxide films. Further, with respect to the steps for forming the oxide films, there are only the step for forming the oxide film 731 (See FIG. 46) and the step for forming the oxide film 761 (See FIG. 52). Since the oxide films are formed by carrying ous thermal oxidation once at either steps, unlike in the conventional manufacturing method described with reference to FIGS. 109 to 122, it is not necessary to form one oxide film at more than one stages and there is no concern that an impurity may be mixed in or the controllability of controlling film thickness may deteriorate.

While the foregoing has described the structure in which various types of transistors are formed on a monocrystal substrate as the fourth preferred embodiment of the present invention, it is possible to achieve similar function and effect in the case where various types of transistors are formed on an SOI (silicon on insulator) substrate.

EXAMPLES OF OTHER APPLICATIONS OF THE INVENTION

While the foregoing has described the first to the fourth preferred embodiments of the present invention in relation to examples of a DRAM, a flash memory, a LOGIC in DRAM, and a LOGIC in FLASH, applications of the technical idea of the present invention are not limited to these semiconductor devices. In short, since it is possible to change the effective thicknesses of the gate oxide films to optionally set the threshold values by adjusting the impurity concentrations of the impurity layers within the control electrodes and therefore by optionally setting the thicknesses of the depletion layers within the control electrodes, when the present invention is applied to a case where the thicknesses of the gate oxide films are common but the effective thicknesses of the gate oxide films need to be changed in the transistors in the respective portions which are formed on the single common substrate or to a case where the concentrations in the channel dope layers need to be the same with each other but the thicknesses of the gate oxide films may be different from each other, it is possible to achieve a desired effect.

Further, although the first to the fourth preferred embodiments are related to an example in which transistors having different characteristics from each other are used in the three portions which are formed on the single common substrate, this does not means that only one type of transistors can be used in each one of the three portions. For instance, in the case of a LOGIC in DRAM, two or more types of transistors may be used in the logic portion and two or more types of transistors may be used in the sense amplifier portion as well. Alternatively, it is allowable to use two types of transistors in the logic portion while using one type of transistors in the memory cell array portion.

In addition, the present invention is effective even to a semiconductor device in which device structures cannot be clearly distinguished from each other, such as a logic portion, a high-voltage resistant portion, a sense amplifier portion and a memory cell array portion, if a structure of the semiconductor device requires a plurality of types of transistors which have different characteristics from each other.

Further, the types of transistors do not have to be three types. The structure may use transistors of three or more types of characteristics, or transistors of two types of characteristics.

In such various structures as well, by adjusting the impurity concentrations of the impurity layers within the control electrodes and by appropriately selecting the thicknesses of the gate oxide films and the concentrations in the channel dope layers, it is possible to achieve a desired effect.

Still further, even in the case of a semiconductor device which includes only one type of transistors, the present invention is effective to a case where threshold values are to be set optionally by changing the effective thicknesses of the gate oxide films.

Fifth Preferred Embodiment

While the foregoing has described the first to the fourth preferred embodiments of the present invention in relation to examples where in the sense amplifier portion, the peripheral circuit portion, the memory cell array portion and the high-voltage resistant portion of a DRAM, a flash memory, a LOGIC in DRAM, and a LOGIC in FLASH, impurities are implanted into the gate electrodes of the MOS transistors which form those portions, use of the depletion layers which are created as a result of introduction of the impurities into the gate electrodes is not limited in the portions described above.

In other words, the present invention is effective to a semiconductor device in which a plurality of types of transistors need to be formed within one chip. In the following, a fifth preferred embodiment of the present invention will be described.

Figure 58:
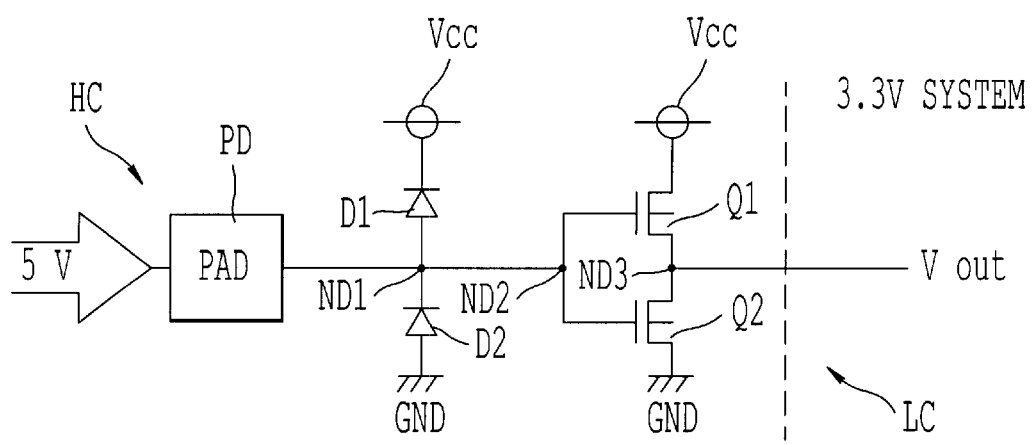
FIG. 58 is a circuitry diagram for describing a fifth preferred embodiment of the present invention.

FIG. 58 shows a regular a stepdown circuit. The stepdown circuit is a circuit for stepping down a 5V-signal to 3.3V and outputting a resultant signal, and comprises a PMOS transistor Q1 and an NMOS transistor Q2 which are connected in series between a power source potential Vcc and a ground potential GND, diodes D1 and D2 which are connected in series between the power source potential Vcc and the ground potential GND, and an input pad ND which is connected to a connection point ND1 between the diodes D1 and D2. A cathode of the diode D1 is connected to the power source potential Vcc, an anode of the diode D1 is connected to a cathode of the diode D2, and an anode of the diode D2 is connected to the ground potential GND. The connection point ND1 is connected to a connection point ND2 which is connected in common to gate electrodes of the PMOS transistor Q1 and the NMOS transistor Q2, while an connection point ND3 between the PMOS transistor Q1 and the NMOS transistor Q2 is connected to a circuit system (hereinafter "3.3V-system circuit") LC.

In the stepdown circuit having such a structure, to the gate electrodes of the PMOS transistor Q1 and the NMOS transistor Q2, the 5V-signal from the input pad ND is supplied (hereinafter "5V-system circuit HC"). On the other hand, to gate electrodes of MOS transistors which form the 3.3V-system circuit LC, 3.3V which is an output from the 5V-system circuit HC is supplied.

In this manner, in the circuit Systems in which different voltages are applied to the gate electrodes, the thicknesses-of the gate oxide films of the MOS transistors which form the circuit systems have to be different from each other. This is because if the thicknesses of the gate oxide films of the MOS transistors of the 5V-system circuit HC are made the same as those of the gate oxide films of the MOS transistors of the 3.3V-system circuit LC, a problem regarding an insulating capability is created. Conversely, if the thicknesses of the gate oxide films of the MOS transistors of the 3.3V-system circuit LC are made the same as those of the gate oxide films of the MOS transistors of the 5V-system circuit HC, operation speeds of the MOS transistors of the 3.3V-system circuit LC become slow, and therefore, a problem in terms of an operation characteristic is created.

To deal with this, MOS transistors in which gate oxide films having different thicknesses from each other are customarily used. This requires a step for forming the gate oxide films which have different thicknesses from each other, which makes manufacturing steps complex.

However, according to the present invention, it is not necessary to change the thicknesses of the gate oxide films between the 5V-system circuit HC and the 3.3V-system circuit LC, and therefore, the manufacturing steps are simplified.

<5-1. Structure Of Device>

Figure 59:
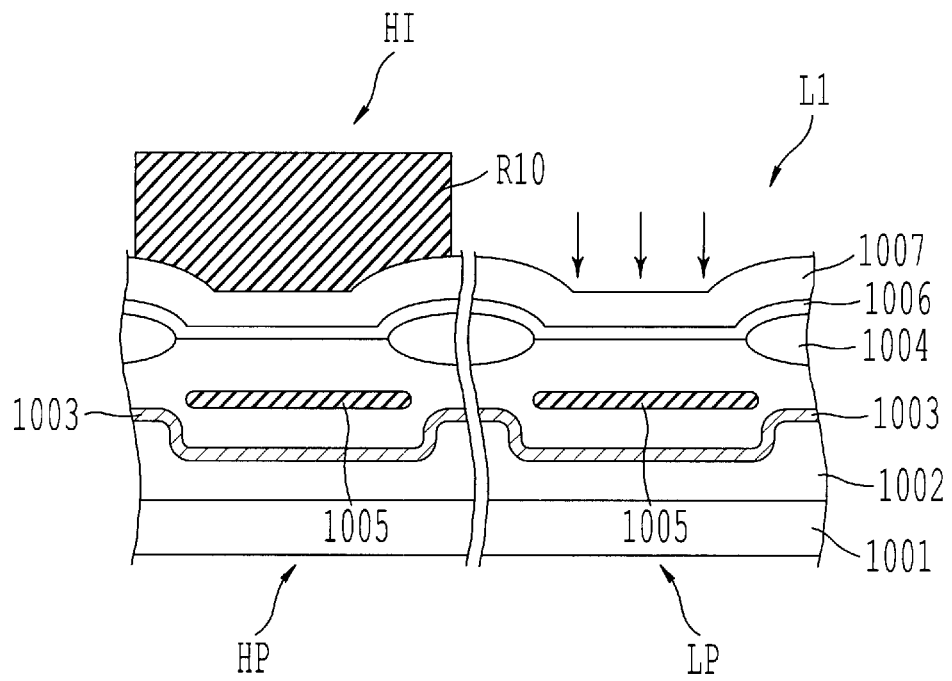
FIG. 59 is a diagram showing a manufacturing step according to the fifth preferred embodiment of the present invention.

FIG. 59 shows a manufacturing step for manufacturing a high-voltage circuit portion HP, which is formed by a MOS transistor H1 in which a relatively high voltage is applied to a gate electrode, and for manufacturing a low voltage circuit portion LP, which is formed by a MOS transistor L1 in which a relatively low voltage is applied to a gate electrode, as the fifth preferred embodiment of the present invention.

In FIG. 59, MOS transistors Hi and L1 are formed within a well layer 1002 which is formed on the same semiconductor substrate 1001. The well layer 1002 is element-separated by a channel cut layer 1003 which is formed within the well layer 1002 and a LOCOS layer 1004. A channel dope layer 1005 is formed in regions which are element-separated by the channel cut layer 1003 and the LOCOS layer 1004.

An oxide film 1006 is formed on a main surface of the semiconductor substrate 1001, and a polysilicon layer 1007 is formed on the oxide film 1006. The thickness of the oxide film 1006 is an appropriate thickness which is suitable to a voltage which is applied to a gate electrode of the MOS transistor L1. A resist mask RIO is formed so that the polysilicon layer 1007 of the high-voltage circuit portion HP is coated with the resist mask R10.

Figure 60:
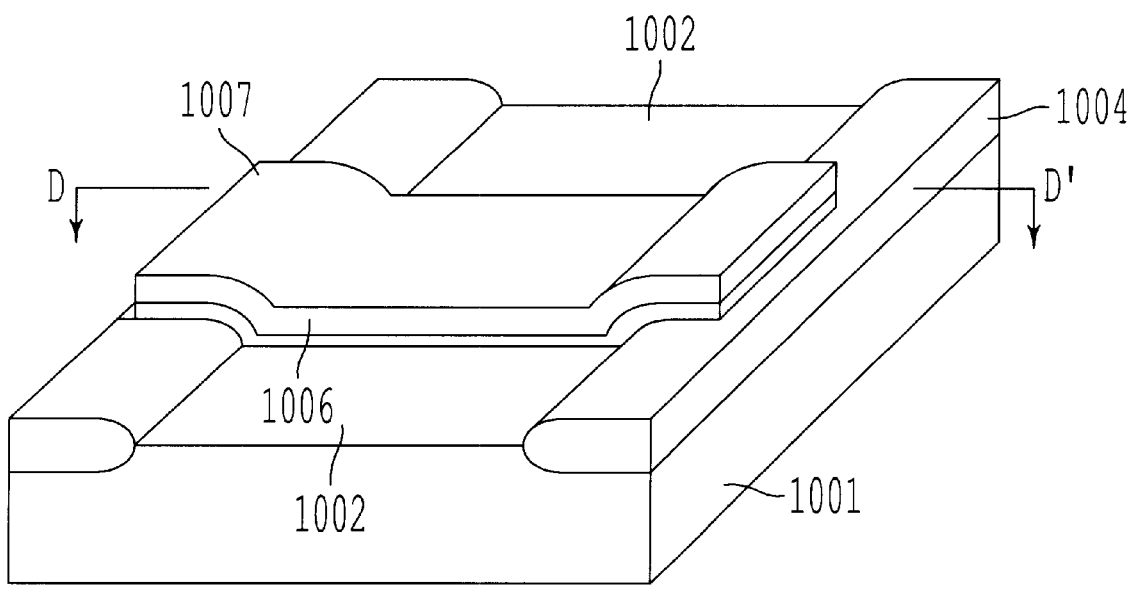
FIG. 60 is a perspective view of a MOS transistor, describing the fifth preferred embodiment of the present invention.

FIG. 60 is a partial perspective view showing the low voltage circuit portion LP. In FIG. 60, a cross sectional taken along D–D' line corresponds to the low voltage circuit portion LP which is shown in FIG. 59. Within the well layer 1002 which is located externally to the both sides of the polysilicon layer 1007, a source/drain region will be formed at a later time.

<5-2. Manufacturing Method>

In such a condition, if impurity ions are implanted from above, an impurity is introduced into the polysilicon layer 1007 of the low voltage circuit portion LP. With respect to the type of an impurity, when the MOS transistor L1 needs to be the N-channel type, phosphorus (P) ions, for instance, are implanted with the energy of 50 keV and at a dose of $5 \times 10^{15}/cm^2$. On the other hand, when the MOS transistor L1 needs to be the P-channel type, boron (B), for instance, are implanted with the energy of 10 keV and at a dose of $5 \times 10^{15}/cm^2$.

Thus, as to the gate electrodes which are formed by implanting impurity ions into the polysilicon layer 1007 on the MOS transistor L1, even during an operation of the MOS transistor L1, creation of a depletion layer within the gate electrode is prevented, and therefore, the oxide film does not get effectively thickened.

On the other hand, since impurity ions are not implanted into the polysilicon layer 1007 on the MOS transistor H1, even during an operation of the MOS transistor H1, a depletion layer is created in a large range within the gate electrode, and therefore, the oxide film does not get effectively thickened. Hence, even when the thickness of the oxide film 1006 is not an appropriate thickness which is suitable to a voltage which is applied to the gate electrode of the MOS transistor H1, dielectric breakdown of the oxide film is prevented.

<5-3. Characteristic Function And Effect>

As described above, even when there are the high-voltage circuit portion HP which is formed by the MOS transistor H1 in which a relatively high voltage is applied to the gate electrode and the low voltage circuit portion LP which ss formed by the MOS transistor L1 in which a relatively low voltage is applied to the gate electrode, it is only necessary to form the oxide films in such a manner that the oxide films are appropriate to the MOS transistor L1. This simplifies the manufacturing steps than where it is necessary to form the oxide films separately.

While the foregoing has described an example where impurity ions are not implanted into the polysilicon layer 1007 on the MOS transistor H1, as in the first to the fourth preferred embodiments described earlier, the fifth preferred embodiment may be applied to a structure in which impurity ions are implanted into the polysilicon layer 1007 on the MOS transistor H1.

Figure 61:
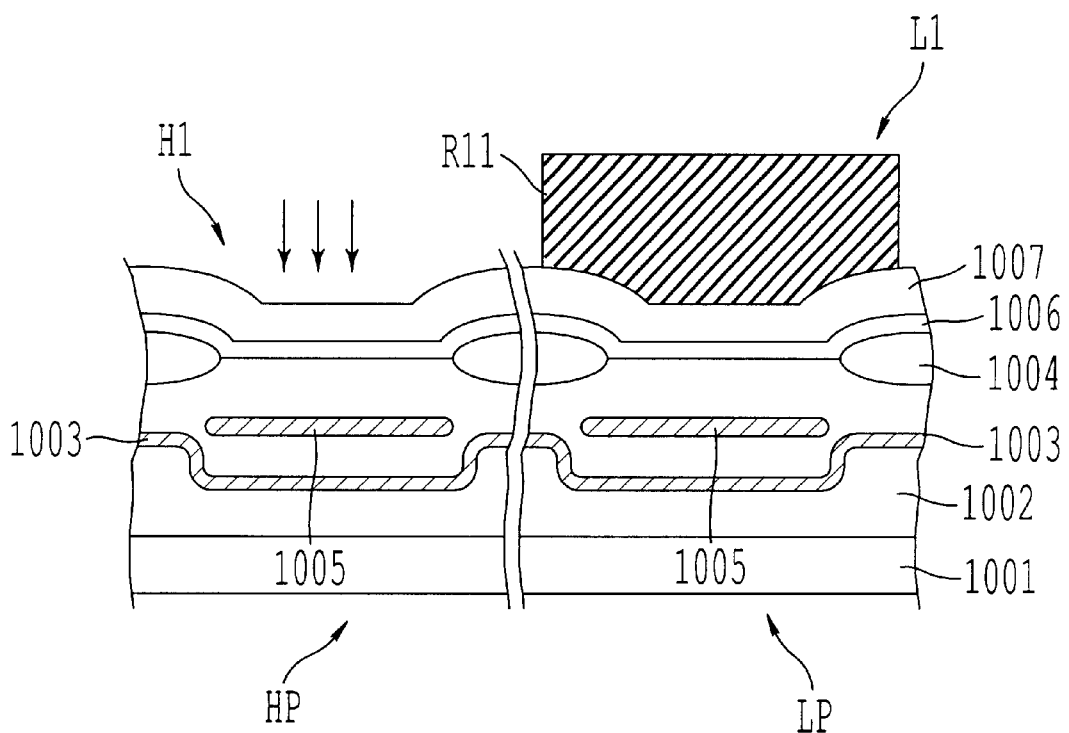
FIG. 61 is a diagram showing a manufacturing step according to the fifth preferred embodiment of the present invention.

More specifically, after the step shown in FIG. 59, a step shown in FIG. 61 may be executed so as to implant impurity ions into the polysilicon layer 1007 on the MOS transistor H1. In FIG. 61, a resist mask R11 is formed so as to cover the polysilicon layer 1007 of the low voltage circuit portion LP from above. If impurity ions are implanted from above, the impurity ions are implanted into the polysilicon layer 1007 of the high-voltage circuit portion HP. With respect to the impurity, when the MOS transistor H1 needs to be the N-channel type, phosphorus (P) ions, for instance, are implanted with the energy of 30 keV and at a dose of $5 \times 10^{14}/cm^2$. On the other hand, when the MOS transistor H1 needs to be the P-channel type, boron (B), for instance, are implanted with the energy of 10 keV and at a dose of $5 \times 10^{14}/cm^2$.

By implanting the impurity into the polysilicon layer 1007 of the high-voltage circuit portion HP as well during an operation of the MOS transistor H1, it is possible to adjust the range of a depletion layer which is formed within the gate electrode depending on the impurity concentration, and hence, to adjust the effective thickness of the oxide film.

<5-4. First Modification>

Although the foregoing has described the fifth preferred embodiment of the present invention in relation to an example where impurity ions are implanted directly into the polysilicon layer 1007 on the MOS transistor H1 of the high-voltage circuit portion HP, impurity ions may be implanted by a method described below.

Figure 62:
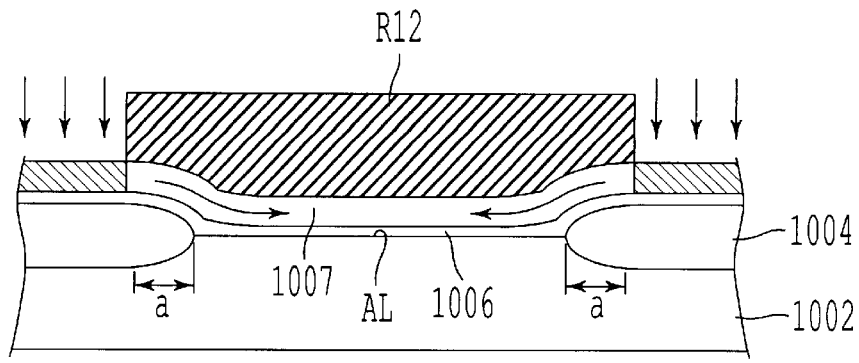
FIG. 62 is a diagram showing a first modification of the manufacturing step according to the fifth preferred embodiment of the present invention.

FIG. 62 shows a principal portion of the high-voltage circuit portion HP. FIG. 62 omits the channel cut layer 1003 and the channel dope layer 1005.

In FIG. 62, a resist mask R12 is formed on the polysilicon layer 1007 of an active region AL which is surrounded from the both sides of the LOCOS layer 1004.

In this condition, impurity ions- are implanted into the polysilicon layer 1007 which is not covered with the resist mask R12 from above. A position at which impurity ions are implanted is separated from an edge portion of the active region AL by a distance a, as shown in FIG. 62.

After this step, if annealing at 850° C. is performed for 30 minutes, the implanted impurity gets diffused within the polysilicon layer 1007 in a direction which is indicated at the arrows, and the impurity is introduced into the polysilicon layer 1007 on the active region AL.

It is possible to determine the impurity concentration within the polysilicon layer 1007 on the active region AL by appropriately selecting the distance a. In short, the impurity concentration is set high when the distance a is shortened, while the impurity concentration is set low when the distance a is increased. An example of the distance a is about 1 μm.

Thus, it is possible to adjust the impurity concentration finer by introducing an impurity into the polysilicon layer 1007 on the active region AL by thermal diffusion than where impurity ions are implanted directly.

<5-5. Second Modification>

Although the foregoing has described the fifth preferred embodiment of the present invention in relation to an example where impurity ions are implanted into the entire region (including the region on the LOCOS layer 1004) of the polysilicon layer 1007 on the active region on the MOS transistor H1 of the high-voltage circuit portion HP, impurity ions may be implemented locally into a central portion of the polysilicon layer 1007 as described below.

Figure 63:
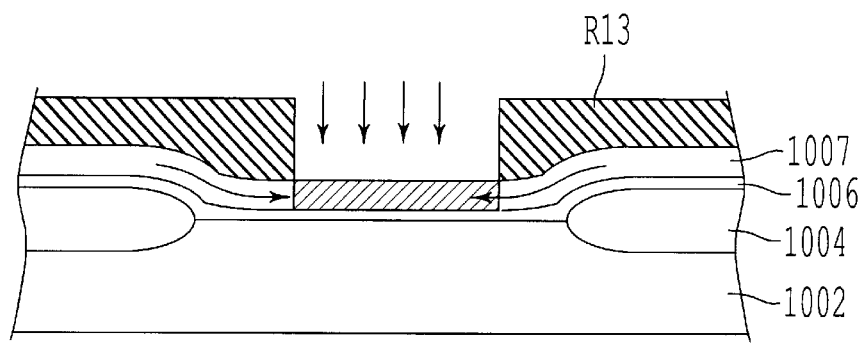
FIG. 63 is a diagram showing a second modification of the mansfacturing step according to the fifth preferred embodiment of the present invention.

FIG. 63 shows a principal portion of the high-voltage circuit portion HP. FIG. 63 omits the channel cut layer 1003 and the channel dope layer 1005.

In FIG. 63, a resist mask R13 is formed in such a manner that there is an opening portion on the polysilicon layer 1007 at the central portion of the active region AL which is surrounded from the both sides of the LOCOS layer 1004.

In this condition, when impurity ions are implanted into the polysilicon layer 1007 which is not covered with the resist mask R13 from above, the impurity is introduced into the polysilicon layer 1007 at the central portion of the active region AL.

After this step, if annealing at 850° C. is performed for 30 minutes, the implanted impurity gets diffused within the polysilicon layer 1007 in a direction which is indicated at the arrows, and the impurity is introduced also into the polysilicon layer 1007 on the edge portion of the active region AL.

At this stage, an impurity layer of a relatively high impurity concentration is formed within the polysilicon layer 1007 at the central portion of the active region AL, while an impurity layer of a relatively low impurity concentration is formed within the polysilicon layer 1007 on the edge portion of the active region AL.

Hence, during an operation of the MOS transistor H1, the range in which a depletion layer is formed is small within the polysilicon layer 1007 at the central portion of the active region AL, and the effective thickness of the oxide film does not increase. However, in the polysilicon layer 1007 on the edge portion of the active region AL, the range in which a depletion layer is formed becomes large and the effective thickness of the oxide film increases, which in turn partially increases the threshold value.

Although adopting such a structure does not create many advantages in a MOS transistor which is formed on a bulk silicon substrate, in a MOS transistor which is formed on an SOI (silicon on insulator) substrate, adopting such a structure solves a problem of a deteriorated threshold value due to the structure of the edge portion of the active region AL.

Figure 64:
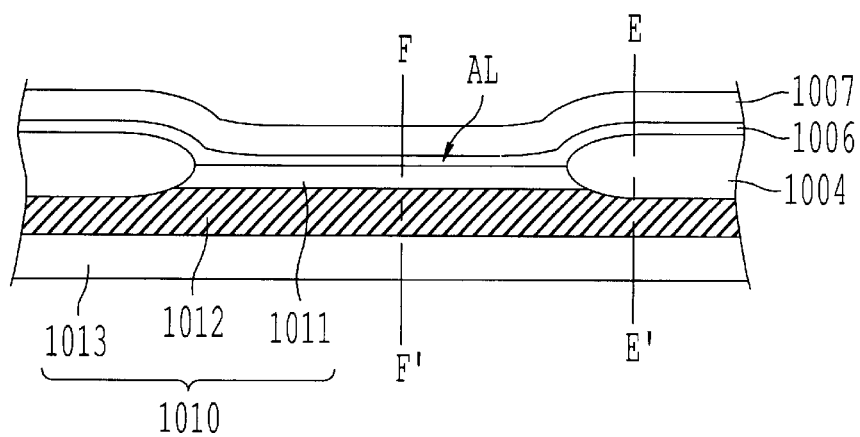
FIG. 64 is a diagram showing an example of an application of the second modification of the manufacturing step according to the fifth preferred embodiment of the present invention.

FIG. 64 shows a MOS transistor which is formed on an SOI (silicon on insulator) substrate. The SOI substrate 1010 is formed by a silicon substrate 1013, a buried insulation film 1012 which is formed on the silicon substrate 1013, and an SOI layer which is formed on the buried insulation film 1012, and forms a MOS transistor formed on an SOI layer 1011. The SOI layer 1011 has a thin thickness. As shown in a portion which is indicated at E–E' line, in particular, in FIG. 64, in the edge portion of the active region AL, the SOI layer 1011 is extremely thin. The threshold value of the MOS transistor in this portion decreases lower than in other portion (which is indicated at F–F' line). Hence, there is a problem that the threshold value of the MOS transistor as a whole becomes low.

However, according to the present invention, the range in which a depletion layer is formed becomes larger within the polysilicon layer 1007 on the edge portion of the active region AL, the effective thickness of the oxide film, and the threshold value is partially increased. Thus, the problem is solved.

<5-6. Third Modification>

Although the foregoing has described the fifth preferred embodiment of the present invention in relation to an example where one layer of the polysilicon layer 1007 is formed on the MOS transistor H1 of the low voltage circuit portion LP and the high-voltage circuit portion HP and impurity ions are implanted into such a polysilicon layer 1007, the polysilicon layer may have a double-layer structure as described below.

Figure 65:
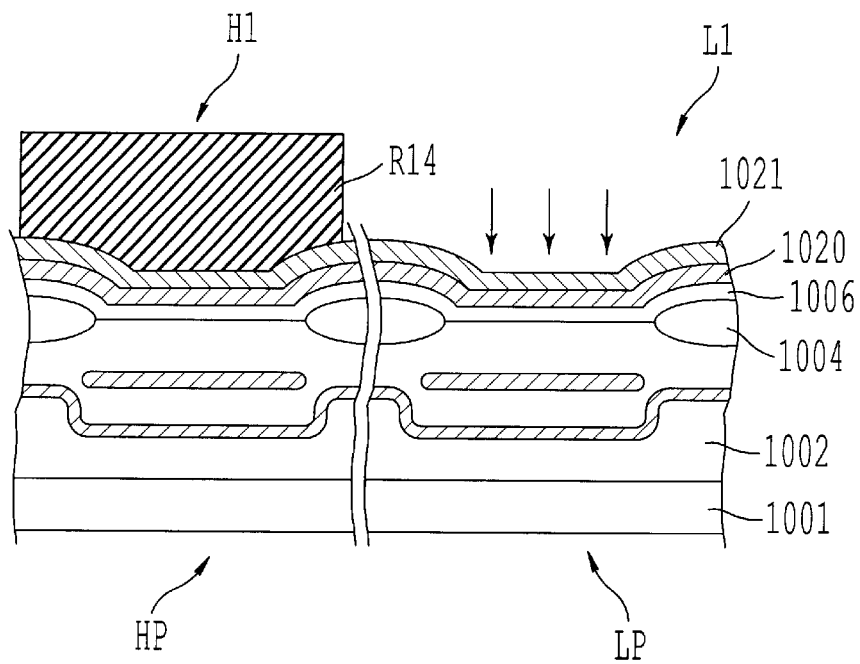
FIG. 65 is a diagram showing a third modification of the manufacturing step according to the fifth preferred embodiment of the present invention.
Figure 66:
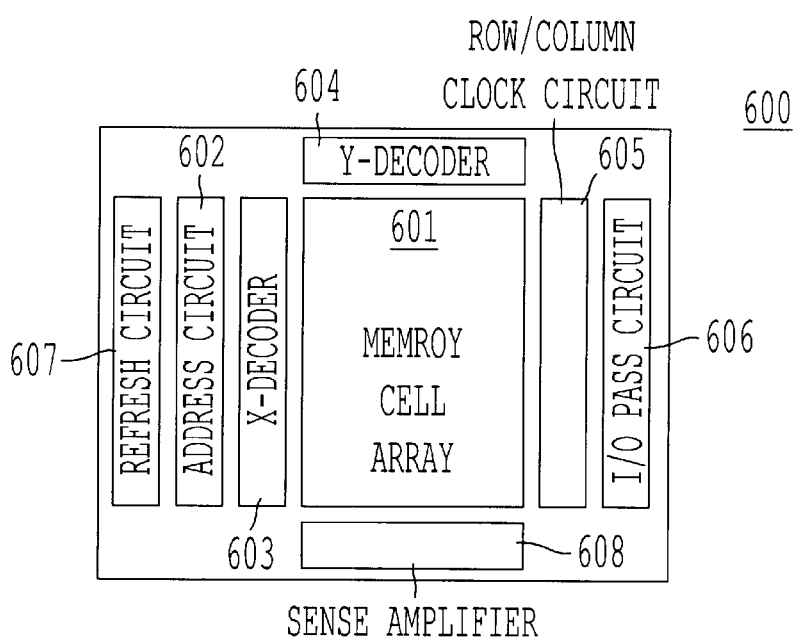
FIG. 66 is a diagram for describing an overall structure of a conventional DRAM.
Figure 67:
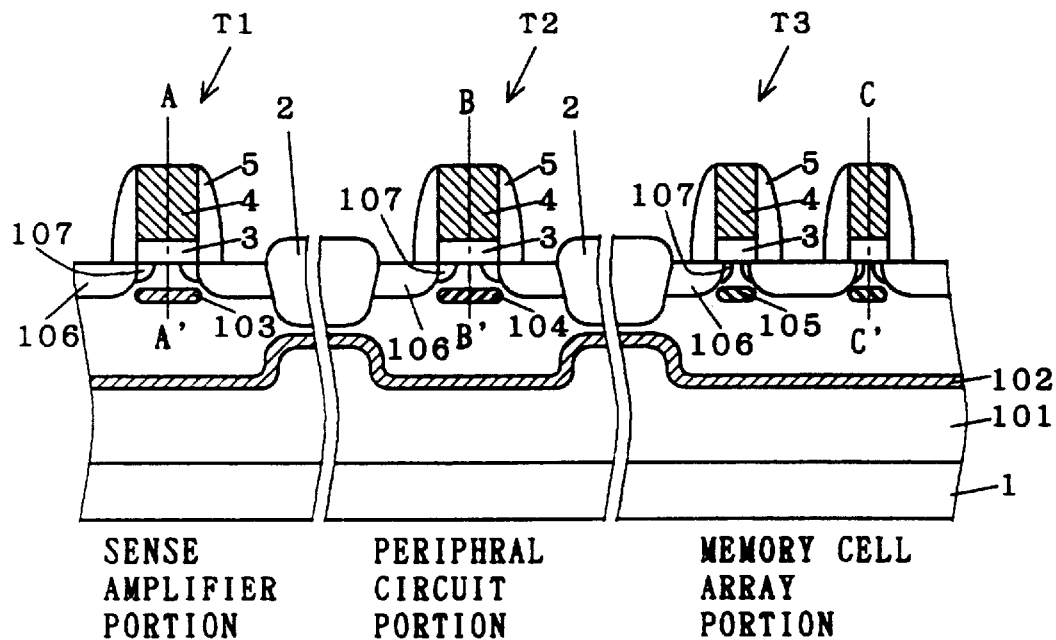
FIG. 67 is a cross sectional view for describing an overall structure of the conventional DRAM.
Figure 68:
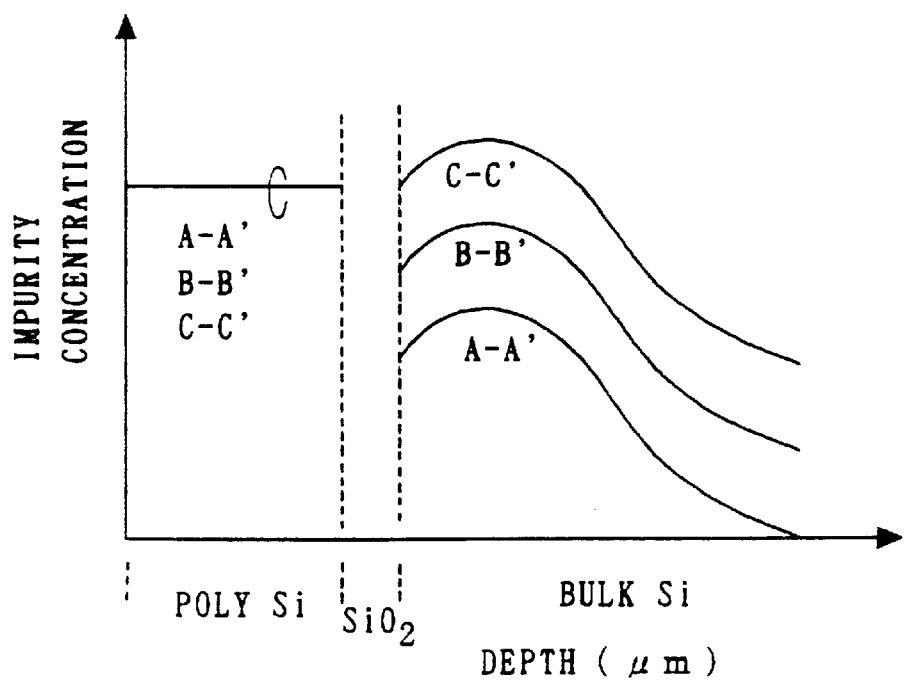
FIG. 68 is a diagram for describing a distribution of an impurity within the conventional DRAM.
Figure 69:
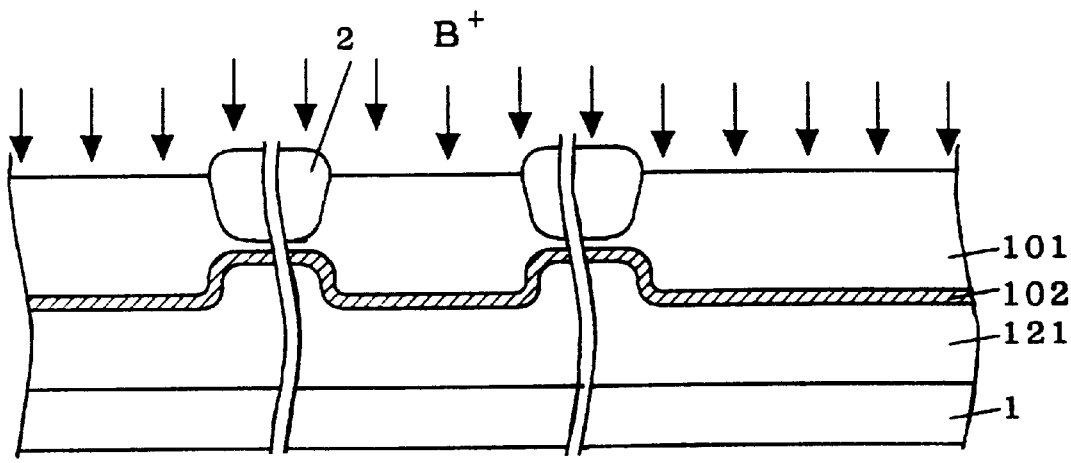
FIGS. 69 to 74 are diagrams showing manufacturing steps of manufacturing the conventional DRAM.
Figure 70:
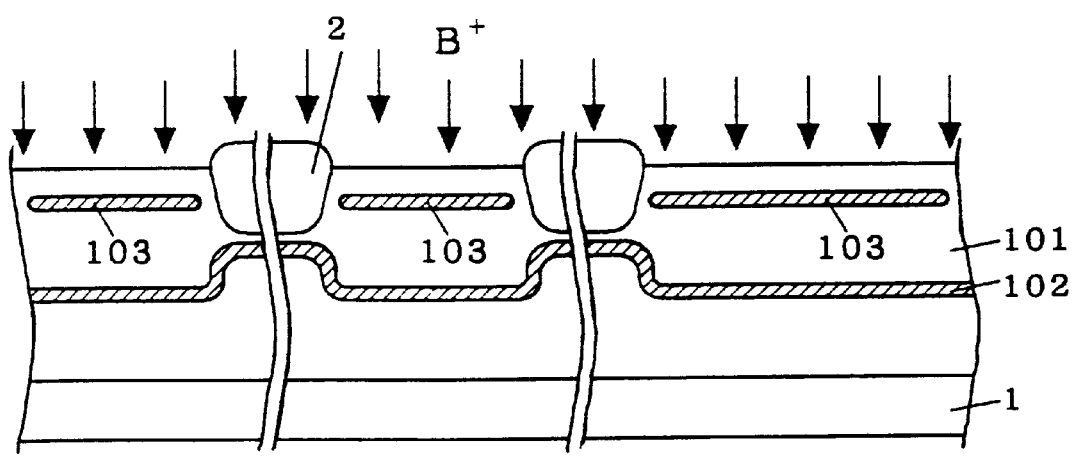
Figure 71:
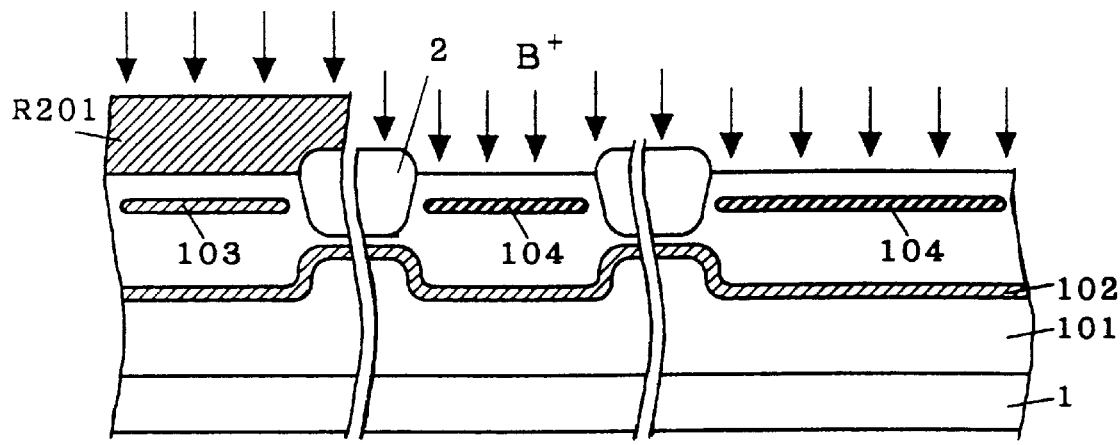
Figure 72:
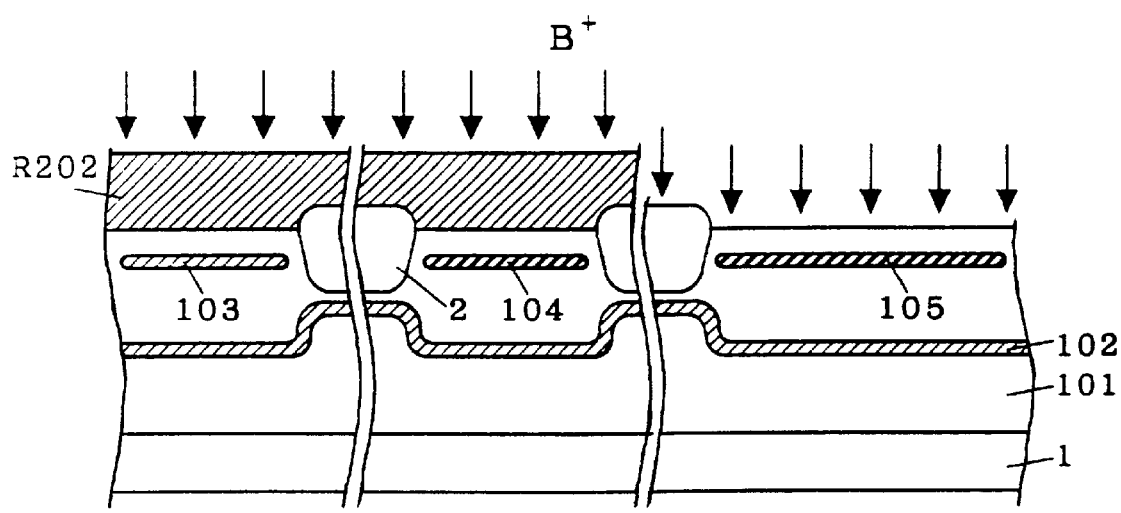
Figure 73:
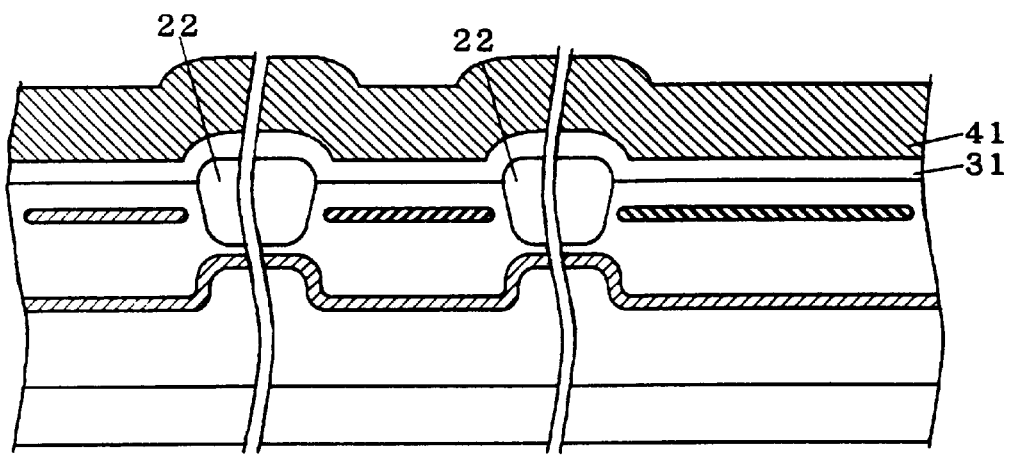
Figure 74:
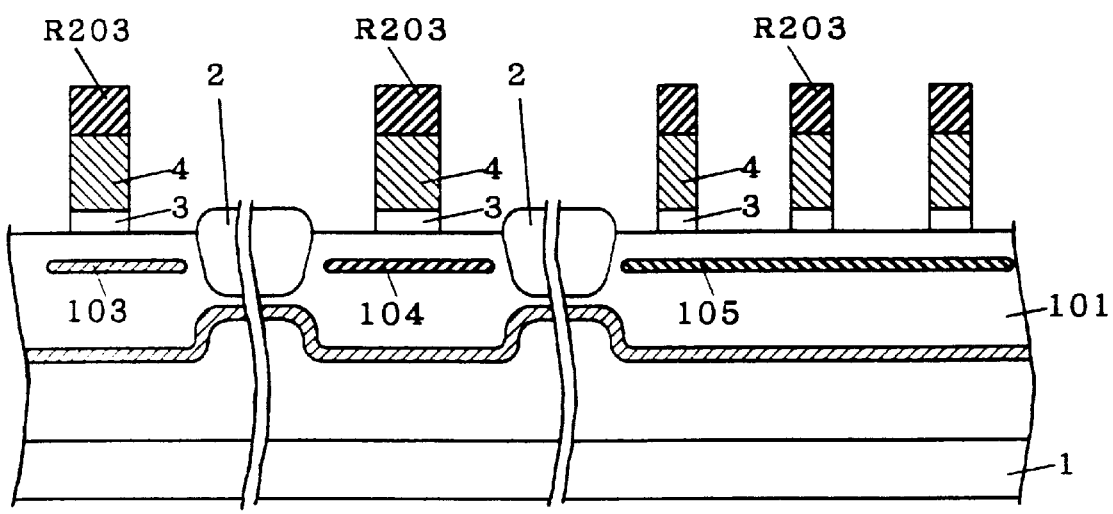
Figure 75:
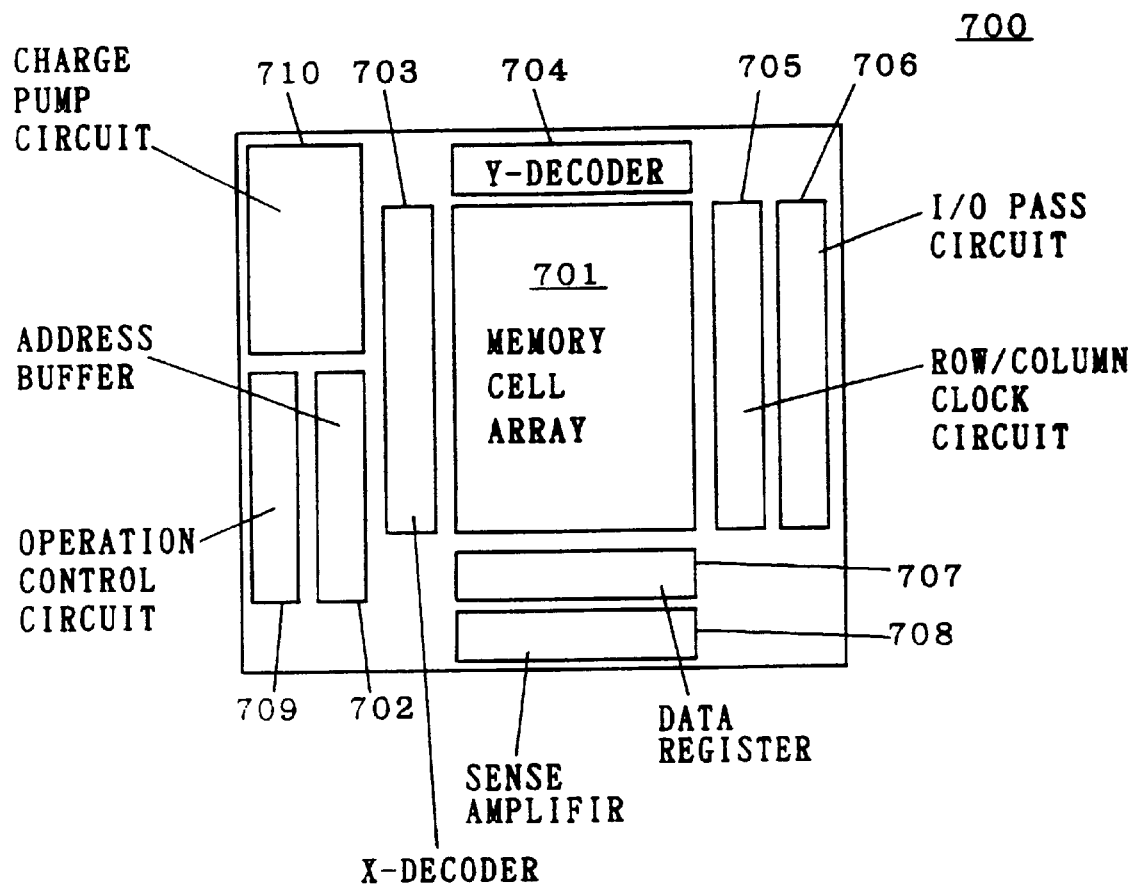
FIG. 75 is a diagram for describing an overall structure of a conventional flash memory.
Figure 76:
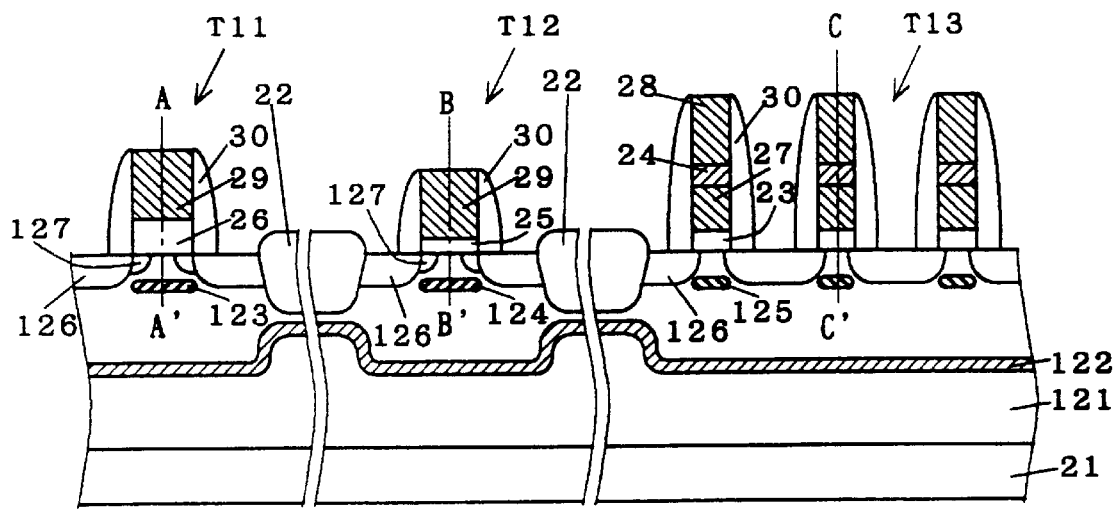
FIG. 76 is a cross sectional view for describing a structure of the conventional flash memory.
Figure 77:
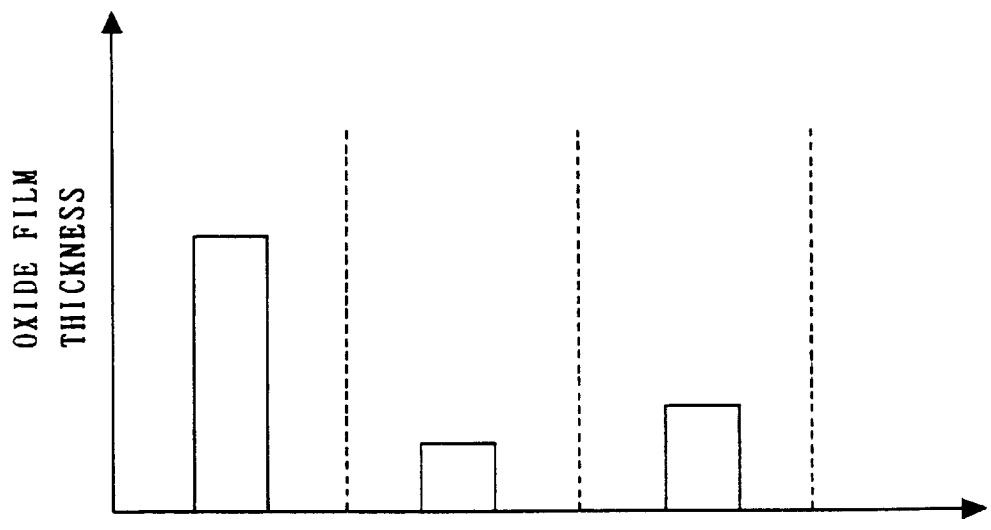
FIG. 77 is a diagram for describing a thickness of a gate oxide film in the conventional flash memory.
Figure 78:
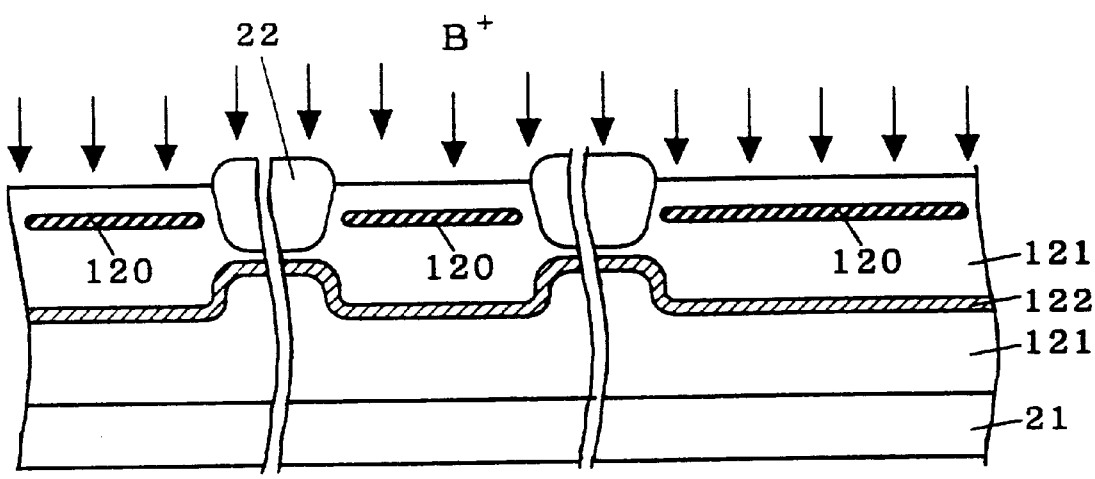
FIGS. 78 to 91 are diagrams showing manufacturing steps of manufacturing the conventional flash memory.
Figure 79:
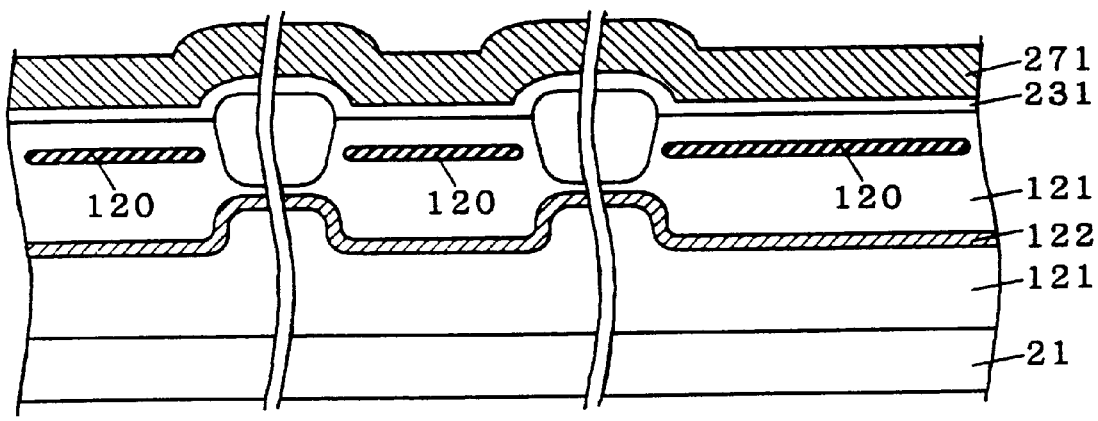
Figure 80:
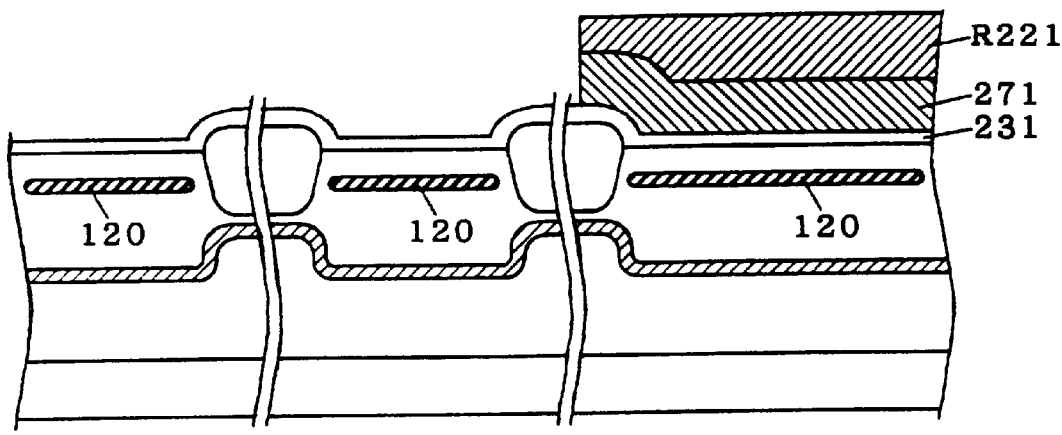
Figure 81:
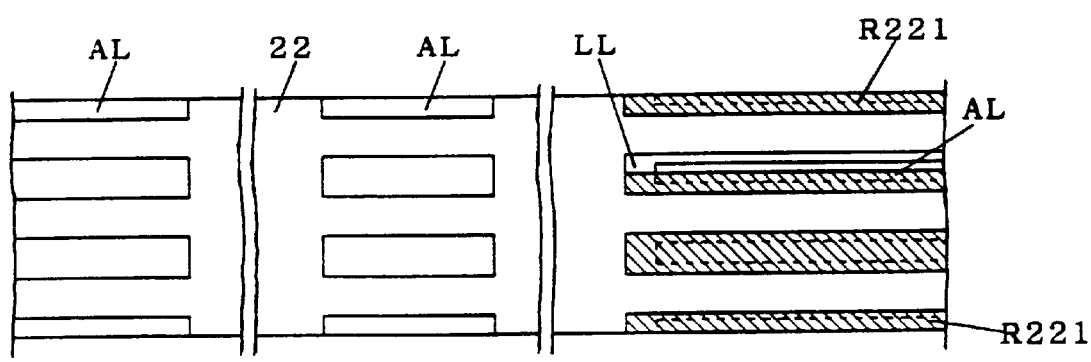
Figure 82:
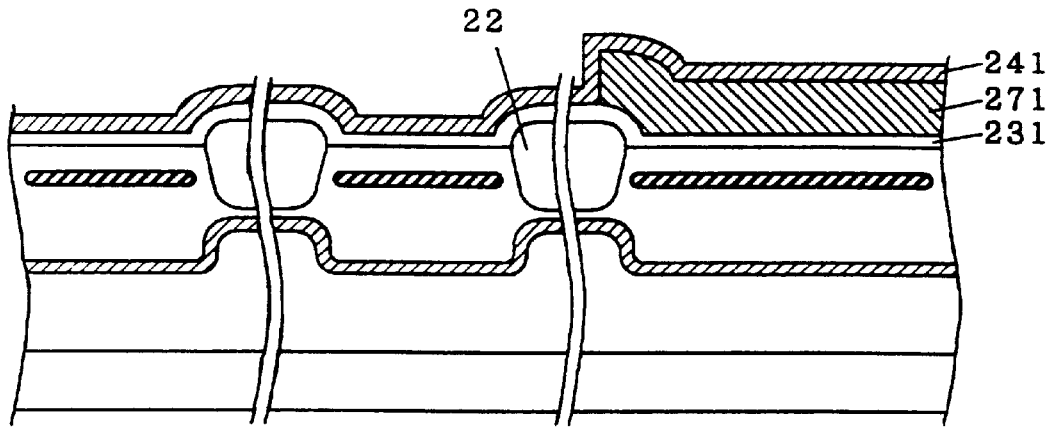
Figure 83:
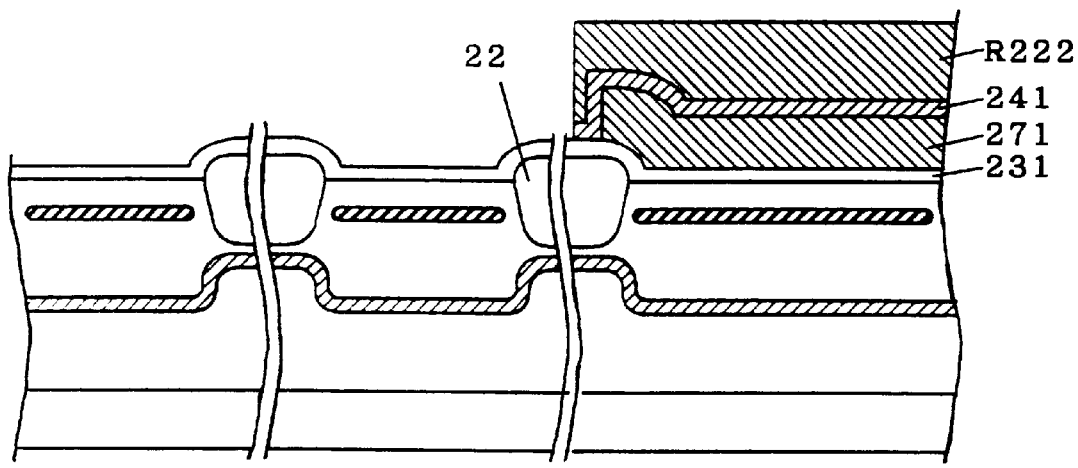
Figure 84:
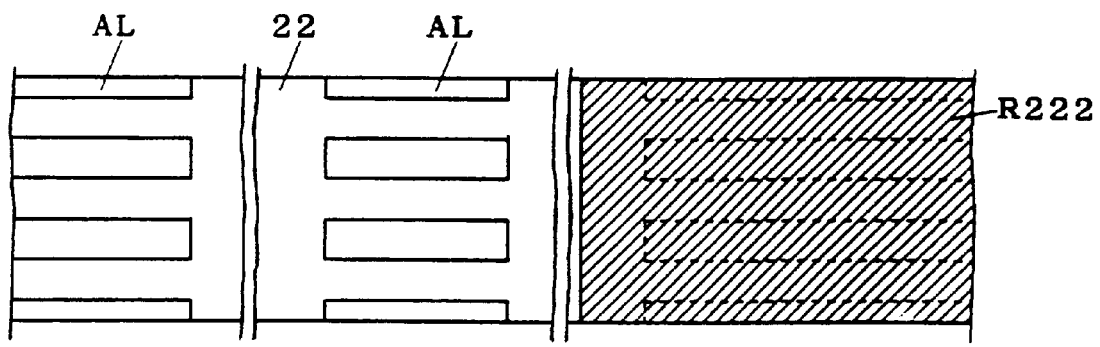
Figure 85:
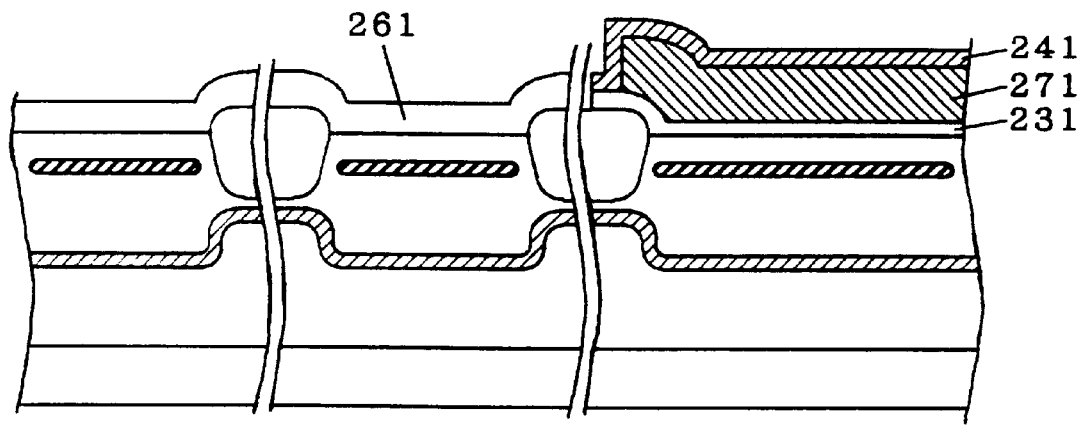
Figure 86:
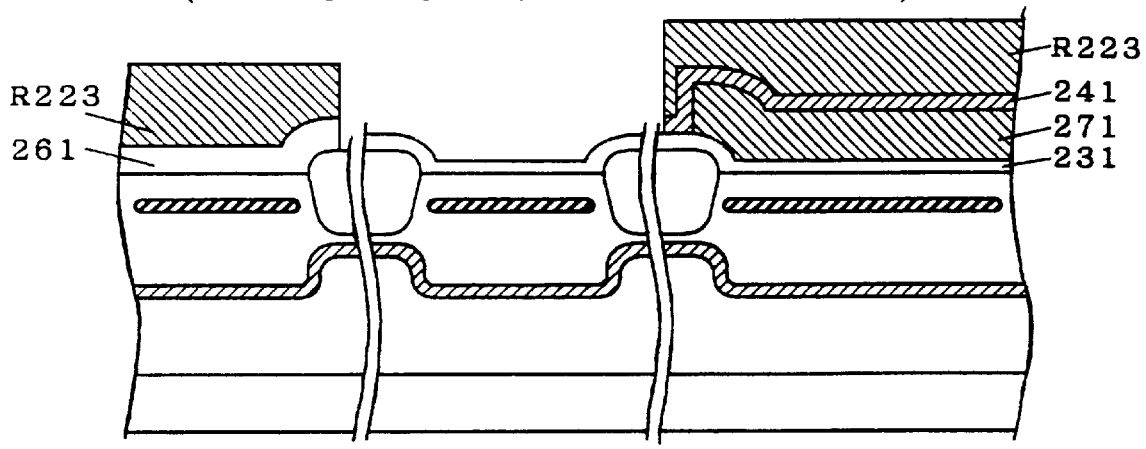
Figure 87:
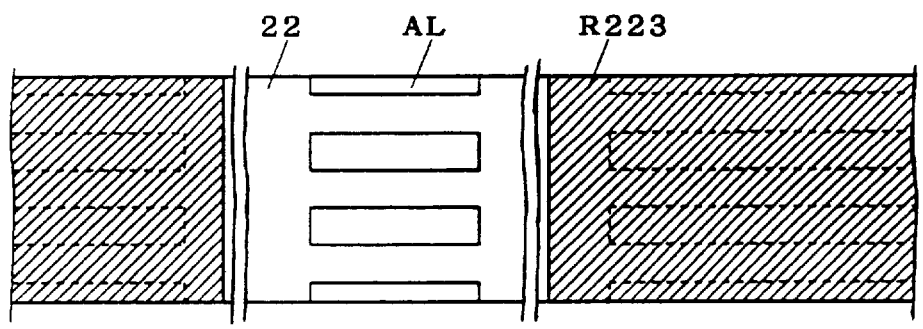
Figure 88:
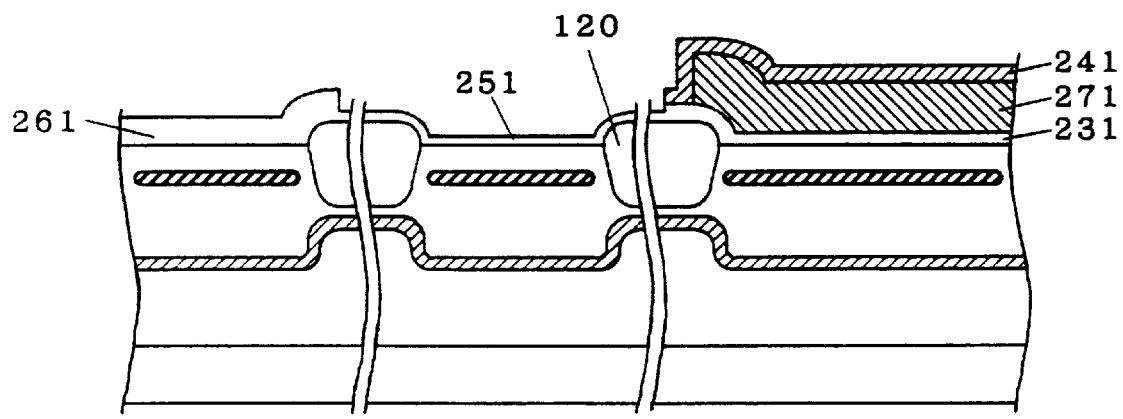
Figure 89:
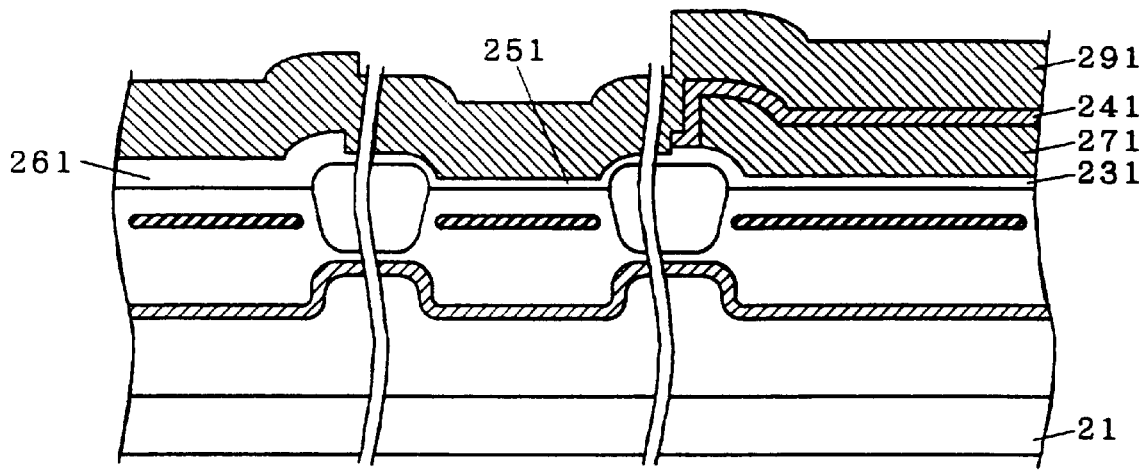
Figure 90:
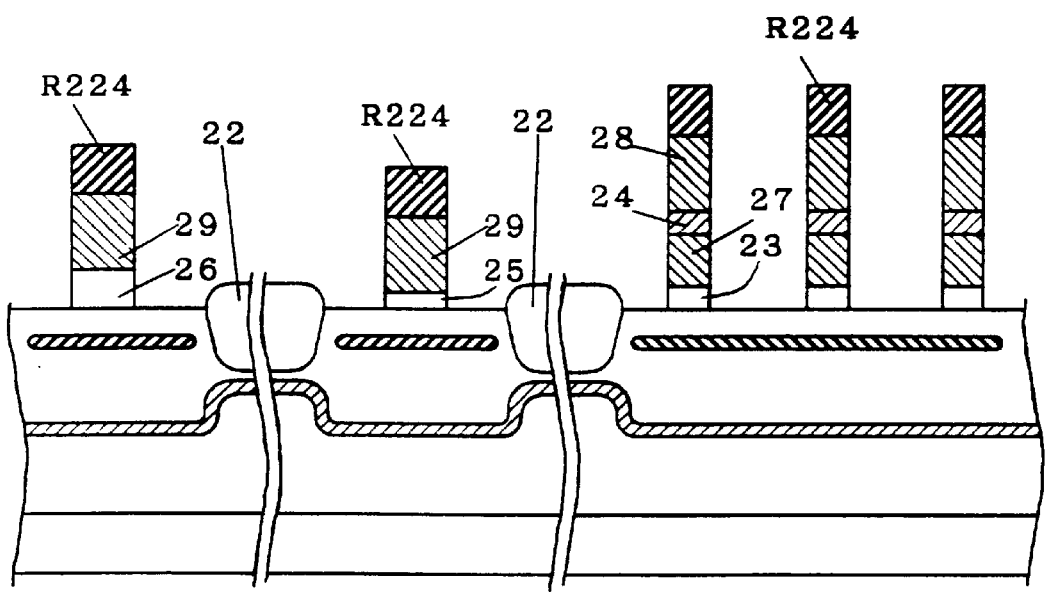
Figure 91:
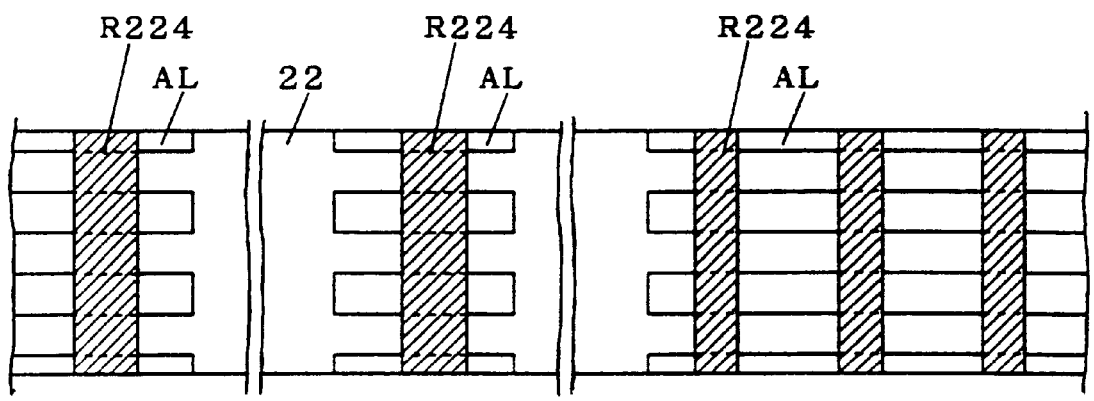
Figure 92:
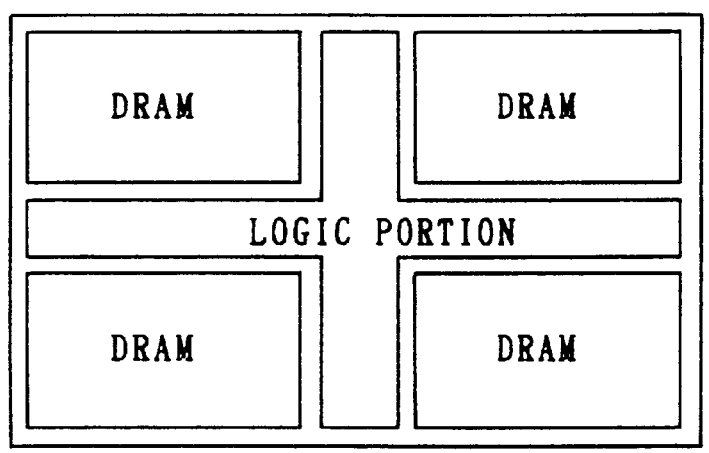
FIG. 92 is a diagram for describing an overall structure of a conventional LOGIC in DRAM.
Figure 93:
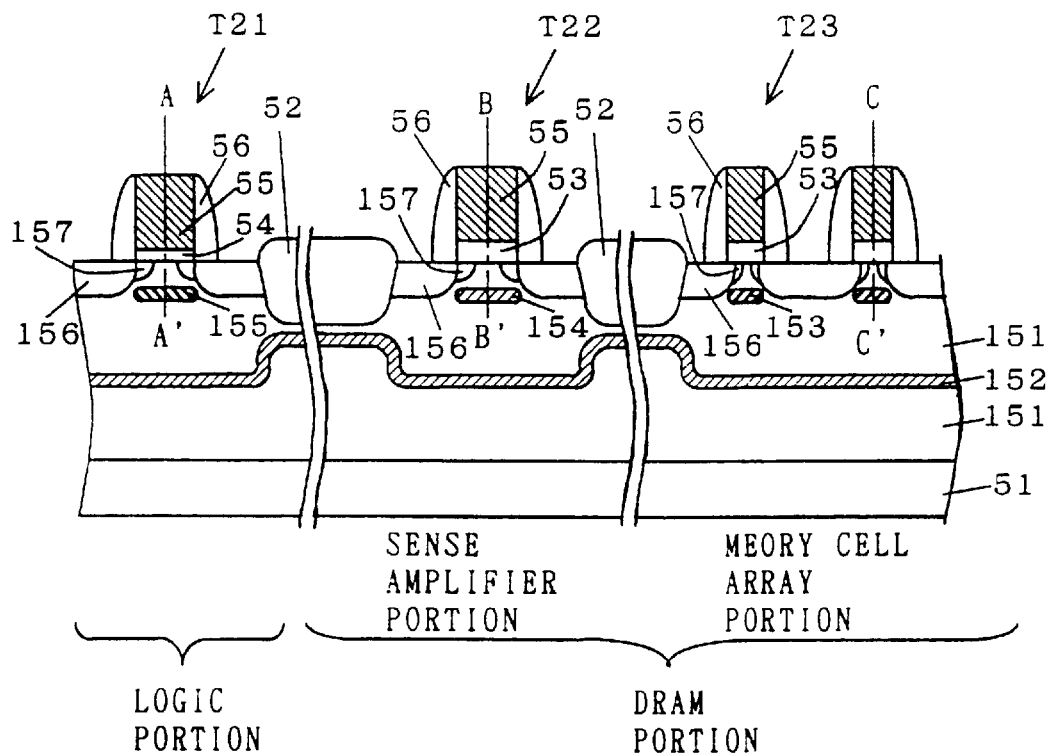
FIG. 93 is a cross sectional view for describing a structure of the conventional LOGIC in DRAM.
Figure 94:
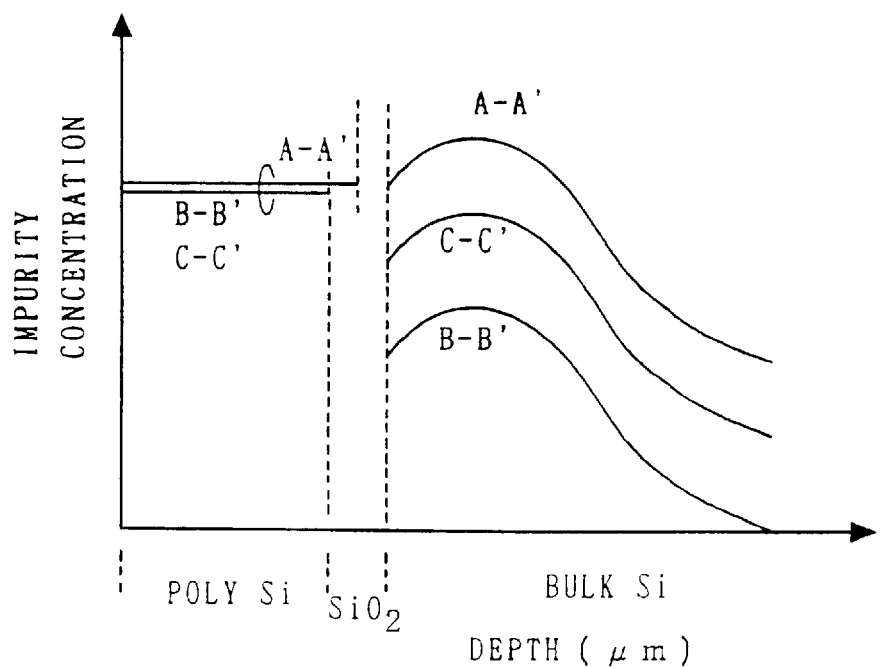
FIG. 94 is a diagram for describing a distribution of an impurity within the conventional LOGIC in DRAM.
Figure 95:
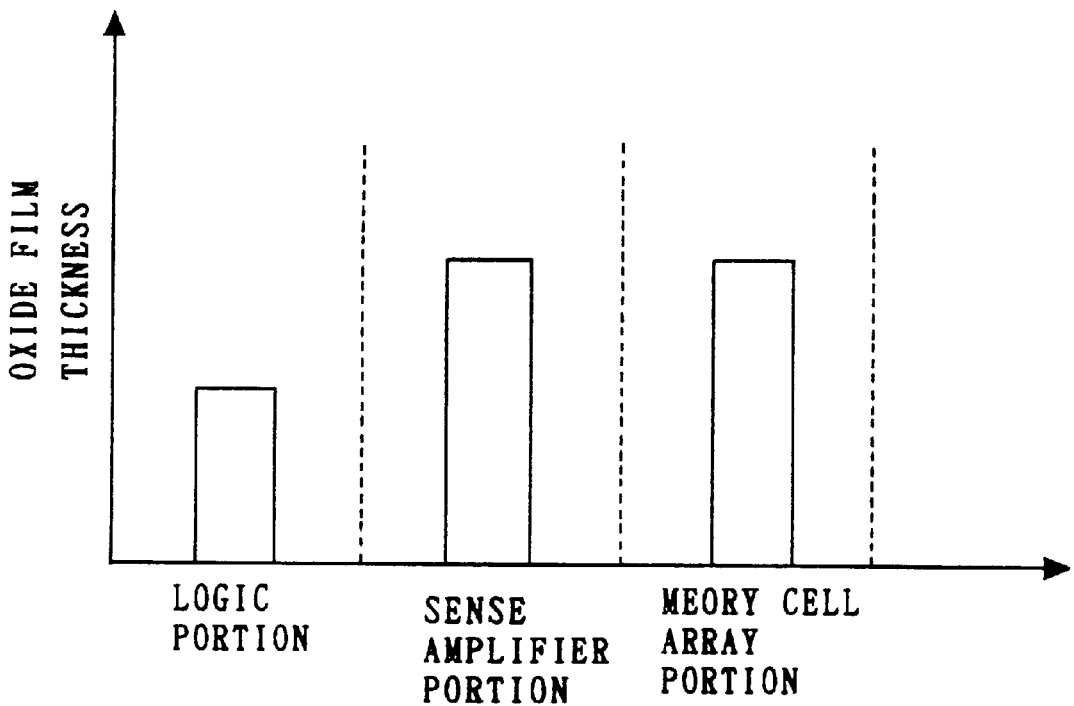
FIG. 95 is a diagram for describing a thickness of a gate oxide film in the conventional LOGIC in DRAM.
Figure 96:
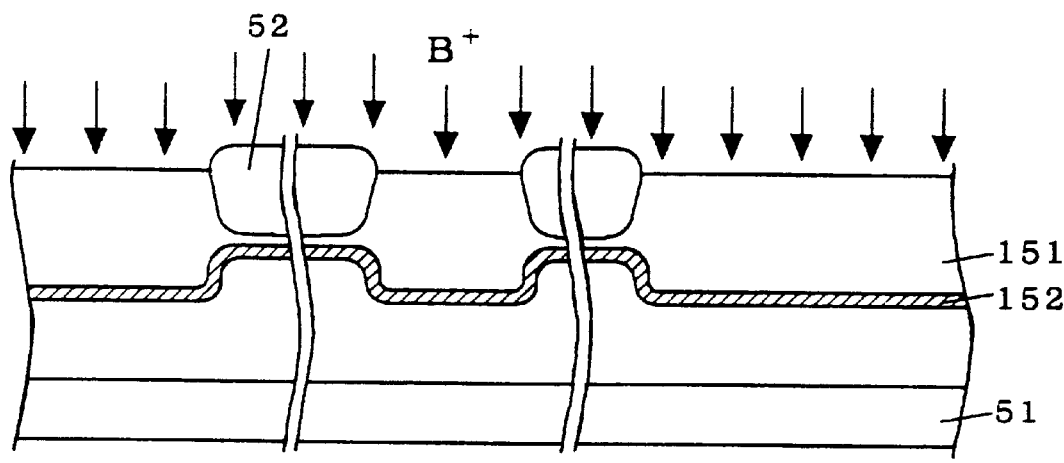
FIGS. 96 to 104 are diagrams showing manufacturing steps of manufacturing the conventional LOGIC in DRAM.
Figure 97:
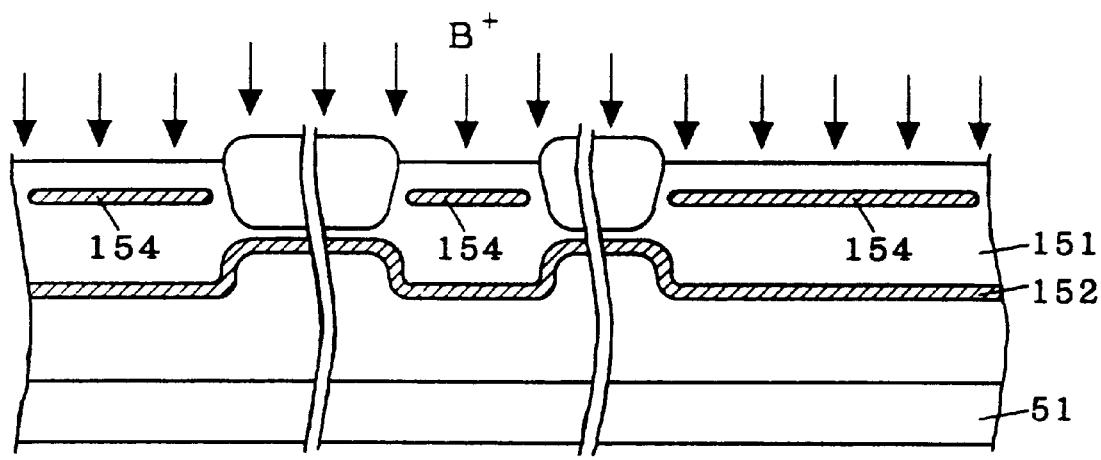
Figure 98:
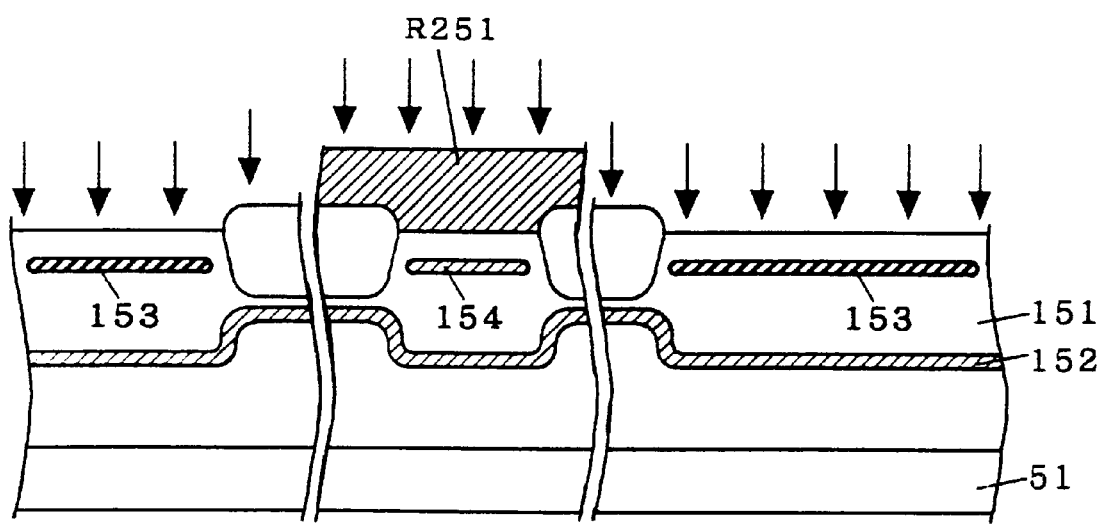
Figure 99:
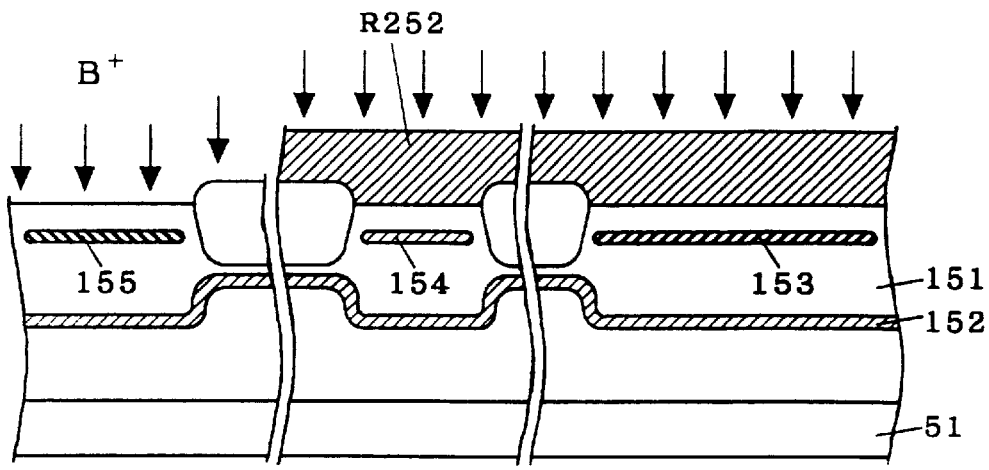
Figure 100:
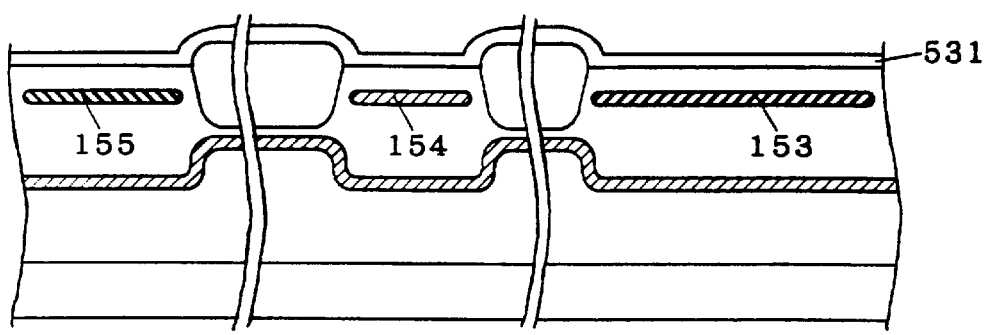
Figure 101:
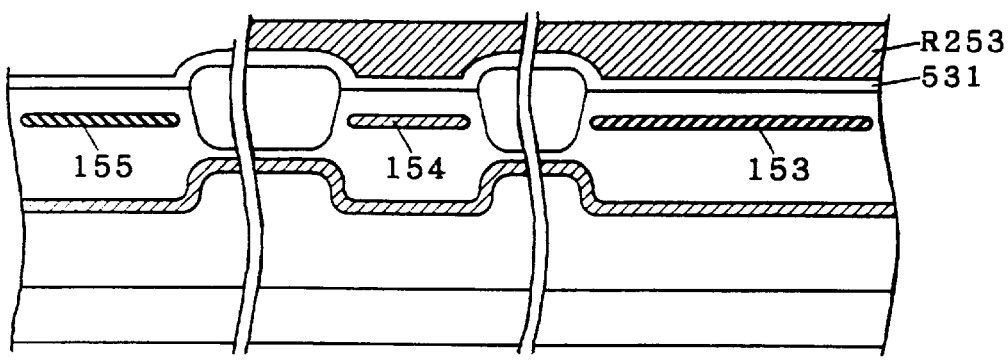
Figure 102:
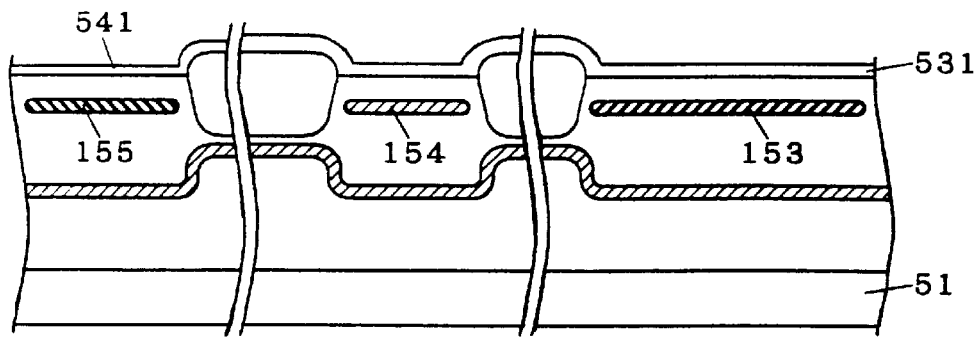
Figure 103:
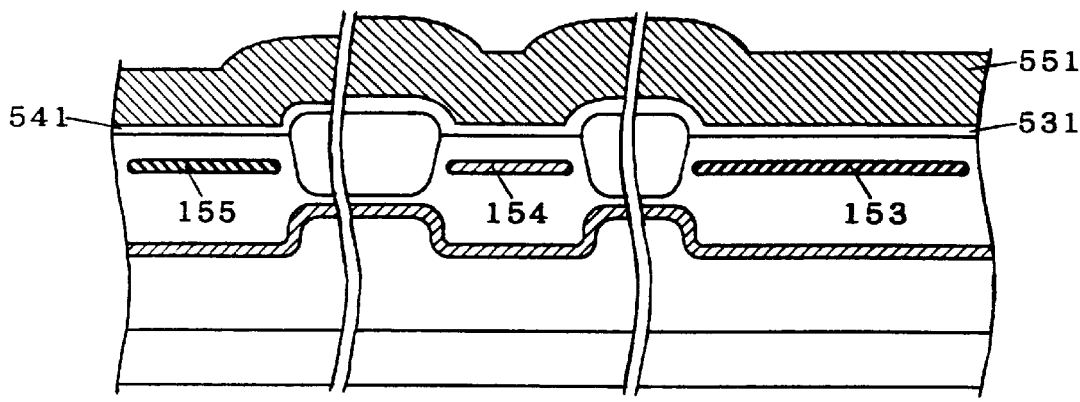
Figure 104:
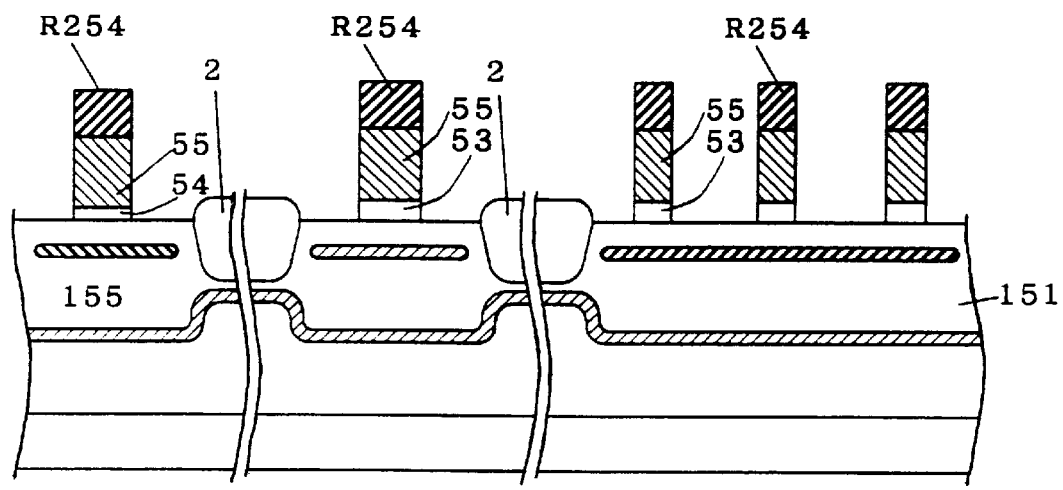
Figure 105:
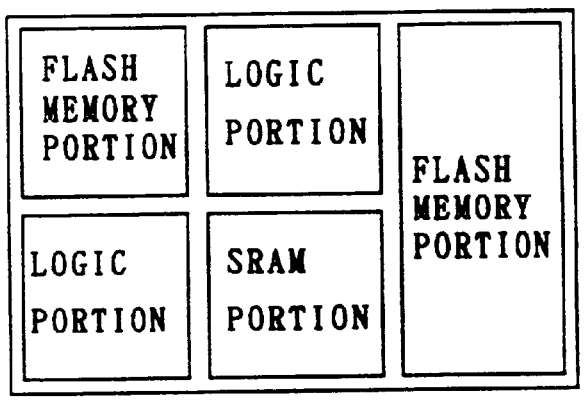
FIG. 105 is a diagram for describing an overall structure of a conventional LOGIC in FLASH.
Figure 106:
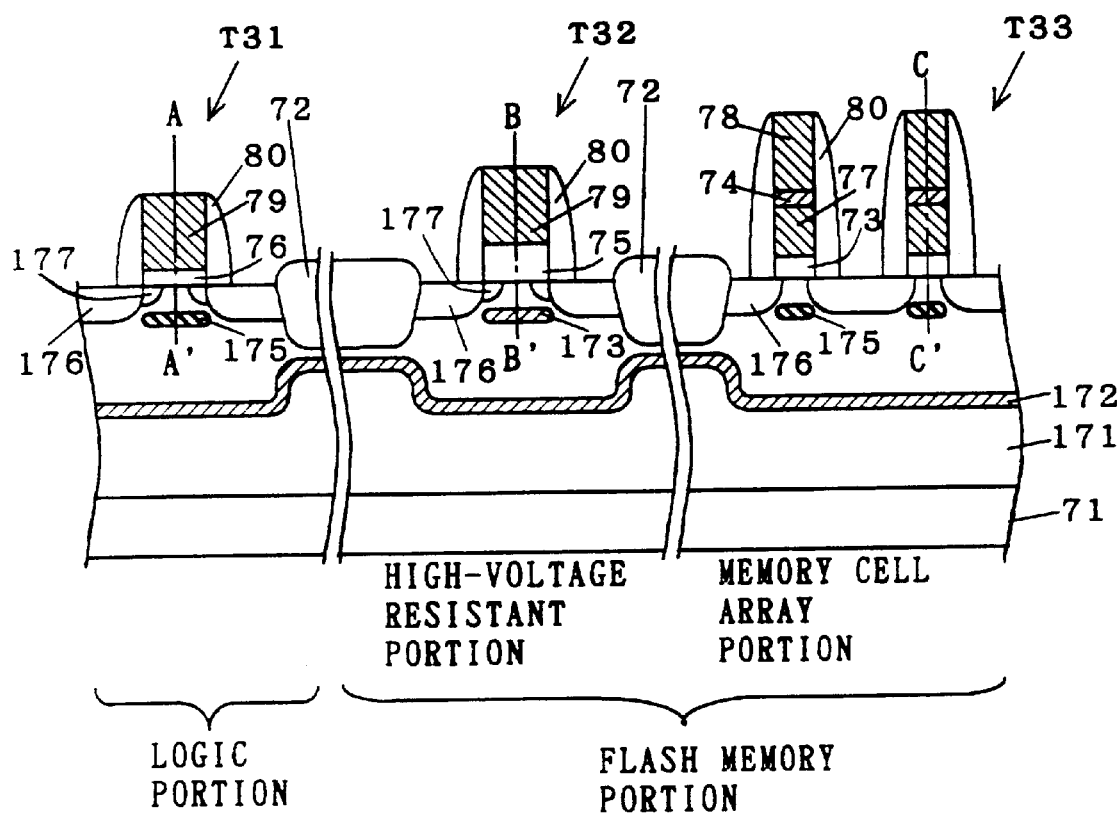
FIG. 106 is a cross sectional view for describing a structure of the conventional LOGIC in FLASH.
Figure 107:
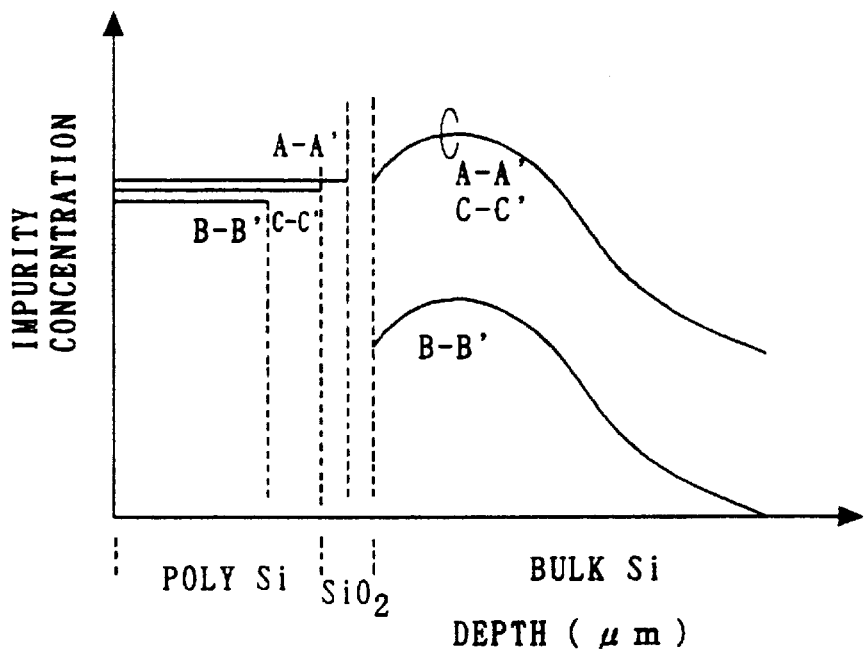
FIG. 107 is a diagram for describing a distribution of an impurity within the conventional LOGIC in FLASH.
Figure 108:
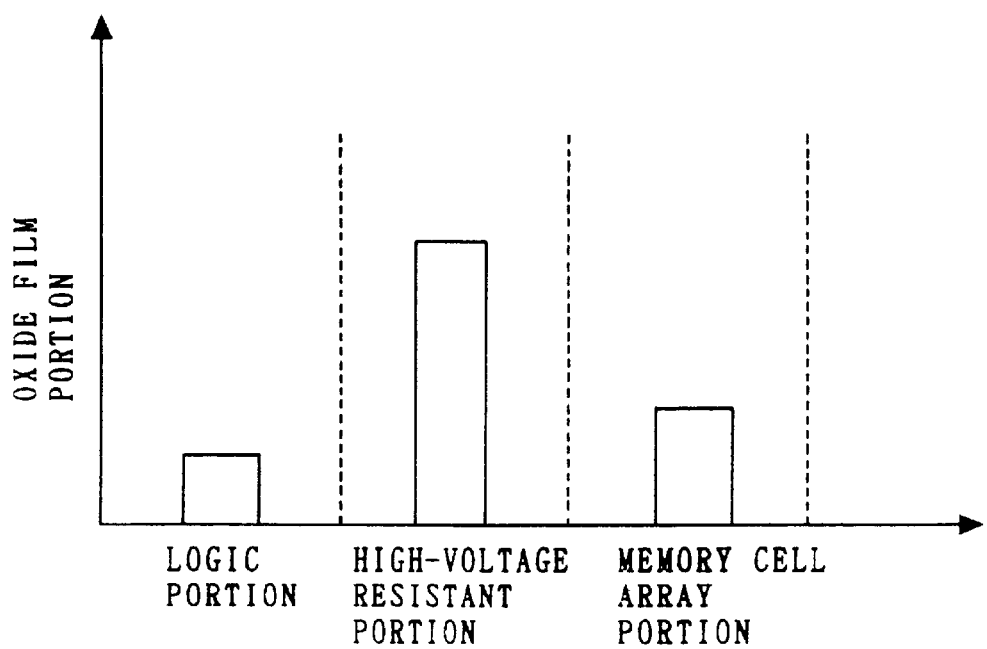
FIG. 108 is a diagram for describing a thickness of a gate oxide film in the conventional LOGIC in FLASH.
Figure 109:
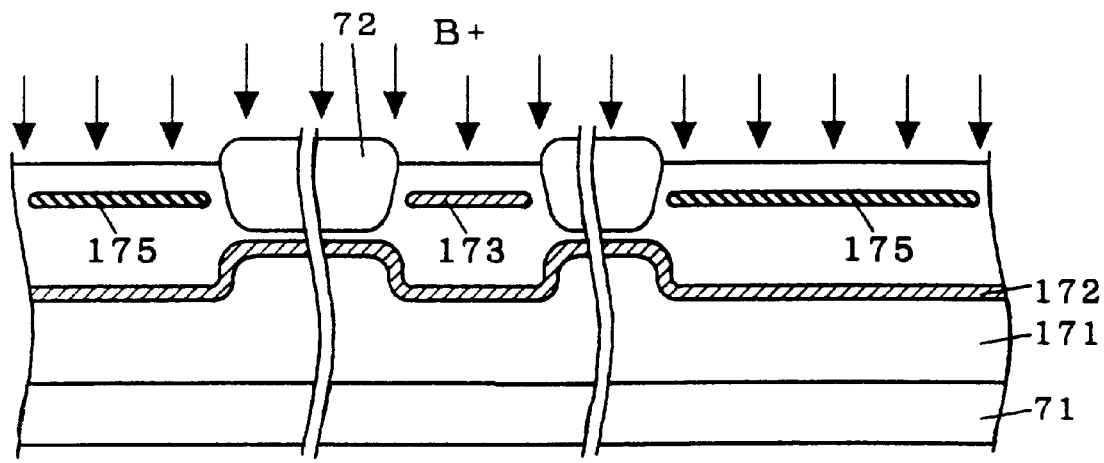
FIGS. 109 to 122 are diagrams showing manufacturing steps of manufacturing the conventional LOGIC in FLASH.
Figure 110:
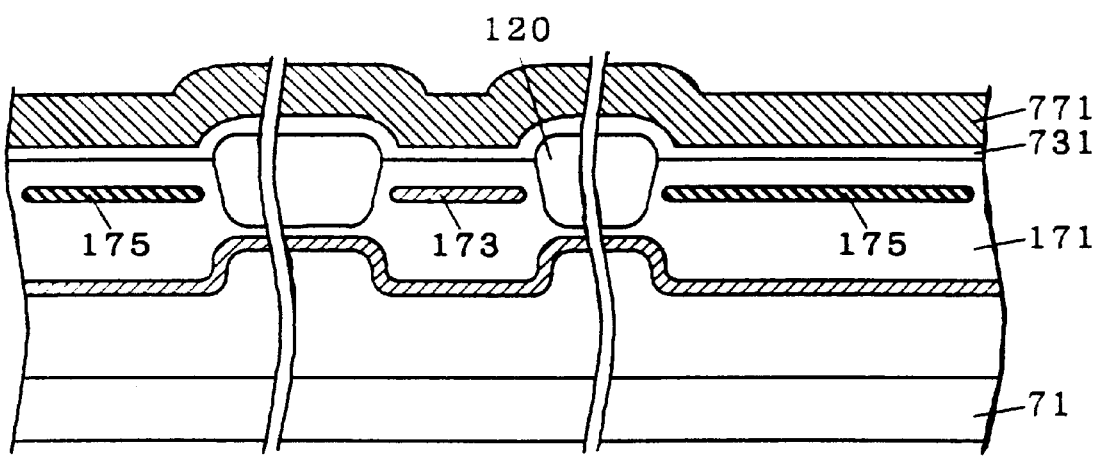
Figure 111:
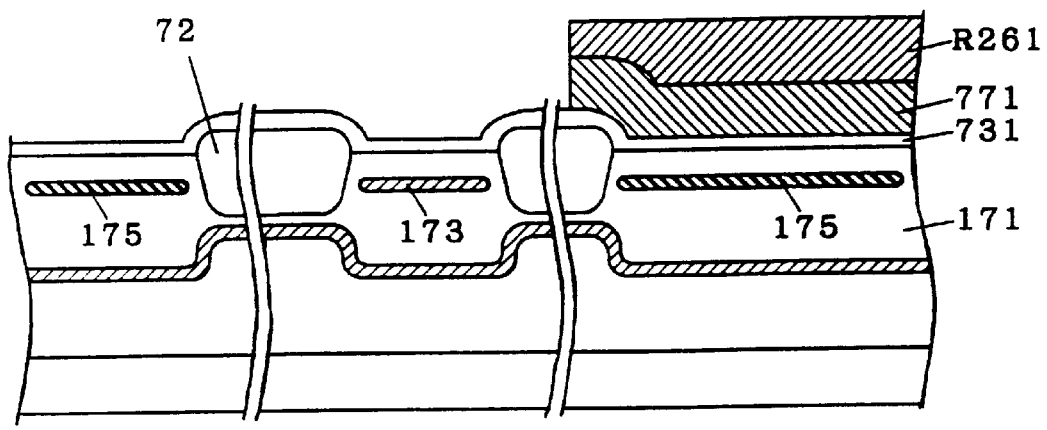
Figure 112:
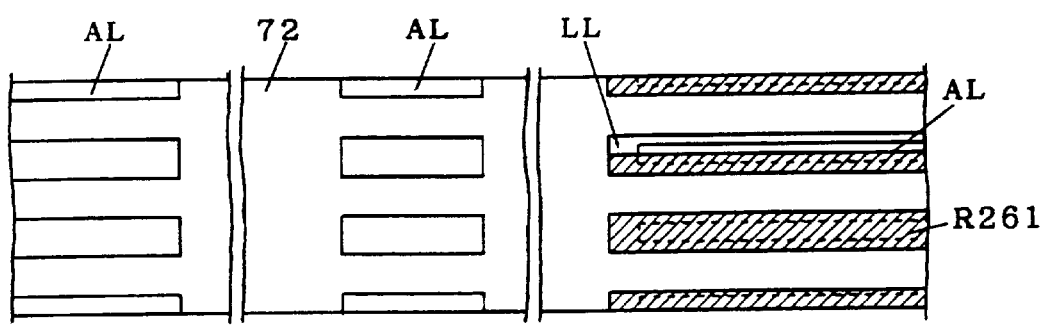
Figure 113:
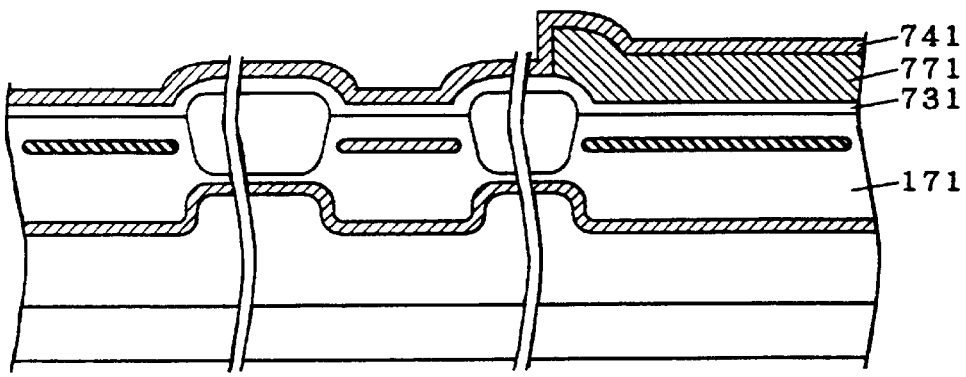
Figure 114:
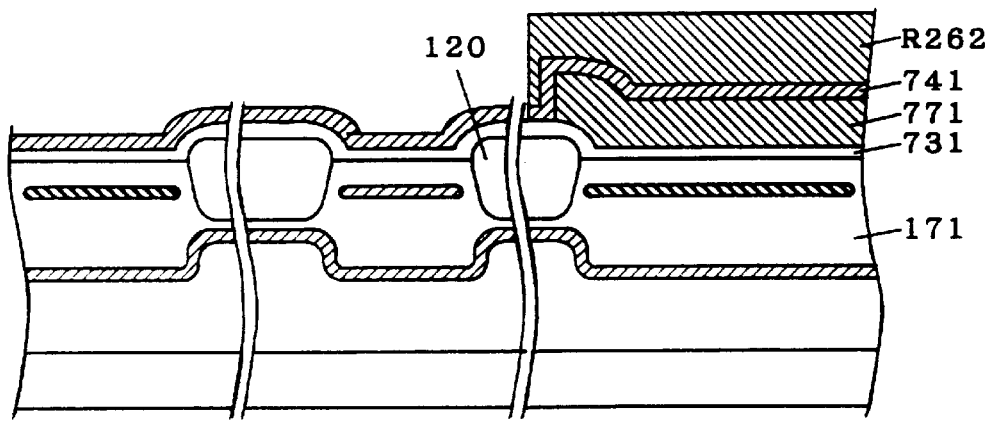
Figure 115:
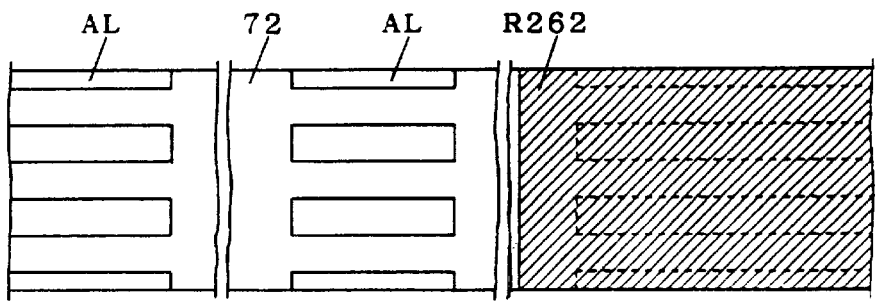
Figure 116:
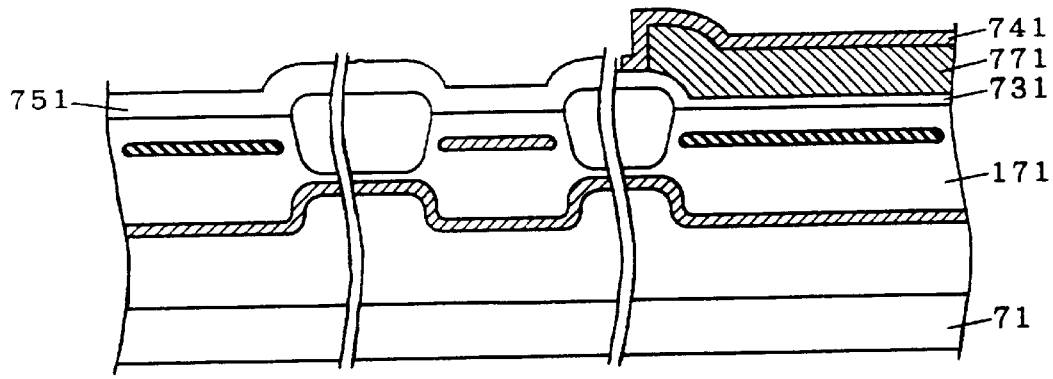
Figure 117:
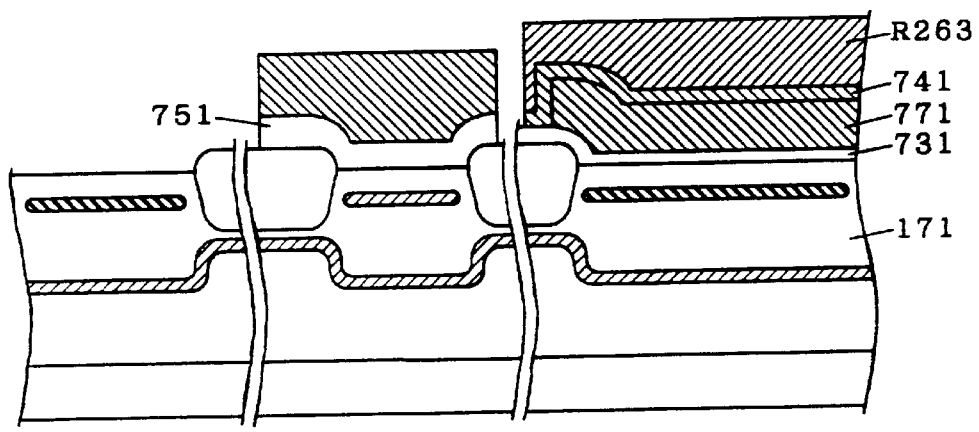
Figure 118:
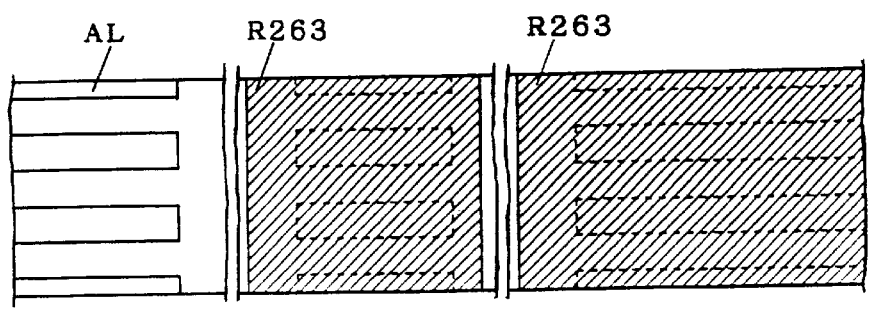
Figure 119:
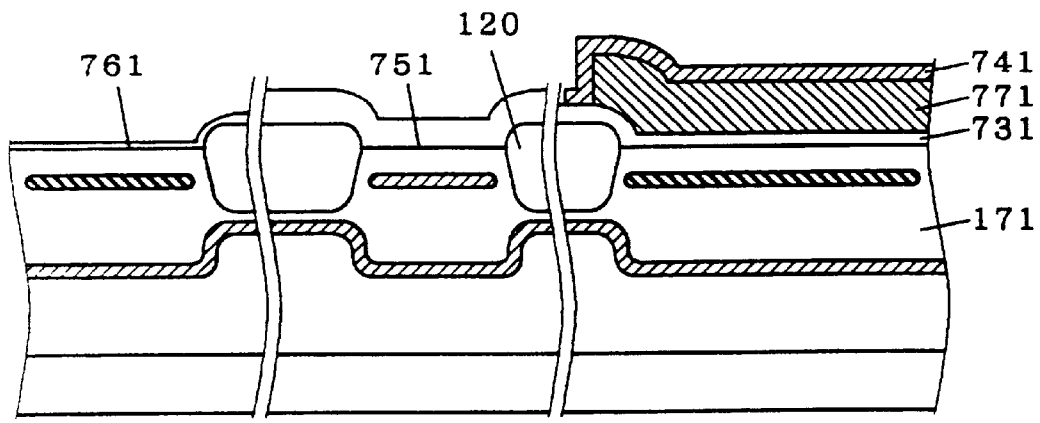
Figure 120:
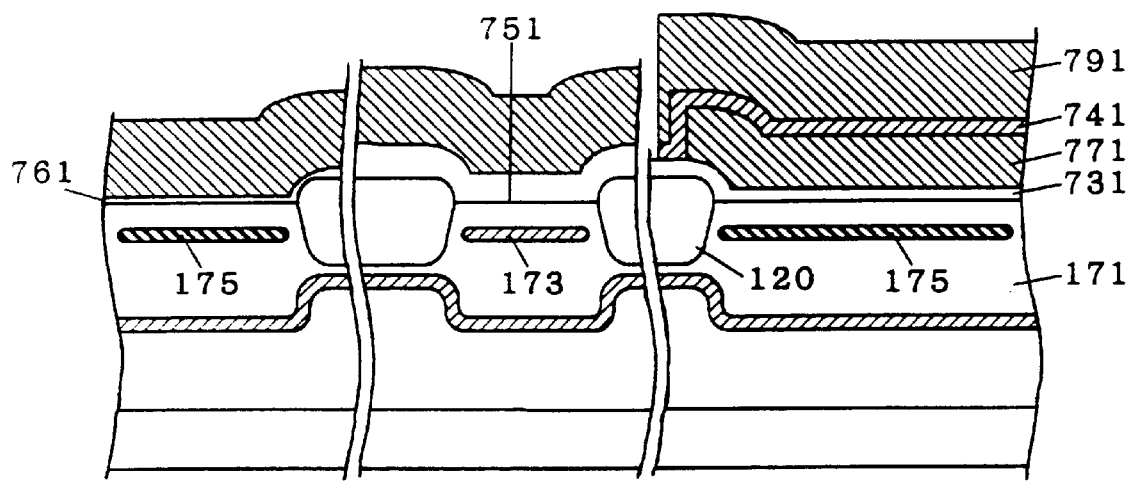
Figure 121:
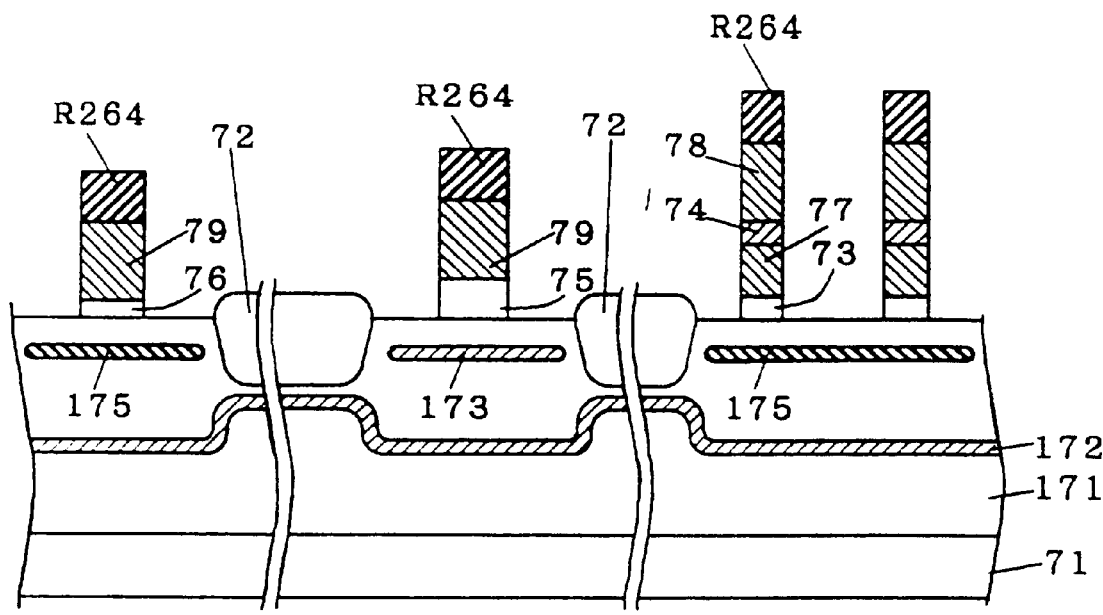
Figure 122:
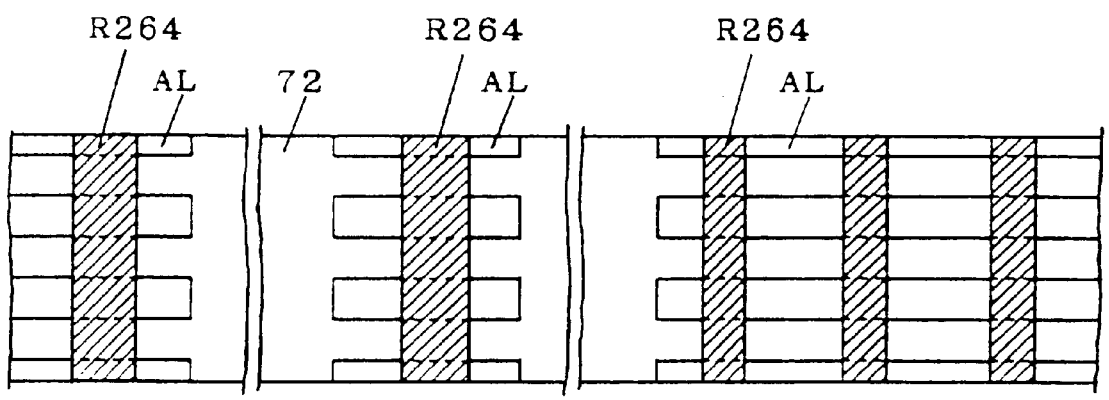

FIG. 65 shows principal portions of the low voltage circuit portion LP and the high-voltage circuit portion HP. FIG. 65 omits the channel cut layer 1003 and the channel dope layer 1005.

In FIG. 65, a non-doped polysilicon layer 1020 and a doped polysilicon layer 1021 are formed in this order on the oxide film 1006 of the low voltage circuit portion LP and the high-voltage circuit portion HP. A resist mask R14 is formed on the doped polysilicon layer 1021 of the high-voltage circuit portion HP.

In this condition, when impurity ions are implanted from above into the doped polysilicon layer 1021 which is not coated with the resist mask R14, the impurity is introduced further into the non-doped polysilicon layer 1020 of the low voltage circuit portion LP.

As a result, during an operation of the MOS transistor L1 of the low voltage circuit portion LP, a depletion layer is not formed almost at all in the gate electrode. With respect to the impurity, when the MOS transistor H1 needs to be the N-channel type, phosphorus (P) ions, for instance, are implanted with the energy of 30 keV and at a dose of $5\times10^{15}/cm^2$. Meanwhile, when the MOS transistor H1 needs to be the P-channel type, boron (B), for instance, are implanted with the energy of 10 keV and at a dose of $5\times10^{15}/cm^2$.

On the other hand, in the MOS transistor H1 of the high-voltage circuit portion HP, the impurity is diffused naturally from the doped polysilicon layer 1021 into the non-doped polysilicon layer 1020, and the impurity concentration becomes lower. Hence, during an operation of the MOS transistor H1, a depletion layer is formed in the gate electrode.

The non-doped polysilicon layer 1020 and the doped polysilicon layer 1021 may be formed in the reverse order.

In such a case, since diffusion of the impurity from the doped polysilicon layer 1021 into the non-doped polysilicon layer 1020 progresses from below toward above, diffusion is made not easy. However, utilizing this nature, it is possible to adjust the range in which a depletion layer is formed.

In order to adjust the quantity of diffusion by suppressing diffusion of the impurity from the doped polysilicon layer 1021 into the non-doped polysilicon layer 1020, a diffusion suppression film, such as a thin SiN film, a thin $SiO_2$ film and a thin TiN film, may be formed between the doped polysilicon layer 1021 and the non-doped polysilicon layer 1020.

These films can be formed by a CVD method or a sputtering method. The thickness of these films is about 50 Å.

With the film thickness to this extent, it is possible for electrons to pass because of a tunnel phenomena, so that conduction between the doped polysilicon layer 1021 and the non-doped polysilicon layer 1020 is not cut off.

While the foregoing has described the fifth preferred embodiment of the present invention and the modification thereof in relation to an example of a semiconductor device which is basically formed on a bulk silicon substrate, it is needless to mention that the fifth preferred embodiment is applicable to a semiconductor device which is formed on an SOI substrate as described in relation to the second modification which is shown FIG. 62.

Further, although the first to the third modifications of the fifth preferred embodiment are related to examples of applications to the high-voltage circuit portion HP, it is needless to mention that the modifications may be applied to the low voltage circuit portion LP.

While the invention has been described in detail, the foregoing description is in all aspects illustrative and not restrictive. It is understood that numerous other modifications and variations can be devised without departing from the scope of the invention.

We claim:

1. A semiconductor device including first to third types of transistors on a semiconductor substrate, wherein a transistor of said first type comprises:
    a first semiconductor layer of a first conductivity type which is formed in a surface of said semiconductor substrate;
    a first channel dope layer of the first conductivity type which is formed selectively in said first semiconductor layer; and
    a first control electrode which is formed at a position which faces said first channel dope layer, on said first semiconductor layer, a transistor of said second type comprises:
    a second semiconductor layer of the first conductivity type which is formed in the surface of said semiconductor substrate;
    a second channel dope layer of the first conductivity type which is formed selectively in said second semiconductor layer; and
    a second control electrode which is formed at a position which faces said second channel dope layer, on said second semiconductor layer, a transistor of said third type comprises:
    a third semiconductor layer of the first conductivity type which is formed in the surface of said semiconductor substrate;
    a third channel dope layer of the first conductivity type which is formed selectively in said third semiconductor layer; and a third control electrode which is formed at a position which faces said third channel dope layer, on said third semiconductor layer, said first control electrode internally comprises an impurity layer of a second conductivity type having a concentration distribution in a direction of depth vertical to said semiconductor substrate which is different from an impurity concentration distribution in said second and third control electrodes and said first to said third channel dope layers have a same impurity concentration distribution;

and wherein said transistor of said first type comprises:
a pair of first semiconductor regions of the second conductivity type formed selectively and independently of each other within said first semiconductor layer; and
a first gate oxide film which is formed on said first semiconductor layer between said pair of first semiconductor regions,
said first control electrode is formed on said first gate oxide film,
said first channel dope layer is formed between said pair of first semiconductor regions within said first semiconductor layer, said transistor of said second type comprises:
a pair of second semiconductor regions of the second conductivity type formed selectively and independently of each other within said second semiconductor layer; and
a second gate oxide film which is formed on said second semiconductor layer between said pair of second semiconductor regions,
said second control electrode is formed on said second gate oxide film,
said second channel dope layer is formed between said pair of second semiconductor regions within said second semiconductor layer, said transistor of said third type comprises:
a pair of third semiconductor regions of the second conductivity type formed selectively and independently of each other within said third semiconductor layer; and
a third gate oxide film which is formed on said third semiconductor layer between said pair of third semiconductor regions,
said third control electrode is formed on said third gate oxide film,
said third channel dope layer is formed between said pair of third semiconductor regions within said third semiconductor layer,
said first, said second and said third control electrodes include a first, a second and a third impurity layer, respectively, which have different impurity concentrations from each other,
said first to said third gate oxide films have the same thickness, and
said first to said third channel dope layers have the same impurity concentration.

2. A semiconductor device including first to third types of transistors on a semiconductor substrate, wherein
a transistor of said first type comprises:
a first semiconductor layer of a first conductivity type which is formed in a surface of said semiconductor substrate;
a first channel dope layer of the first conductivity type which is formed selectively in said first semiconductor layer; and a first control electrode which is formed at a position which faces said first channel dope layer, on said first semiconductor layer, a transistor of said second type comprises:
a second semiconductor layer of the first conductivity type which is formed in the surface of said semiconductor substrate;
a second channel dope layer of the first conductivity type which is formed selectively in said second semiconductor layer; and
a second control electrode which is formed at a position which faces said second channel dope layer, on said second semiconductor layer, a transistor of said third type comprises:
a third semiconductor layer of the first conductivity type which is formed in the surface of said semiconductor substrate;
a third channel dope layer of the first conductivity type which is formed selectively in said third semiconductor layer; and
a third control electrode which is formed at a position which faces said third channel dope layer, on said third semiconductor layer, said first control electrode internally comprises an impurity layer of a second conductivity type having a concentration distribution in a direction of depth vertical to said semiconductor substrate which is different from an impurity concentration distribution in said second and third control electrodes and said first to said third channel dope layers have a same impurity concentration distribution;

and wherein said transistor of said first type comprises:
a pair of first semiconductor regions of the second conductivity type formed selectively and independently of each other within said first semiconductor layer; and
a first gate oxide film which is formed on said first semiconductor layer between said pair of first semiconductor regions,
said first control electrode is formed on said first gate oxide film,
said first channel dope layer is formed between said pair of first semiconductor regions within said first semiconductor layer, said transistor of said second type comprises:
a pair of second semiconductor regions of the second conductivity type formed selectively and independently of each other within said second semiconductor layer; and
a second gate oxide film which is formed on said second semiconductor layer between said pair of second semiconductor regions,
said second control electrode is formed on said second gate oxide film,
said second channel dope layer is formed between said pair of second semiconductor regions within said second semiconductor layer, said transistor of said third type comprises:
a pair of third semiconductor regions of the second conductivity type formed selectively and independently of each other within said third semiconductor layer;
a third gate oxide film which is formed on said third semiconductor layer between said pair of third semiconductor regions;
a floating gate electrode which is formed on said third gate oxide film; and an inter-layer insulation film which is formed on said floating gate electrode, said third control electrode is formed on said inter-layer insulation film, said third channel dope layer is formed between said pair of third semiconductor regions within said third semiconductor layer, said first, said second and said third control electrodes include a first, a second and a third impurity layer, respectively, which have different impurity concentrations from each other, said first and said second gate oxide films have the same thickness which is a first thickness but said third gate oxide film has a second thickness which is thicker than said first thickness, and said first to said third channel dope layers have the same impurity concentration.

3. A semiconductor device including first to third types of transistors on a semiconductor substrate, wherein
a transistor of said first type comprises:
a first semiconductor layer of a first conductivity type which is formed in a surface of said semiconductor substrate;
a first channel dope layer of the first conductivity type which is formed selectively in said first semiconductor layer; and
a first control electrode which is formed at a position which faces said first channel dope layer, on said first semiconductor layer, a transistor of said second type comprises:
a second semiconductor layer of the first conductivity type which is formed in the surface of said semiconductor substrate;
a second channel dope layer of the first conductivity type which is formed selectively in said second semiconductor layer; and
a second control electrode which is formed at a position which faces said second channel dope layer, on said second semiconductor layer, a transistor of said third type comprises:
a third semiconductor layer of the first conductivity type which is formed in the surface of said semiconductor substrate;
a third channel dope layer of the first conductivity type which is formed selectively in said third semiconductor layer; and
a third control electrode which is formed at a position which faces said third channel dope layer, on said third semiconductor layer, said first control electrode internally comprises an impurity layer of a second conductivity type having a concentration distribution in a direction of depth vertical to said semiconductor substrate which is different from an impurity concentration distribution in said second and third control electrodes and said first to said third channel dope layers have a same impurity concentration distribution;

and wherein said transistor of said first type comprises:
a pair of first semiconductor regions of the second conductivity type formed selectively and independently of each other within said first semiconductor layer; and
a first gate oxide film which is formed on said first semiconductor layer between said pair of first semiconductor regions, said first control electrode is formed on said first gate oxide film, said first channel dope layer is formed between said pair of first semiconductor regions within said first semiconductor layer, said transistor of said second type comprises:
a pair of second semiconductor regions of the second conductivity type formed selectively and independently of each other within said second semiconductor layer; and
a second gate oxide film which is formed on said second semiconductor layer between said pair of second semiconductor regions, said second control electrode is formed on said second gate oxide film, said second channel dope layer is formed between said pair of second semiconductor regions within said second semiconductor layer, said transistor of said third type comprises:
a pair of third semiconductor regions of the second conductivity type formed selectively and independently of each other within said third semiconductor layer; and
a third gate oxide film which is formed on said third semiconductor layer between said pair of third semiconductor regions, said third control electrode is formed on said third gate oxide film, said third channel dope layer is formed between said pair of third semiconductor regions within said third semiconductor layer, said first and said second control electrodes include a first and a second impurity layer, respectively, which have the same impurity concentration with each other, said third control electrode includes a third impurity layer whose concentration is lower than those of said first and said second impurity layers, said first to said third gate oxide films have the same thickness, and said first and said third channel dope layers have the same impurity concentration.

4. A semiconductor device including first to third types of transistors on a semiconductor substrate, wherein a transistor of said first type comprises:
a first semiconductor layer of a first conductivity type which is formed in a surface of said semiconductor substrate;
a first channel dope layer of the first conductivity type which is formed selectively in said first semiconductor layer; and
a first control electrode which is formed at a position which faces said first channel dope layer, on said first semiconductor layer, a transistor of said second type comprises:
a second semiconductor layer of the first conductivity type which is formed in the surface of said semiconductor substrate;
a second channel dope layer of the first conductivity type which is formed selectively in said second semiconductor layer; and
a second control electrode which is formed at a position which faces said second channel dope layer, on said second semiconductor layer, a transistor of said third type comprises:
a third semiconductor layer of the first conductivity type which is formed in the surface of said semiconductor substrate;

a third channel dope layer of the first conductivity type which is formed selectively in said third semiconductor layer; and a third control electrode which is formed at a position which faces said third channel dope layer, on said third semiconductor layer, said first control electrode internally comprises an impurity layer of a second conductivity type having a concentration distribution in a direction of depth vertical to said semiconductor substrate which is different from an impurity concentration distribution in said second and third control electrodes and said first to said third channel dope layers have a same impurity concentration distribution;

and wherein said transistor of said first type comprises:

a pair of first semiconductor regions of the second conductivity type formed selectively and independently of each other within said first semiconductor layer; and a first gate oxide film which is formed on said first semiconductor layer between said pair of first semiconductor regions, said first control electrode is formed on said first gate oxide film, said first channel dope layer is formed between said pair of first semiconductor regions within said first semiconductor layer, said transistor of said second type comprises:

a pair of second semiconductor regions of the second conductivity type formed selectively and independently of each other within said second semiconductor layer; and a second gate oxide film which is formed on said second semiconductor layer between said pair of second semiconductor regions, said second control electrode is formed on said second gate oxide said second channel dope layer is formed between said pair of second semiconductor regions within said second semiconductor layer, said transistor of said third type comprises:

a pair of third semiconductor regions of the second conductivity type formed selectively and independently of each other within said third semiconductor layer;

a third gate oxide film which is formed on said third semiconductor layer between said pair of third semiconductor regions;

a floating gate electrode which is formed on said third gate oxide film; and an inter-layer insulation film which is formed on said floating gate electrode, said third control electrode is formed on said inter-layer insulation film, said third channel dope layer is formed between said pair of third semiconductor regions within said third semiconductor layer, said first and said third control electrodes include a first and a third impurity layer, respectively, which have the same impurity concentration with each other, said second control electrode includes a second impurity layer whose concentration is lower than those of said first and said third impurity layers, said first and said second gate oxide films have the same thickness which is a first thickness but said third gate oxide film has a second thickness which is thicker than said first thickness, and said first to said third channel dope layers have the same impurity concentration.

5. A semiconductor device having first and second types of transistors on a semiconductor substrate, a transistor of said first type comprising:

a first semiconductor layer of a first conductivity type which is formed in a surface of a first region of said semiconductor substrate defined by a field oxide film;

a first channel dope layer of the first conductivity type which is formed selectively in said first semiconductor layer; and a first control electrode which is formed over said first semiconductor layer so as to face said first channel dope layer with an oxide film interposed therebetween, a transistor of said second type comprising:

a second semiconductor layer of the first conductivity type which is formed in a surface of a second region of said semiconductor substrate defined by said field oxide film;

a second channel dope layer of the first conductivity type which is formed selectively in said second semiconductor layer; and a second control electrode which is formed over said second semiconductor layer so as to face said second channel dope layer with said oxide film interposed therebetween, and at least one of said first and second control electrodes internally comprising an impurity layer of a second conductivity type having a concentration distribution in a horizontal direction.

6. The semiconductor device of claim 5, wherein said first control electrode is provided over said first region of said semiconductor device and over part of said field oxide film, said second control electrode is provided over said second region of said semiconductor device and over part of said field oxide film, and said impurity layer of the second conductivity type, formed in said first control electrode, has a high concentration distribution at a center portion in the horizontal direction of said first control electrode and has a lower concentration distribution towards edge portions in the horizontal direction of the first control electrode.

7. A semiconductor device having first and second types of transistors on a semiconductor substrate, a transistor of said first type comprising:

a first semiconductor layer of a first conductivity type which is formed in a surface of a first region of said semiconductor substrate defined by a field oxide film;

a first channel dope layer of the first conductivity type which is formed selectively in said first semiconductor layer; and a first control electrode which is formed over said first semiconductor layer so as to face said first channel dope layer with an oxide film interposed therebetween, a transistor of said second type comprising:

a second semiconductor layer of the first conductivity type which is formed in a surface of a second region of said semiconductor substrate defined by said field oxide film;

a second channel dope layer of the first conductivity type which is formed selectively in said second semiconductor layer; and a second control electrode which is formed over said second semiconductor layer so as to face said second channel dope layer with said oxide film interposed therebetween, said first and second control electrodes each internally comprising an impurity layer of a second conductivity type and each having an impurity concentration distribution different from each other, respectively, in the direction of depth vertical to the semiconductor substrate and said first and said second channel dope layers have a same impurity concentration distribution;

wherein said first and second control electrodes each have first and second conductive layers layered on said oxide film in this order, and either one of said first and second conductive layers in either one of said first and second electrodes uniformly includes an impurity of the second conductivity type.

8. The semiconductor device of claim 7 further having a diffusion suppression film provided between said first and second conductive layers, for suppressing the amount of impurity of the second conductivity type to be diffused.

9. A semiconductor device comprising first and second types of transistors on a main surface of a semiconductor substrate of a first conductivity type, wherein said first type of transistor, used as a peripheral circuit portion, includes:
  a first pair of source/drain regions of a second conductivity type formed in said main surface of said semiconductor substrate, with a predetermined spacing therebetween; and
  a first control electrode formed over said main surface of said semiconductor substrate with a first gate insulation film interposed therebetween so as to face a region defined between said first pair of source/drain regions, said second type of transistor, used as a memory cell array portion, includes:
  a second pair of source/drain regions of the second conductivity type formed in said main surface of said semiconductor substrate with a predetermined spacing therebetween;
  a second control electrode formed over said main surface of said semiconductor substrate with a second gate insulation film interposed therebetween so as to face a region defined between said second pair of source/drain regions; and
  a capacitor connected to one of said second pair of source/drain regions, said first and second control electrodes each internally have an impurity concentration distribution different from each other in a depth direction, and said second control electrode has an impurity concentration lower than that of said first control electrode.

10. The semiconductor device according to claim 9, further comprising a third type of transistor on said main surface of said semiconductor substrate of the first conductivity type, wherein said third type of transistor, used as a sense amplifier portion, includes:
  a third pair of source/drain regions of the second conductivity type formed in said main surface of said semiconductor substrate with a predetermined spacing therebetween; and
  a third control electrode formed over said main surface of said semiconductor substrate with a third gate insulation film interposed therebetween so as to face a region defined between said third pair of source/drain regions, and said third control electrode has an impurity concentration higher than those of said first and second control electrodes.

* * * * *